(12) United States Patent
Kim et al.

(10) Patent No.: US 11,985,820 B2
(45) Date of Patent: May 14, 2024

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Kangmin Kim, Hwaseong-si (KR); Jaehoon Shin, Suwon-si (KR); Dongseog Eun, Seongnam-si (KR); Geunwon Lim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 303 days.

(21) Appl. No.: 17/348,172

(22) Filed: Jun. 15, 2021

(65) Prior Publication Data

US 2022/0123001 A1    Apr. 21, 2022

(30) Foreign Application Priority Data

Oct. 15, 2020    (KR) ........................ 10-2020-0133360

(51) Int. Cl.
| | |
|---|---|
| *H10B 41/40* | (2023.01) |
| *H10B 41/10* | (2023.01) |
| *H10B 41/27* | (2023.01) |
| *H10B 41/35* | (2023.01) |
| *H10B 43/10* | (2023.01) |
| *H10B 43/27* | (2023.01) |
| *H10B 43/35* | (2023.01) |
| *H10B 43/40* | (2023.01) |

(52) U.S. Cl.
CPC ............ *H10B 41/40* (2023.02); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02); *H10B 43/40* (2023.02)

(58) Field of Classification Search
CPC .............................. H10B 41/10; H10B 41/20
See application file for complete search history.

(56) References Cited

U.S. PATENT DOCUMENTS

| | | |
|---|---|---|
| 9,530,789 B2 | 12/2016 | Lee et al. |
| 10,319,736 B2 | 6/2019 | Oh et al. |

(Continued)

FOREIGN PATENT DOCUMENTS

| | | |
|---|---|---|
| CN | 110391242 A | 10/2019 |
| KR | 10-2021-0125268 A | 10/2021 |

*Primary Examiner* — David A Zarneke
(74) *Attorney, Agent, or Firm* — Harness, Dickey & Pierce, P.L.C.

(57) ABSTRACT

A semiconductor device includes a first substrate; devices on the first substrate; a second substrate on the devices; gate electrodes stacked on the second substrate and spaced apart from each other in a first direction; channel structures penetrating the gate electrodes, extending in the first direction, and including a channel layer; isolation regions penetrating the gate electrodes and extending in a second direction; a through contact plug penetrating the second substrate, extending in the first direction, and electrically connecting the gate electrodes to the devices; a barrier structure spaced apart from the through contact plug and surrounding the through contact plug; and a support structure on the gate electrodes and including support patterns, wherein the support structure has first through regions spaced apart from each other in the second direction on the isolation regions and a second through region in contact with an upper surface of the barrier structure.

20 Claims, 45 Drawing Sheets

(56) References Cited

U.S. PATENT DOCUMENTS

| | | |
|---|---|---|
| 10,644,028 B2 | 5/2020 | Lee et al. |
| 10,651,197 B2 | 5/2020 | Hong et al. |
| 2021/0320125 A1 | 10/2021 | Shin et al. |

SEMICONDUCTOR DEVICES AND DATA STORAGE SYSTEMS INCLUDING THE SAME

CROSS-REFERENCE TO RELATED APPLICATION(S)

This application claims benefit of priority to Korean Patent Application No. 10-2020-0133360 filed on Oct. 15, 2020 in the Korean Intellectual Property Office, the disclosure of which is incorporated herein by reference in its entirety.

BACKGROUND

Some example embodiments of inventive concepts relate to a semiconductor device and a data storage system including the same.

A semiconductor device which may store high-capacity data has been used as a data storage system for data storage. Accordingly, a method of increasing data storage capacity of a semiconductor device has been researched. For example, as one method for increasing the data storage capacity of a semiconductor device, a semiconductor device including memory cells arranged three-dimensionally, instead of memory cells arranged two-dimensionally, has been suggested.

SUMMARY

Some example embodiments of inventive concepts provide a semiconductor device having improved reliability.

Alternatively or additionally, some example embodiments of inventive concepts provide a data storage system including a semiconductor device having improved reliability.

According to some example embodiments of inventive concepts, a semiconductor device includes a peripheral circuit structure including a first substrate and at least one of active devices or passive devices on the first substrate, a memory cell structure including a second substrate on the peripheral circuit structure and having a first region and a second region, the memory cell structure including gate electrodes stacked on the first region spaced apart from each other in a first direction, and extending in a second direction and arranged in a staircase shape on the second region, the memory cell structure including interlayer insulating layers alternately stacked with the gate electrodes, the memory cell structure including channel structures penetrating the gate electrodes that extend in the first direction, each of the channel structures including a channel layer, and the memory cell structure including isolation regions penetrating the gate electrodes, extending in the second direction, and spaced apart from each other in a third direction, a through wiring region including sacrificial insulating layers on the second region, spaced apart from the gate electrodes, and alternately stacked with the interlayer insulating layers, the through wiring region including a through contact plug penetrating the sacrificial insulating layers and electrically connecting the gate electrodes to the active or passive devices, and a barrier structure surrounding the through wiring region and including a core insulating layer, a first barrier layer, and a second barrier layer. The core insulating layer is in a central region of the barrier structure and includes silicon oxide, the second barrier layer covers side surfaces of the core insulating layer and a bottom surface of the core insulating layer, and the first barrier layer covers external side surfaces of the second barrier layer and a bottom surface of the second barrier layer.

According to some example embodiments of inventive concepts, a semiconductor device includes a first substrate, at least one of active devices or passive devices on the first substrate, a second substrate on the at least one of active devices or passive devices, gate electrodes stacked on the second substrate in a first direction and spaced apart from each other, channel structures penetrating the gate electrodes, extending in the first direction, and each including a channel layer, isolation regions penetrating the gate electrodes and extending in a second direction, a through contact plug penetrating the second substrate, extending in the first direction, and electrically connecting the gate electrodes to the at least one of active or passive devices, a barrier structure spaced apart from the through contact plug and surrounding the through contact plug, and a support structure on the gate electrodes and including support patterns. The support structure has first through regions spaced apart from each other in the second direction on the isolation regions and a second through region contacting an upper surface of the barrier structure.

According to some example embodiments of inventive concepts, a data storage system includes a semiconductor storage device including a first substrate, at least one of active devices or passive devices on the first substrate, a second substrate on the at least one of active or passive devices, gate electrodes stacked on the second substrate and spaced apart from each other in a first direction, channel structures penetrating the gate electrodes with the channel structures extending in the first direction and each of the channel structures including a channel layer, isolation regions penetrating the gate electrodes and extending in a second direction, a through contact plug penetrating the second substrate and extending in the first direction while electrically connecting the gate electrodes to the active or passive devices, a barrier structure spaced apart from the through contact plug and surrounding the through contact plug, a support structure on the gate electrodes and including support patterns, and an input and output pad electrically connected to the at least one of active or passive devices, where the support structure includes first through regions spaced apart from each other in the second direction on the isolation regions and a second through region in contact with an upper surface of the barrier structure. The data storage system further includes a controller circuitry electrically connected to the semiconductor storage device through the input and output pad and configured to control the semiconductor storage device.

BRIEF DESCRIPTION OF DRAWINGS

The above and other aspects, features, and advantages of inventive concepts will be more clearly understood from the following detailed description, taken in conjunction with the accompanying drawings, in which.

DETAILED DESCRIPTION OF SOME EXAMPLE EMBODIMENTS

Hereinafter, some example embodiments of inventive concepts will be described as follows with reference to the accompanying drawings.

Figure 1A:
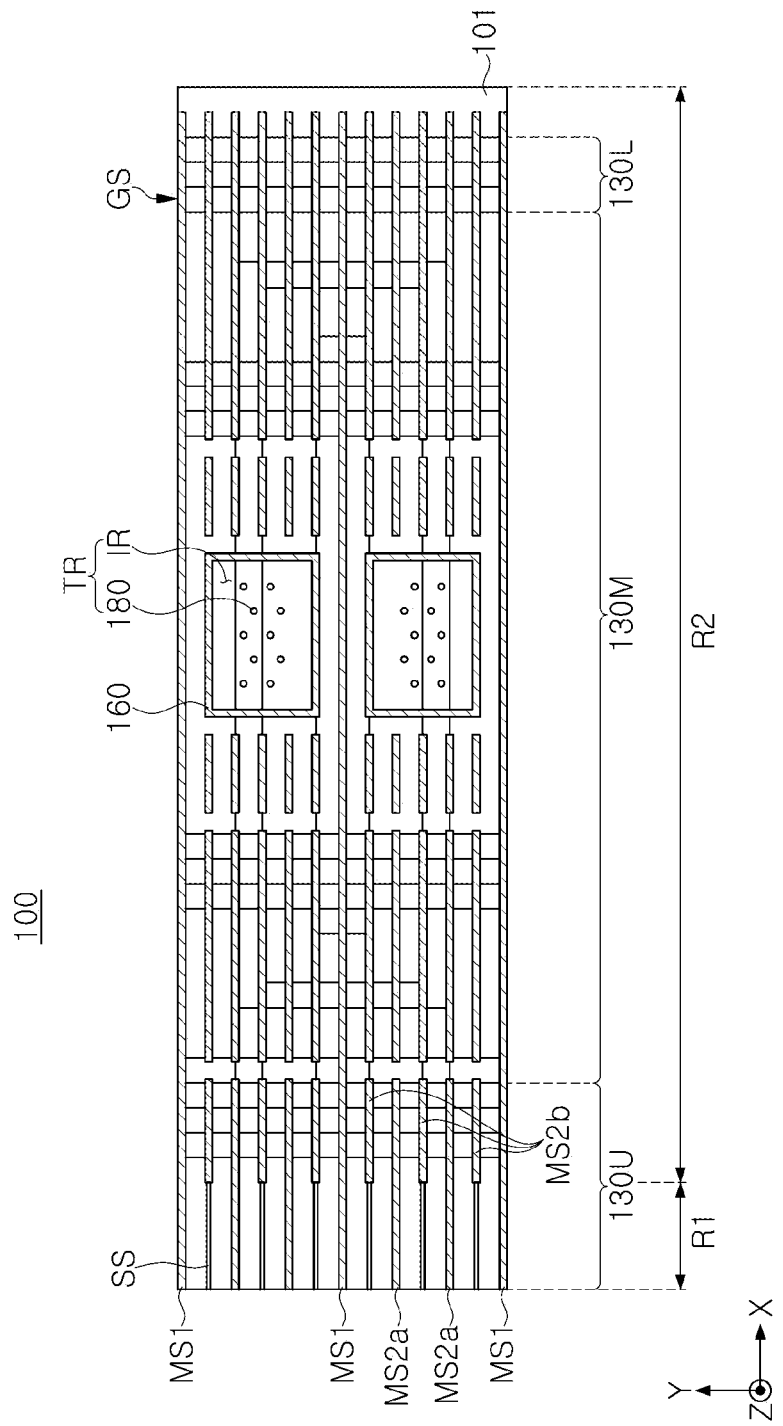
FIGS. 1A and 1B are plan views illustrating a semiconductor device according to some example embodiments of inventive concepts.
Figure 1B:
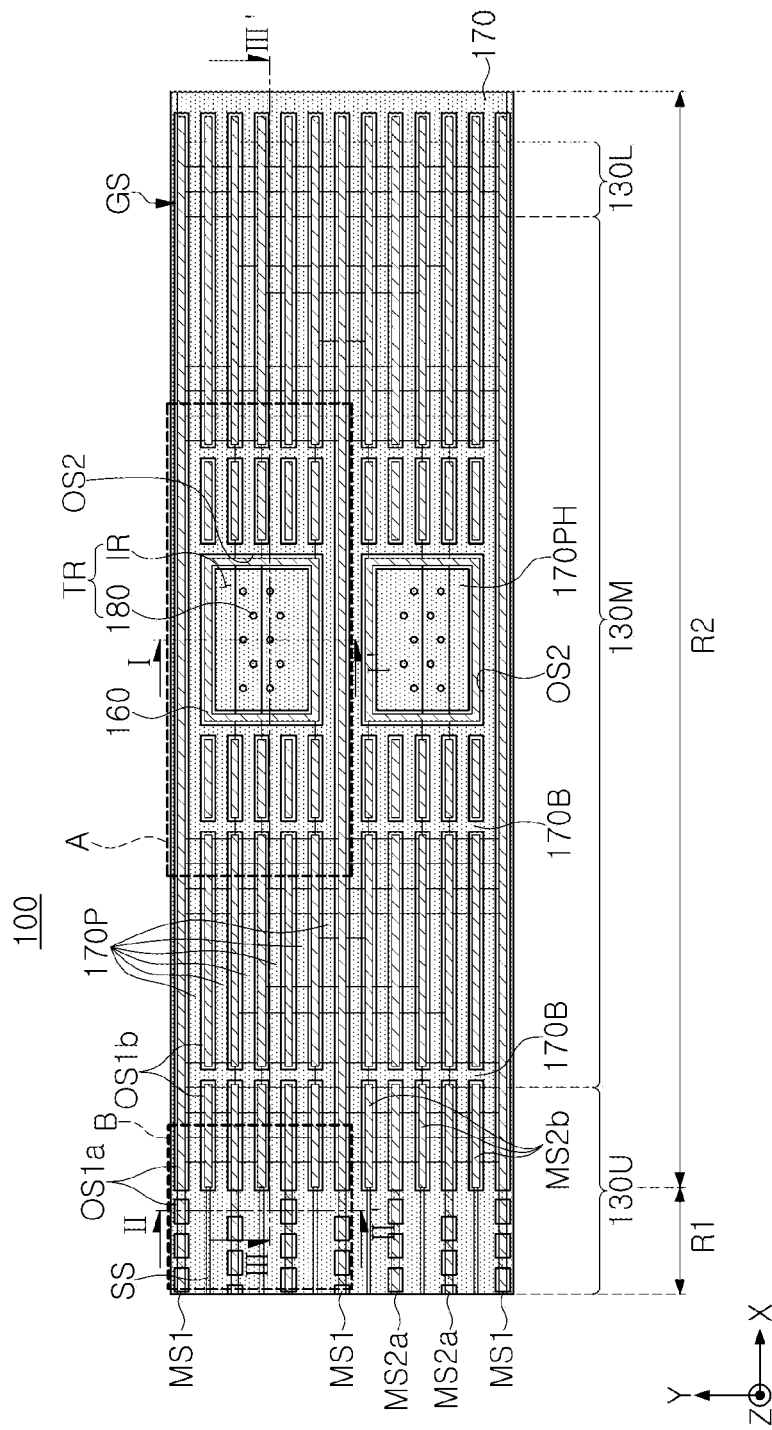

FIGS. 1A and 1B are plan views illustrating a semiconductor device according to some example embodiments. FIG. 1B further includes a support structure in the semiconductor device illustrated in the plan view in FIG. 1A.

Figure 2A:
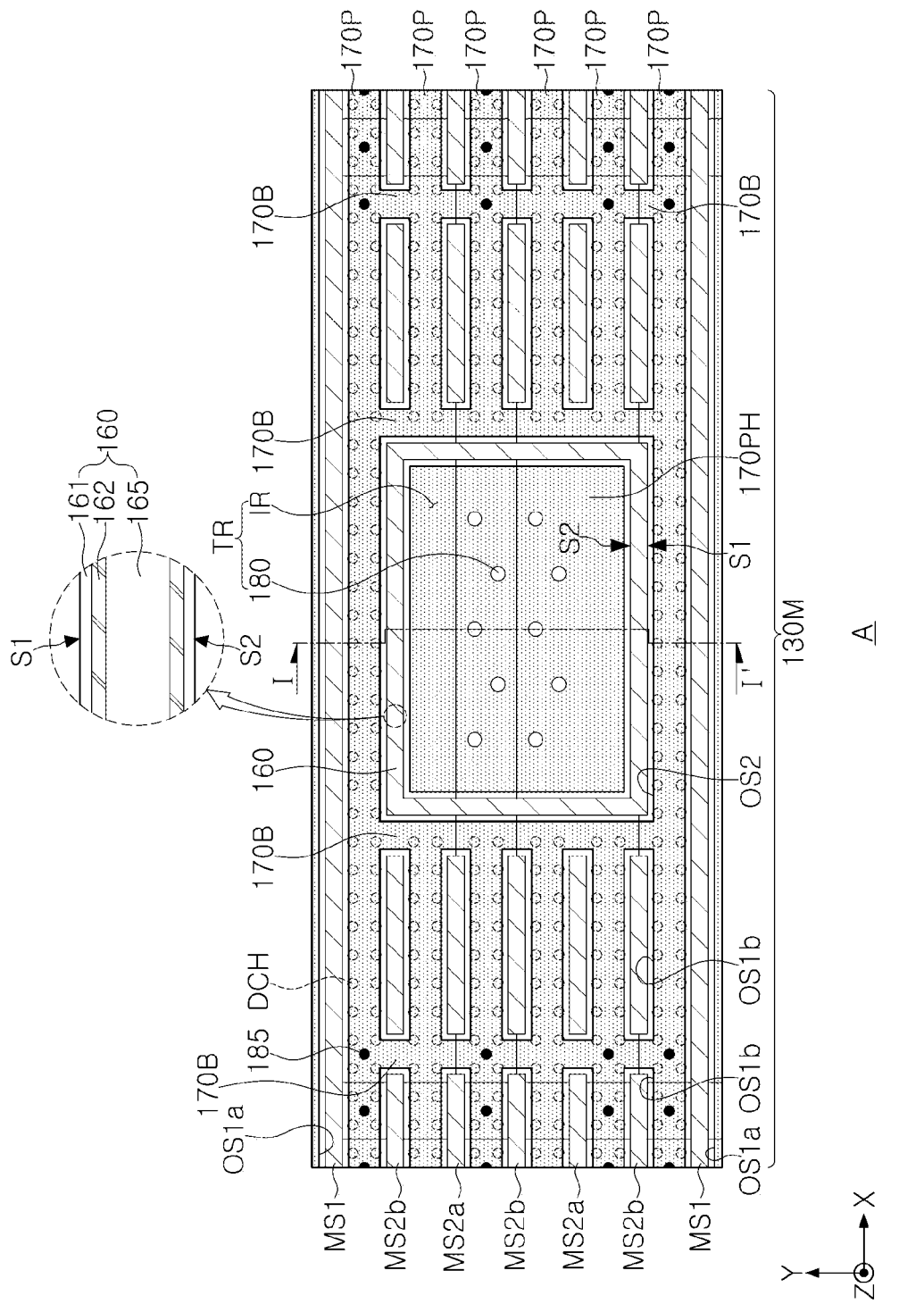
FIGS. 2A and 2B are plan views illustrating a semiconductor device according to some example embodiments of inventive concepts.
Figure 2B:
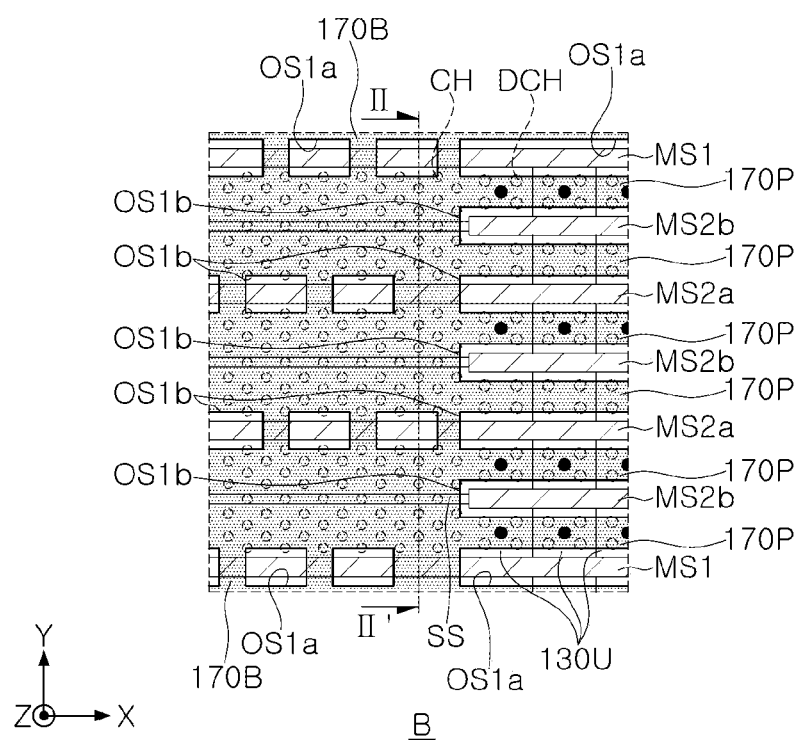

FIGS. 2A and 2B are plan views illustrating a semiconductor device according to some example embodiments. FIG. 2A is an enlarged view illustrating region "A" in FIG. 1B, and FIG. 2B is an enlarged view illustrating region "B" in FIG. 1B.

Figure 3A:
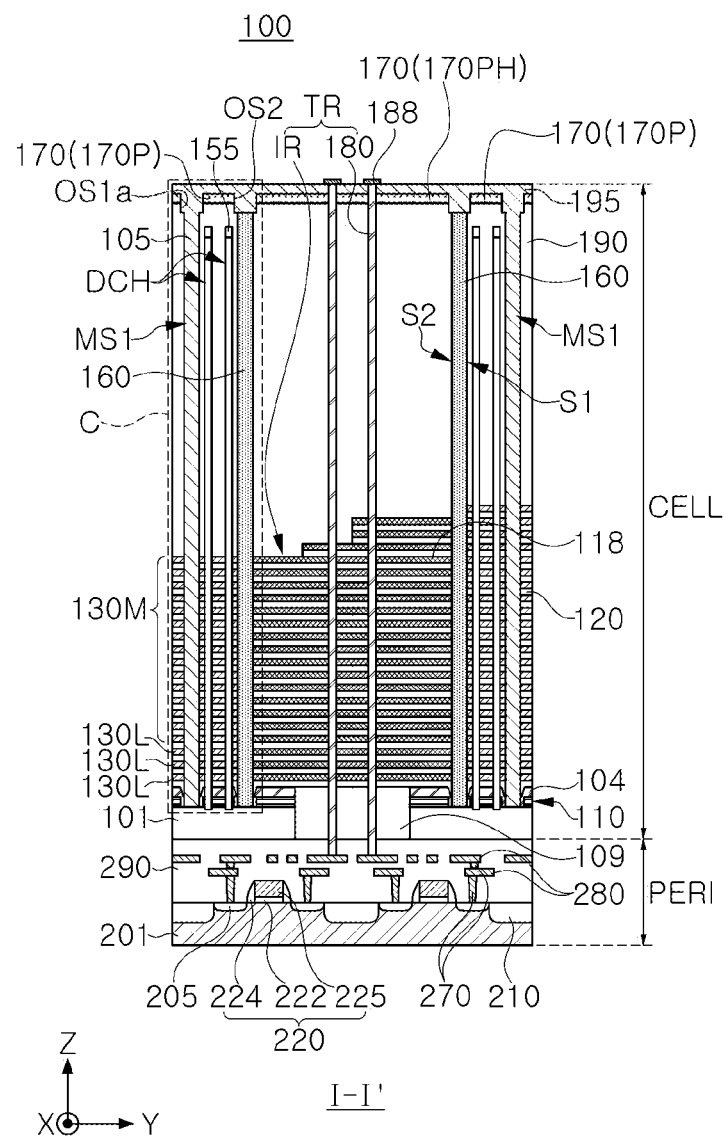
FIGS. 3A to 3C are cross-sectional views illustrating a semiconductor device according to some example embodiments of inventive concepts.
Figure 3B:
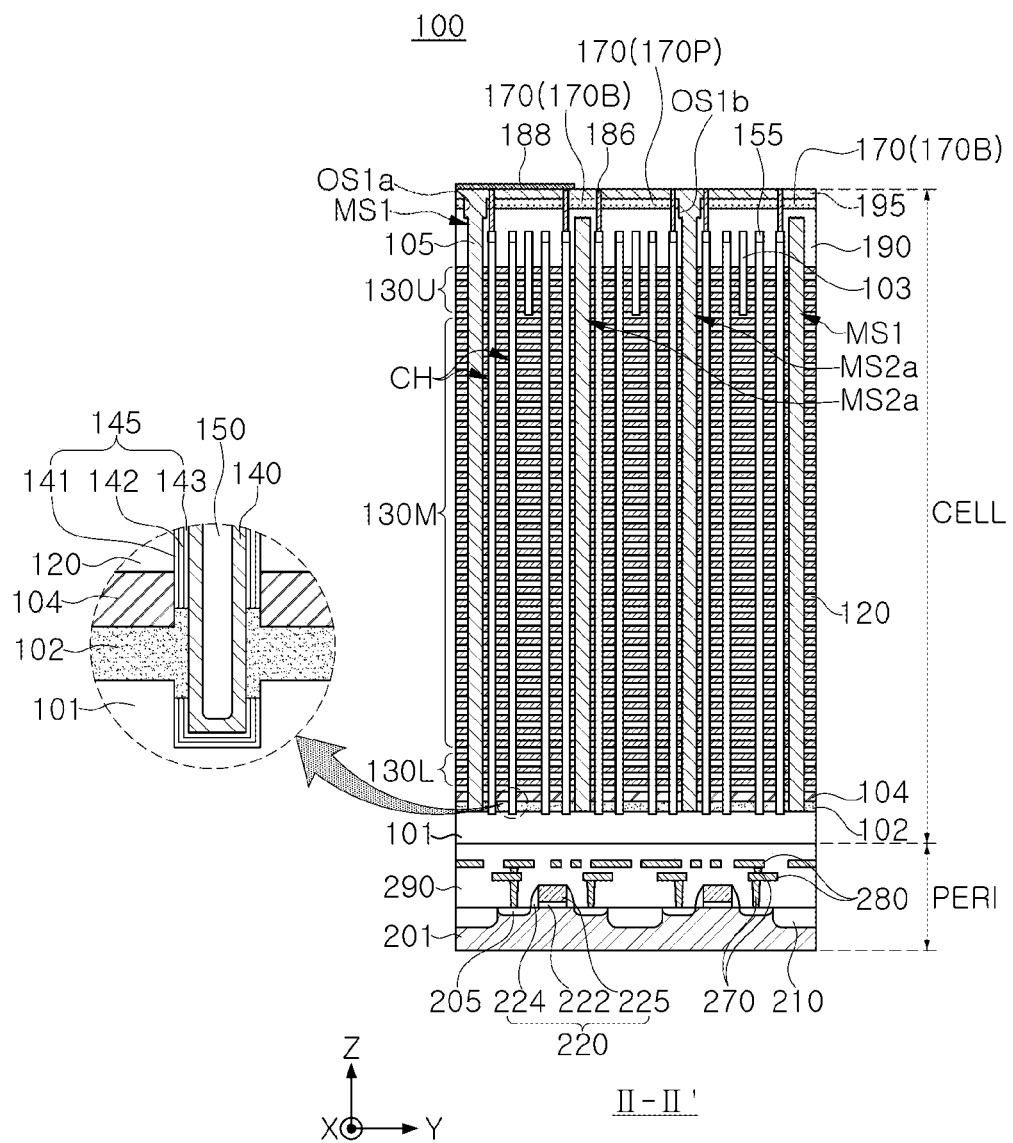
Figure 3C:
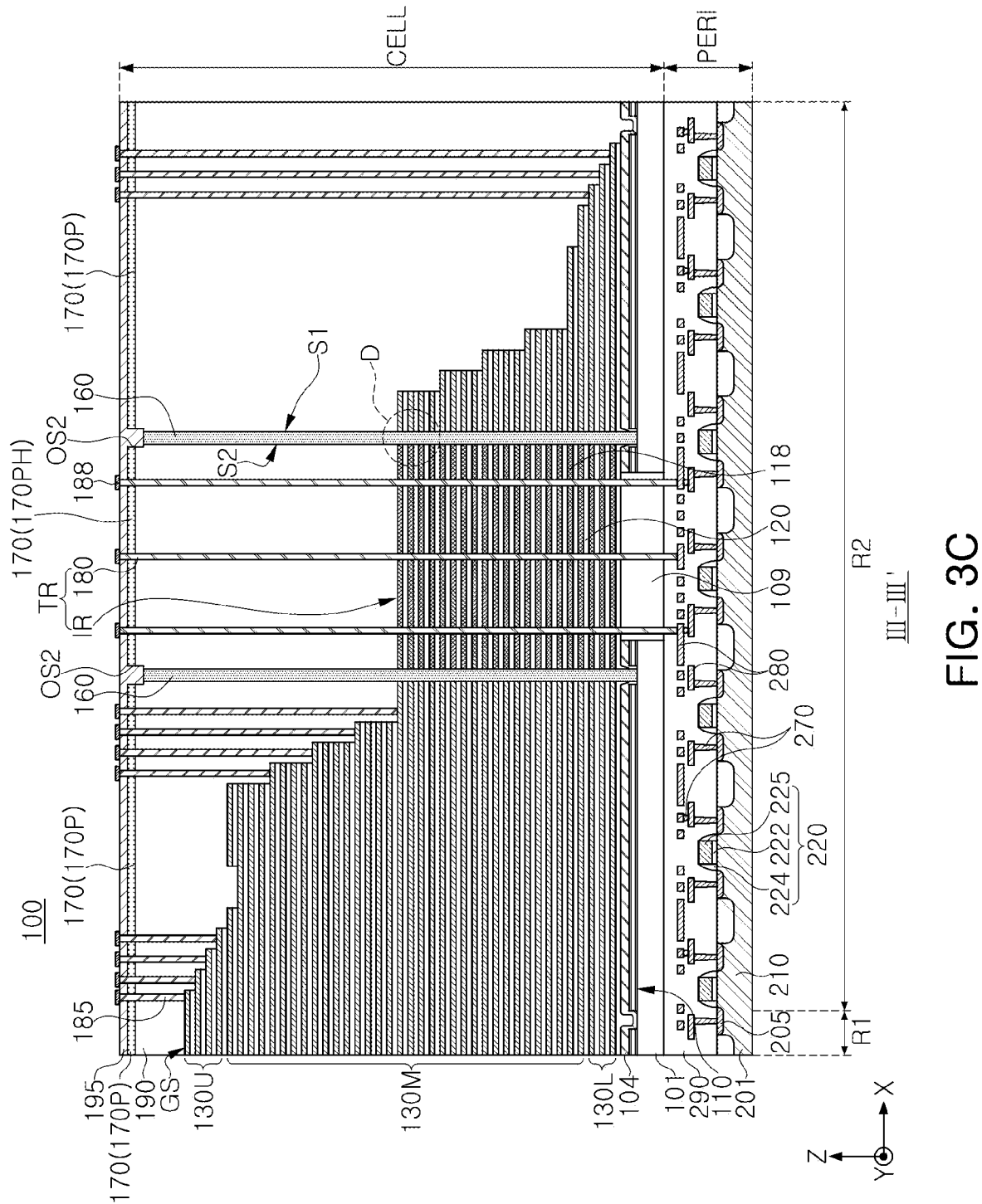

FIGS. 3A to 3C are cross-sectional views illustrating a semiconductor device according to some example embodiments. FIG. 3A is a cross-sectional view taken along line I-I' in FIG. 1B, FIG. 3B is a cross-sectional view taken along line II-II' in FIG. 1B, and FIG. 3C is a cross-sectional view taken along line III-III' in FIG. 1B.

Figure 4:
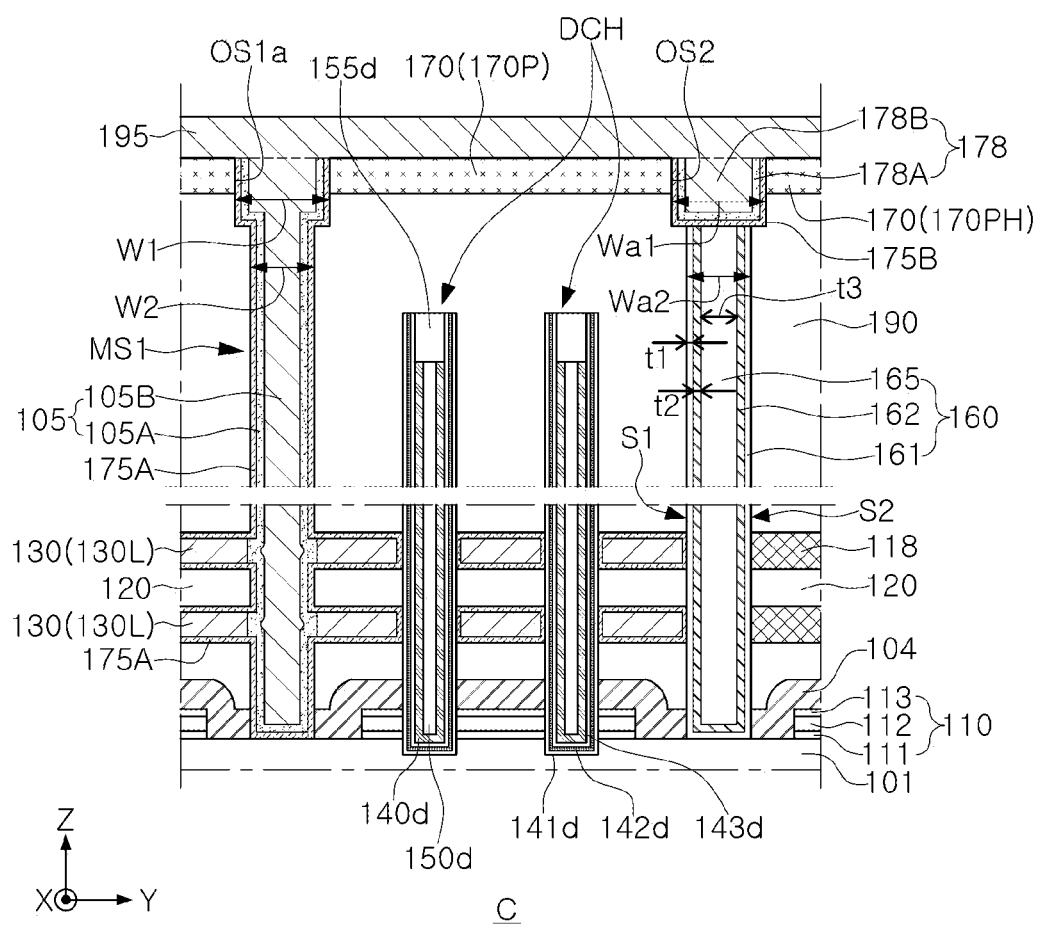
FIG. 4 is a cross-sectional view illustrating a portion of a semiconductor device according to some example embodiments of inventive concepts.

FIG. 4 is a cross-sectional view illustrating a portion of a semiconductor device according to some example embodiments, illustrating region "C" in FIG. 3A.

Referring to FIGS. 1A to 4, a semiconductor device 100 may include a peripheral circuit structure PERI including a first substrate 201, and a memory cell structure CELL including a second substrate 101. The semiconductor device 100 may include a through wiring region TR including a through contact plug 180 electrically connecting the peripheral circuit structure PERI to the memory cell structure CELL. The memory cell structure CELL may be disposed above the peripheral circuit PERI, and the through wiring region TR may penetrate the memory cell structure CELL and may connect (e.g. directly connect) the memory cell structure CELL to the peripheral circuit structure PERI. In some example embodiments, the memory cell structure CELL may be disposed below the peripheral circuit structure PERI. Also, in some example embodiments, the memory cell structure CELL and the peripheral circuit structure PERI may be bonded by, for example, copper (Cu)-copper (Cu) bonding; however, example embodiments are not limited thereto, and the memory cell structure CELL and the peripheral circuit structure PERI may be bonded with other bonding.

The peripheral circuit structure PERI may include the first substrate 201, the source/drain regions 205 and device isolation layers 210 in the first substrate 201, at least one of active devices or passive devices, e.g. circuit devices 220, disposed in the first substrate 201, circuit contact plugs 270, circuit wiring lines 280, and a peripheral region insulating layer 290.

The first substrate 201 may have an upper surface extending in X and Y directions. An active region may be defined by the device isolation layers 210 on the first substrate 201. Source/drain regions 205 including impurities such as at least one of boron, phosphorus, or arsenic, may be disposed in a portion of the active region. The first substrate 201 may include a semiconductor material, such as a group IV semiconductor, a group III-V compound semiconductor, or a group II-VI compound semiconductor. The first substrate 201 may be provided as a bulk wafer or an epitaxial layer such as a homogeneous epitaxial layer.

The circuit devices 220 may be or correspond to active devices and/or passive devices, and may include transistors such as planar transistors. The circuit devices 220 may include other active devices such as diodes; however, example embodiments are not limited thereto. The circuit devices 220 may include passive devices such as at least one of a resistor, a capacitor, an inductor, or a memristor; however, example embodiments are not limited thereto. The circuit devices 220 may include two-terminal devices, and/or three-terminal devise, and/or more than three-terminal devices. Each of or at least one of the circuit devices 220 may include a circuit gate dielectric layer 222, a spacer layer 224, and a circuit gate electrode 225. The source/drain regions 205 may be disposed in the first substrate 201 on both sides of the circuit gate electrode 225.

The peripheral region insulating layer 290 may be disposed on the circuit device 220 on the first substrate 201. The circuit contact plugs 270 may penetrate the peripheral region insulating layer 290 and may be connected to (e.g. directly connect to and/or ohmically connected to) the source/drain regions 205. An electric signal may be applied to the circuit device 220 by the circuit contact plugs 270. In a region not illustrated, the circuit contact plugs 270 may also be connected to the circuit gate electrode 225. The circuit wiring lines 280 may be connected to the circuit contact plugs 270 and may be disposed in a plurality of layers.

The memory cell structure CELL may include a second substrate 101 having a first region R1 and a second region R2, a first horizontal conductive layer 102 on the first region R1 of the second substrate 101, a horizontal insulating layer 110 disposed side by side with the first horizontal conductive layer 102 on the second region R2 of the second substrate 101, a second horizontal conductive layer 104 on the first horizontal conductive layer 102 and the horizontal insulating layer 110, gate electrodes 130 stacked on the second horizontal conductive layer 104, first and second isolation regions MS1, MS2a, and MS2b extending by penetrating the stacked structure GS of the gate electrodes 130, a barrier structure 160 disposed to surround a through wiring region TR in the second region R2, upper isolation regions SS penetrating a portion of the stack structure GS, channel structures CH disposed to penetrate the stack structure GS, and a support structure 170 disposed on the stack structure GS of the gate electrodes 130. The memory cell structure CELL may further include interlayer insulating layers 120, a metal oxide layer 175, a capping insulating layer 190, and an upper insulating layer 195.

In the first region R1 of the second substrate 101, the gate electrodes 130 may be vertically stacked, e.g. stacked in a direction orthogonal to the surface of the second substrate 101, and the channel structures CH/memory cells may be disposed in the first region R1. In the second region R2, the gate electrodes 130 may extend by different lengths, and the second region R2 may be configured to electrically connect the memory cells to the peripheral circuit structure PERI. The second region R2 may be disposed on at least one end of the first region R1 in at least one direction, in the X direction, for example.

The second substrate 101 may have an upper surface extending in the X direction and the Y direction. The X direction and the Y direction may be perpendicular to each other. The second substrate 101 may include a semiconductor material, such as a group IV semiconductor, a group III-V compound semiconductor, or a group II-VI compound semiconductor. For example, the group IV semiconductor may include silicon, germanium, or silicon-germanium. The second substrate 101 may further include impurities. The second substrate 101 may be provided as a polycrystalline semiconductor layer such as a polycrystalline silicon layer and/or an epitaxial layer such as a homogeneous epitaxial layer and/or a heterogeneous epitaxial layer.

The first and second horizontal conductive layers 102 and 104 may be stacked in order on the upper surface of the first region R1 of the second substrate 101. The first horizontal conductive layer 102 may not extend to the second region R2 of the second substrate 101, and the second horizontal conductive layer 104 may extend to the second region R2.

The first horizontal conductive layer 102 may function as a portion of a common source line of the semiconductor device 100, and may function as, for example, a common source line along with the second substrate 101. As illustrated in FIG. 3B, the first horizontal conductive layer 102 may be directly connected to the channel layer 140 around the channel layer 140.

The second horizontal conductive layer 104 may be in contact with the second substrate 101 in partial regions in which the first horizontal conductive layer 102 and the horizontal insulating layer 110 are not disposed. The second horizontal conductive layer 104 may be bent to cover ends of the first horizontal conductive layer 102 and/or the horizontal insulating layer 110 and may extend onto the second substrate 101 in the above-mentioned regions.

The first and second horizontal conductive layers 102 and 104 may include a semiconductor material, and the first and second horizontal conductive layers 102 and 104 may include polycrystalline silicon such as doped polysilicon, for example. In this case, at least the first horizontal conductive layer 102 may be configured as a doped layer, and the second horizontal conductive layer 104 may be configured as a doped layer and/or may include impurities diffused from the first horizontal conductive layer 102. In some example embodiments, the second horizontal conductive layer 104 may be replaced with an insulating layer such as an insulating layer including at least one of silicon oxide or silicon nitride.

The horizontal insulating layer 110 may be disposed on the second substrate 101 side by side with/adjacent to the first horizontal conductive layer 102 in at least a portion of the second region R2. As illustrated in FIG. 4, the horizontal insulating layer 110 may include first to third horizontal insulating layers 111, 112, and 113 stacked in order on the second region R2 of the second substrate 101. The horizontal insulating layer 110 may remain after a portion of the horizontal insulating layer 110 is replaced with the first horizontal conductive layer 102 in a process of manufacturing the semiconductor device 100.

The horizontal insulating layer 110 may include at least one of silicon oxide, silicon nitride, silicon carbide, or silicon oxynitride. The first and third horizontal insulating layers 111 and 113 and the second horizontal insulating layer 112 may include, e.g. may consist of, different insulating materials. The first and third horizontal insulating layers 111 and 113 may include, e.g. may consist of, the same material. For example, the first and third horizontal insulating layers 111 and 113 may be formed of a material the same as a material of the interlayer insulating layers 120, and the second horizontal insulating layer 112 may be formed of a material the same as a material of the sacrificial insulating layers 118.

The gate electrodes 130 may be stacked and spaced apart from each other on the second substrate 101 in a Z direction and may form a stack structure GS. The gate electrodes 130 may include a lower gate electrode 130L forming/corresponding to a gate of a ground select transistor, memory gate electrodes 130M forming/corresponding to a plurality of memory cells, and upper gate electrodes 130U forming/corresponding to gates of string select transistors. The number of memory gate electrodes 130M forming the memory cells may be determined according to capacity of the semiconductor device 100. In some example embodiments, the number of the upper and lower gate electrodes 130U and 130L may be 1 to 4 or more, respectively, with the number of upper gate electrodes 1130U being the same as or different from the number of lower gate electrodes 130L, and may have a structure the same as or different from the memory gate electrodes 130M. In some example embodiments, the gate electrodes 130 may further include gate electrodes 130 disposed above the upper gate electrodes 130U and/or below the lower gate electrode 130L, and forming an erase transistor used in an erase operation using a gate induced drain leakage (GIDL) phenomenon. Also, a portion of the gate electrodes 130, the memory gate electrodes 130M adjacent to the upper or lower gate electrodes 130U and 130L, for example, may be dummy gate electrodes, e.g. dummy structures that are not electrically active during operation of the semiconductor device 100.

The gate electrodes 130 may be stacked vertically and may be spaced apart from each other on the first region R1, and may extend from the first region R1 to the second region R2 by different lengths to form a stepped structure having a staircase shape/stepped shape. As illustrated in FIG. 3C, the gate electrodes 130 may form a stepped structure between the gate electrodes 130 in the X direction. In some example embodiments, at least a portion of the gate electrodes 130, two to six gate electrodes 130, for example, may form a single gate group and may form a stepped structure between the gate groups in the X direction. In this case, the gate electrodes 130 forming a single gate group may be disposed to have a stepped structure in the Y direction. By including the stepped structure, the gate electrodes 130 may form a staircase shape in which the lower gate electrode 130 extends further than the upper gate electrode 130, and may provide ends exposed upwardly from the interlayer insulating layers 120. In some example embodiments, the gate electrodes 130 may have an increased thickness at the ends.

As illustrated in FIG. 3A, the gate electrodes 130 may be isolated from each other in the Y direction by a first isolation region MS1 extending in the X direction. The gate electrodes 130 between a pair of the first isolation regions MS1 may form a single memory block, but some example embodiments of the memory block is not limited thereto. A portion of the gate electrodes 130, the memory gate electrodes 130M, for example, may form a single layer within a single memory block.

The gate electrodes 130 may include a metallic material, tungsten (W), for example. In some example embodiments, the gate electrodes 130 may include doped or undoped polycrystalline silicon and/or a metal silicide material. In some example embodiments, the gate electrodes 130 may further include a diffusion barrier. For example, the diffusion barrier may include tungsten nitride (WN), tantalum nitride (TaN), titanium nitride (TiN), or a combination thereof.

The interlayer insulating layers 120 may be alternately stacked with the gate electrodes 130 on the second substrate 101. The interlayer insulating layers 120 may be disposed between the gate electrodes 130. Similarly to the gate electrodes 130, the interlayer insulating layers 120 may be disposed to be spaced apart from each other in a direction perpendicular to the upper surface of the second substrate 101, e.g. the Z direction, and to extend in the X direction. The interlayer insulating layers 120 may include an insulating material such as silicon oxide and/or silicon nitride.

The first and second isolation regions MS1, MS2a, and MS2b may penetrate the gate electrodes 130 and may extend in the X direction. The first and second isolation regions MS1, MS2a, and MS2b may be disposed parallel to each other. The first and second isolation regions MS1, MS2a, and MS2b may penetrate the entire gate electrodes 130 stacked on the second substrate 101 and may be connected to the second substrate 101. The first isolation regions MS1 may extend as a single region in the X direction, and the second isolation regions MS2 may intermittently extend between the pair of first isolation regions MS1, or may be disposed only in a partial region. For example, second central isolation regions MS2a may extend as a single region in the first region R1 and may intermittently extend in the X direction in the second region R2. Second auxiliary isolation regions MS2b may be disposed only in the second region R2 and may intermittently extend in the X direction. In some example embodiments, the arrangement order and the number of the first and second isolation regions MS1, MS2a, and MS2b are not limited to the examples illustrated in FIG. 1A. The first and second isolation regions MS1, MS2a, and MS2b may not overlap the through wiring region TR, and may be spaced apart from the through wiring region TR.

As illustrated in FIGS. 3A to 3C, an isolation insulating layer 105 may be disposed in the first and second isolation regions MS1, MS2a, and MS2b. In some example embodiments, the isolation insulating layer 105 may be connected to the upper insulating layer 190 on an upper end. The isolation insulating layer 105 may have a shape of which a width decreases toward the second substrate 101, e.g. may have a tapered shape, due to a high aspect ratio, but example embodiments thereof are not limited thereto, and the isolation insulating layer 105 may have a side surface perpendicular to the upper surface of the second substrate 101. In some example embodiments, a conductive layer may be further disposed in the isolation insulating layer 105 in the first and second isolation regions MS1, MS2a, and MS2b. In this case, the conductive layer may function as a common source line of the semiconductor device 100 or a contact plug connected to the common source line.

As illustrated in FIG. 1A, the upper isolation regions SS may extend in the X direction between the first isolation regions MS1 and the second central isolation region MS2a and between the central isolation regions MS2a on the first region R1. The upper isolation regions SS may be disposed to penetrate a portion of the gate electrodes 130 including the uppermost upper gate electrode 130U of the gate electrodes 130. As illustrated in FIG. 2B, the upper isolation regions SS may isolate four gate electrodes 130 including the upper gate electrodes 130U from each other in the Y direction. The number of gate electrodes 130 isolated by the upper isolation regions SS may be varied in some example embodiments. The upper gate electrodes 130U isolated by the upper isolation regions SS may form different string selection lines. The upper isolation regions SS may include an insulating material. The insulating material may include at least one of silicon oxide, silicon nitride, or silicon oxynitride, for example.

As illustrated in FIG. 2B, the channel structures CH may form a single memory cell string, and may be spaced apart from each other while forming rows and columns on the first region R1. The channel structures CH may be disposed to form a grid pattern such as a rectangular or square grid pattern or may be disposed in a zigzag pattern in one direction to form another pattern such as a hexagonal pattern. The channel structures CH may have a columnar shape, and/or may have a tapered shape such as a shape having an inclined side surface of which a width decreases toward the second substrate 101 according to an aspect ratio.

As illustrated in FIG. 3B, the channel layer 140 may be disposed in the channel structures CH. In the channel structures CH, the channel layer 140 may be formed in an annular shape surrounding the core region 150 disposed therein, and alternatively, in some example embodiments, the channel layer 140 may have a columnar shape such as a cylindrical shape or a prism shape without the core region 150. The core region 150 may include an insulating material such as silicon oxide. The channel layer 140 may be connected to the first horizontal conductive layer 102 in a lower portion thereof. The channel layer 140 may include a semiconductor material such as doped or undoped polycrystalline silicon and/or doped or undoped single crystalline silicon.

Channel pads 155 may be disposed above the channel layer 140 in the channel structures CH. The channel pads 155 may be disposed to cover the upper surface of the core region 150 and to be electrically connected to the channel layer 140. The channel pads 155 may include, for example, doped polycrystalline silicon.

The gate dielectric layer 145 may be disposed between the gate electrodes 130 and the channel layer 140. As illustrated in FIG. 3B, the gate dielectric layer 145 may include a tunneling layer 143, a charge storage layer 142, and a blocking layer 141 stacked in order from the channel layer 140. The tunneling layer 143 may be configured to tunnel charges to the charge storage layer 142, and may include, for example, silicon oxide ($SiO_2$), silicon nitride ($Si_3N_4$), silicon oxynitride (SiON), or a combination thereof. The charge storage layer 142 may be configured as a charge trap layer or a floating gate conductive layer. The blocking layer 141 may include silicon oxide ($SiO_2$), silicon nitride ($Si_3N_4$), silicon oxynitride (SiON), a high-k dielectric material, or a combination thereof. In some example embodiments, at least a portion of the gate dielectric layer 145 may extend in a horizontal direction along the gate electrodes 130.

The dummy channel structures DCH may have a structure the same as or similar to the channel structures CH, and may be spaced apart from each other while forming rows and columns in a portion of the first region R1 and the second region R2. The dummy channel structures DCH may not be electrically connected to the wiring structures disposed in an upper portion, and/or may not form a memory cell string in the semiconductor device 100, differently from the channel structures CH. The dummy channel structures DCH may improve process margins, e.g. photolithographic process margins, during the fabrication of the semiconductor device 100. In the first region R1, the dummy channel structures DCH may be disposed in a region adjacent to the second region R2.

As illustrated in FIG. 4, the dummy channel structures DCH in the second region R2 may be disposed to penetrate the horizontal insulating layer 110 in the z direction. A lower portion of the dummy channel structures DCH may be surrounded by the second horizontal conductive layer 104 and the horizontal insulating layer 110, and the dummy channel structures DCH may be spaced apart from the first horizontal conductive layer 102. Specifically, the dummy channel structures DCH may penetrate the interlayer insulating layers 120 and the gate electrodes 130, and may penetrate the second horizontal conductive layer 104 and the horizontal insulating layer 110 on a lower end. In some example embodiments, the dummy channel structures DCH may be disposed to penetrate the interlayer insulating layers 120 and the sacrificial insulating layers 118 and to penetrate the second horizontal conductive layer 104 and the horizontal insulating layer 110 on a lower end in the through wiring region TR.

As illustrated in FIG. 4, the dummy channel structures DCH in the second region R2 may include the blocking layer 141 of the gate dielectric layer 145 of the channel structure CH, the charge storage layer 142, and first to third dielectric layers 141d, 142d, and 143d corresponding to the tunneling layer 143. The first to third dielectric layers 141d, 142d, and 143d may be stacked in order from an internal wall of a hole of the dummy channel structure DCH. The dummy channel structures DCH may include a dummy channel layer 140d, a dummy core region 150d, and a dummy channel pad 155d, which may correspond to and may be formed at the same time as the channel layer 140, the core region 150, and the channel pad 155 of the channel structure CH, respectively. Each of the first to third dielectric layers 141d, 142d, and 143d may include silicon oxide, silicon nitride, silicon oxynitride, or a combination thereof, and the dummy channel layer 140d may include a semiconductor such as doped or undoped polycrystalline silicon or doped or undoped single crystalline silicon. The dummy core region 150d may include silicon oxide.

In the channel structures CH, the gate dielectric layer 145 may be partially penetrated by the first horizontal conductive layer 102 and may be divided into an upper gate dielectric layer and a lower gate dielectric layer, and the first to third dielectric layers 141d, 142d, and 143d of the structures DCH may have a continuous structure.

The through wiring region TR may be configured to include a wiring structure for electrically connecting the memory cell structure CELL to the peripheral circuit structure PERI. The through wiring region TR may be disposed to penetrate the second region R2. The through wiring region TR may include through contact plugs 180 penetrating the second substrate 101 and extending in a z direction and an insulating region IR surrounding the through contact plugs 180. In some example embodiments, the region within the barrier structure 160 may be referred to as a through wiring region TR. A single through wiring region TR may be disposed in each memory block, for example, and may be further disposed in the first region R1. At least one of the number, the size, the arrangement form, and the shape of the through wiring regions TR may be varied in some example embodiments. For example, in some example embodiments, a single through wiring region TR may be disposed for the plurality of memory blocks.

The through wiring region TR may be disposed to be spaced apart from the first and second isolation regions MS1, MS2a, and MS2b, as illustrated in FIGS. 1A and 1B. For example, the through wiring region TR may be spaced apart from the first isolation regions MS1 adjacent to each other in the Y direction and may be disposed between the pair of first isolation regions MS1. By the arrangement, the sacrificial insulating layers 118 may remain in the through wiring region TR. The through wiring region TR may have a rectangular shape such as a square shape when viewed in plan view; however, example embodiments are not limited thereto.

The insulating region IR may penetrate the memory cell structure CELL and may be disposed in parallel to the second substrate 101 and the gate electrodes 130. The insulating region IR may include an insulating stack structure formed of an insulating material, in which the gate electrode 130 is not disposed or does not extend. The insulating region IR may include a substrate insulating layer 109, a first insulating layer disposed at a level the same as a level of the second substrate 101 and disposed side by side with the second substrate 101, interlayer insulating layers 120, second and third insulating layers alternately stacked on the upper surface of the second substrate 101, and sacrificial insulating layers 118.

The substrate insulating layer 109, e.g. the first insulating layer, may be disposed in a region from which a portion of the second substrate 101, the horizontal insulating layer 110, and the second horizontal conductive layer 104 is removed, and may be surrounded by the second substrate 101, the horizontal insulating layer 110, and the second horizontal conductive layer 104. A lower surface of the substrate insulating layer 109 may be substantially coplanar with the lower surface of the second substrate 101 or may be disposed at a level lower than a level of the lower surface of the second substrate 101. In some example embodiments, the substrate insulating layer 109 may include a plurality of insulating layers. Since the second insulating layer is formed by extending the interlayer insulating layers 120, the second insulating layer may be disposed at a level substantially the same as a level of the interlayer insulating layers 120. The third insulating layer may include the sacrificial insulating layers 118 and may be disposed at a level substantially the same as a level of the gate electrodes 130, but some example embodiments thereof is not limited thereto.

The substrate insulating layer 109, the interlayer insulating layers 120, and the sacrificial insulating layers 118 forming the insulating region IR may be formed of/may include an insulating material. For example, each of the substrate insulating layer 109, the interlayer insulating layers 120, and the sacrificial insulating layers 118 may include at least one of silicon oxide, silicon nitride, or silicon oxynitride. The substrate insulating layer 109 and the sacrificial insulating layers 118 may have different widths or may have the same width in some example embodiments.

The through contact plugs 180 may vertically penetrate the entire insulating region IR and may extend perpendicularly to the upper surface of the second substrate 101, and may electrically connect the memory cell structure CELL to the circuit devices 220 of the peripheral circuit structure PERI. For example, the through contact plugs 180 may electrically connect the gate electrodes 130 and/or the channel structures CH of the memory cell structure CELL to the circuit devices 220 of the peripheral circuit structure PERI.

The through contact plugs 180 may be connected to the wiring lines 188 on an upper portion. The through contact plugs 180 may be connected to the circuit wiring lines 280, e.g. lower wiring structures, on a lower portion.

The through contact plugs 180 may penetrate the interlayer insulating layers 120 and the sacrificial insulating layers 118 of the insulating region IR, and may penetrate the substrate insulating layer 109 on a lower portion. The number, the form, and the shape of the through contact plugs 180 in a single through wiring region TR may be varied in some example embodiments. According to some example embodiments, the through contact plugs 180 may have a form in which a plurality of layers are connected. Also, in addition to the through contact plugs 180, wiring structures may be further disposed in the insulating region IR in the form of wiring lines in some example embodiments. The through contact plugs 180 may include a conductive material, and may include, for example, at least one of tungsten (W), copper (Cu), aluminum (Al), or the like.

The barrier structure 160 may be disposed to surround the through wiring region TR in the second region R2. The barrier structure 160 may include horizontal regions disposed on the same linear line on which the first and second isolation regions MS1, MS2a, and MS2b extending in the X direction are disposed, and vertical regions extending in the Y direction on the plan view. In some example embodiments, the horizontal regions and the vertical regions may form a single closed curve, and the barrier structure 160 may be disposed in a slit having a quadrangular ring or a shape similar to a quadrangular ring such as a square ring or a chamfered/beveled ring on a plan view. The barrier structure 160 may prevent or reduce the likelihood of a material forming the gate electrodes 130 from flowing into the through wiring region TR during the process of manufacturing a semiconductor device.

As illustrated in FIGS. 2A, 2B, and 4, the barrier structure 160 may be disposed on a boundary between the gate electrodes 130 and the sacrificial insulating layers 118. An external side surface S1 of the barrier structure 160 may face the gate electrodes 130, and an internal side surface S2 of the barrier structure 160 may face the sacrificial insulating layers 118. In some example embodiments, the terms "external side surface" and "internal side surface" used in relation to the barrier structure 160 may refer to a side surface directed to an external region of the barrier structure 160 and a side surface directed to an internal region surrounded by the barrier structure 160, respectively. The barrier structure 160 may be disposed at a level substantially the same as a level of the first and second isolation regions MS1, MS2a, and MS2b. The barrier structure 160 may be configured as above because, for example, the barrier structure 160 may be formed in a trench formed in the same process of forming the first and second isolation regions MS1, MS2a, and MS2b. Also, the barrier structure 160 may be disposed in a region in which the second horizontal conductive layer 104 is in contact with/direct contact with the second substrate 101, similarly to the arrangement of the first and second isolation regions MS1, MS2a, and MS2b in the second region R2. Accordingly, the barrier structure 160 may penetrate the second horizontal conductive layer 104 and may be in contact with/direct contact with the second horizontal conductive layer 104 on a lower end, and may be spaced apart from the first horizontal conductive layer 102 and the horizontal insulating layer 110. The upper surface of the barrier structure 160 may be disposed at a level higher than a level of the upper surface of the dummy channel structure DCH.

As illustrated in FIG. 4, the barrier structure 160 may include a first barrier layer 161, a second barrier layer 162, and a core insulating layer 165 stacked in order from the internal side surfaces and the bottom surface of the slit. The first barrier layer 161 and the second barrier layer 162 may include, e.g. may consist of, different materials, and the core insulating layer 165 may include a material different from materials of the second barrier layer 162. The core insulating layer 165 may include, e.g. may consist of, the same material as a material of the first barrier layer 161. For example, each of the first barrier layer 161, the second barrier layer 162, and the core insulating layer 165 may include one of, e.g. only one of, silicon oxide, silicon nitride, and silicon oxynitride. For example, the first barrier layer 161 may include silicon oxide and may not include silicon nitride, the second barrier layer 162 may include silicon nitride and may not include silicon oxide, and the core insulating layer 165 may include silicon oxide and may not include silicon nitride. The barrier structure 160 may not include polysilicon.

The first barrier layer 161 may cover the bottom surface and side surfaces of the slit and may extend in the Z direction. The first barrier layer 161 may cover the external side surfaces and the bottom surface of the second barrier layer 162. The first barrier layer 161 may be adjacent to the gate electrodes 130 on the external side surface S1 of the barrier structure 160 and may be adjacent to the sacrificial insulating layers 118 on the internal side surface S2 of the barrier structure 160. The lower end of the first barrier layer 161 may be disposed to be in contact with the upper surface of the second substrate 101 or to be partially recessed into the second substrate 101.

The second barrier layer 162 may be disposed on the first barrier layer 161, and may be disposed on opposite internal side surfaces of the first barrier layer 161, for example. The second barrier layer 162 may be disposed between the first barrier layer 161 and the core insulating layer 165. The second barrier layer 162 may cover side surfaces and a bottom surface of the core insulating layer 165. The second barrier layer 162 may cover a portion in which the first barrier layer 161 covers the bottom surface of the slit, and may extend in the Z direction along internal side surfaces of the first barrier layer 161. The second barrier layer 162 may be in contact with/direct contact with the internal side surfaces of the first barrier layer 161. The internal side surfaces of the second barrier layer 162 may be in contact with/direct contact with the core insulating layer 165.

Lower surfaces and side surfaces of the core insulating layer 165 may be surrounded by the second barrier layer 162. The core insulating layer 165 may have a horizontal thickness t3 greater than a horizontal thickness t1 of the first barrier layer 161 and a horizontal thickness t2 of the second barrier layer 162. The core insulating layer 165 may be disposed to have a quadrangular ring such as a square ring or a shape similar to a quadrangular ring on a plane, e.g. in a plan view. The core insulating layer 165 may be disposed in a central region of the barrier structure 160 between opposite internal side surfaces of the second barrier layer 162. The central region may be, for example, a region including a central axis between the external side surface S1 and the internal side surface S2 within the barrier structure 160. The core insulating layer 165 may fill the internal space of the second barrier layer 162 in openings OP2 (in FIG. 11B) in which the barrier structure 160 is disposed. According to some example embodiments, a seam may be formed in the core insulating layer 165.

Each of the first and second barrier layers 161 and 162 of the barrier structure 160 may have a horizontal thickness greater than a horizontal thickness of the first to third dielectric layers 141*d*, 142*d*, and 143*d* of the dummy channel structure DCH. The core insulating layer 165 of the barrier structure 160 may have a horizontal thickness greater than the horizontal thickness of the dummy core region 150*d* of the dummy channel structure DCH.

Since the core insulating layer 165 is not formed of a semiconductor material, and is formed of an insulating material such as silicon oxide, defects such as cracks of the barrier structure 160 or the upper structure thereof, the support structure 170, for example, which may be caused by reduction or expansion of the semiconductor material by heat, may be prevented or reduced in likelihood of occurrence.

The support structure 170 may be disposed on the stack structure GS of the gate electrodes 130. The support structure 170 may cover the capping insulating layer 190. The support structure 170 may be disposed above the channel structures CH, the dummy channel structures DCH, the first and second isolation regions MS1, MS2*a*, and MS2*b*, and the barrier structure 160.

As illustrated in FIGS. 1B to 2B, the support structure 170 may include support patterns 170P disposed in a position overlapping the gate electrodes 130, first through regions OS1*a* and OS1*b* disposed in a position overlapping the first and second isolation regions MS1, MS2*a* and MS2*b*, and second through regions OS2 disposed in a position overlapping the barrier structure 160. The first and second through regions OS1*a*, OS1*b*, and OS2 may penetrate the support patterns 170P in the z direction. A first width W1 of the first through regions OS1*a* and OS1*b* may be larger than a second width W2 of the first and second isolation regions MS1, MS2*a*, and MS2*b*. The first width Wa1 of the second through region OS2 may be greater than the second width Wa2 of the barrier structure 160. In some example embodiments, the first widths W1 and Wa1 may be substantially the same as the second widths W2 and Wa2, or may be smaller than the second widths W2 and Wa2.

As illustrated in FIGS. 1B to 2B, the support structure 170 may further include bridge patterns 170B disposed to be spaced apart from each other in the X direction. The bridge patterns 170B may be disposed in a region in which the first and second through regions OS1*a*, OS1*b*, and OS2 are not disposed and may connect the support patterns 170P to each other. In the semiconductor device 100, since the support structure 170 may include the support patterns 170P and the bridge patterns 170B, the stack structure GS formed by the gate electrodes 130 may be prevented from or reduced in likelihood of tilting.

The first through regions OS1*a* and OS1*b* disposed in the first region R1 may be intermittently disposed and may be spaced apart from each other in the X direction. The first through regions OS1*a* and OS2*b* disposed in the first region R1 may be arranged in a zigzag pattern in the Y direction. A portion of the first through regions OS1*a* and OS1*b* disposed on the first isolation regions MS1 of the second region R2 may extend continuously in the X direction. The other portions OS1*b* of the first through regions OS1*a* and OS1*b* disposed on the second isolation regions MS2*a* and MS2*b* of the second region R2 may be disposed to be spaced apart from each other in the X direction. The region in which the other portion OS1*b* of the first through regions are spaced apart from each other in the X direction may overlap, in the Z direction, the region of the second region R2 in which the second central isolation regions MS2*a* are spaced apart from each other in the X direction and the region in which the second auxiliary isolation regions MS2*b* are spaced apart from each other in the X direction.

Figure 13A:
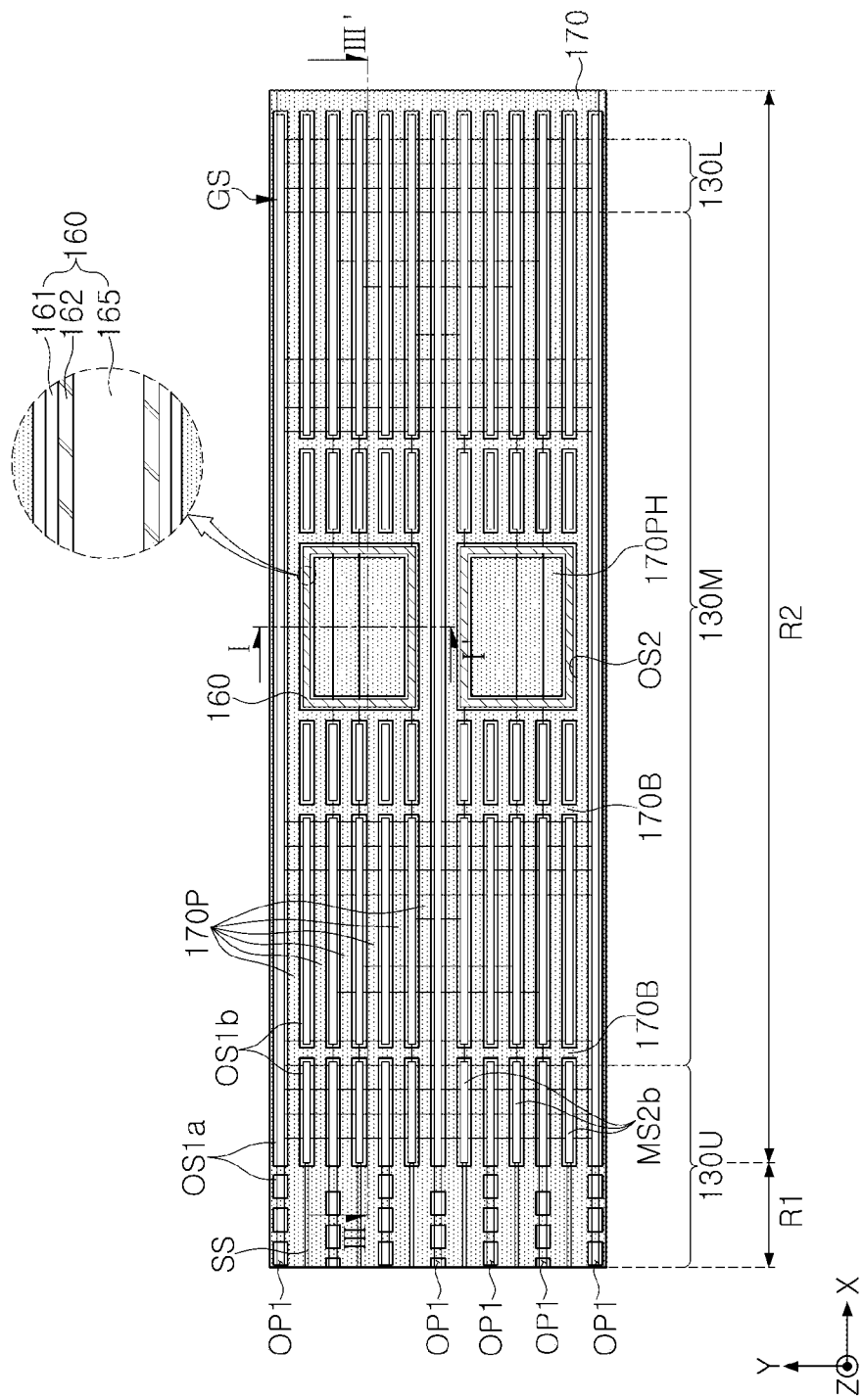
Figure 13B:
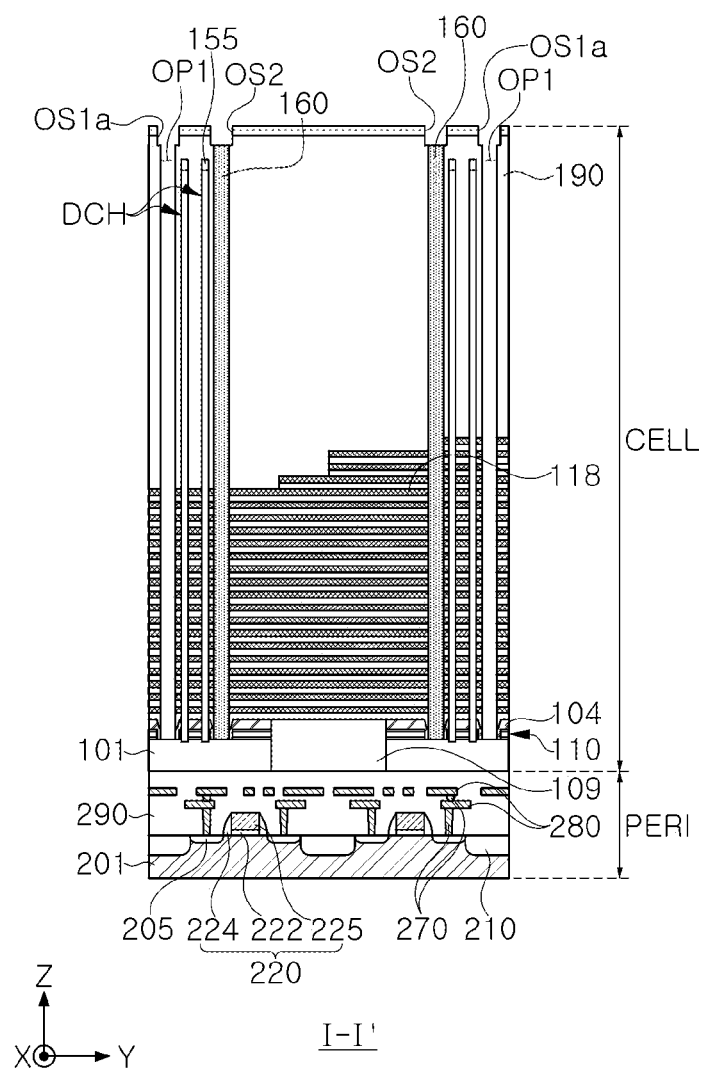
Figure 13C:
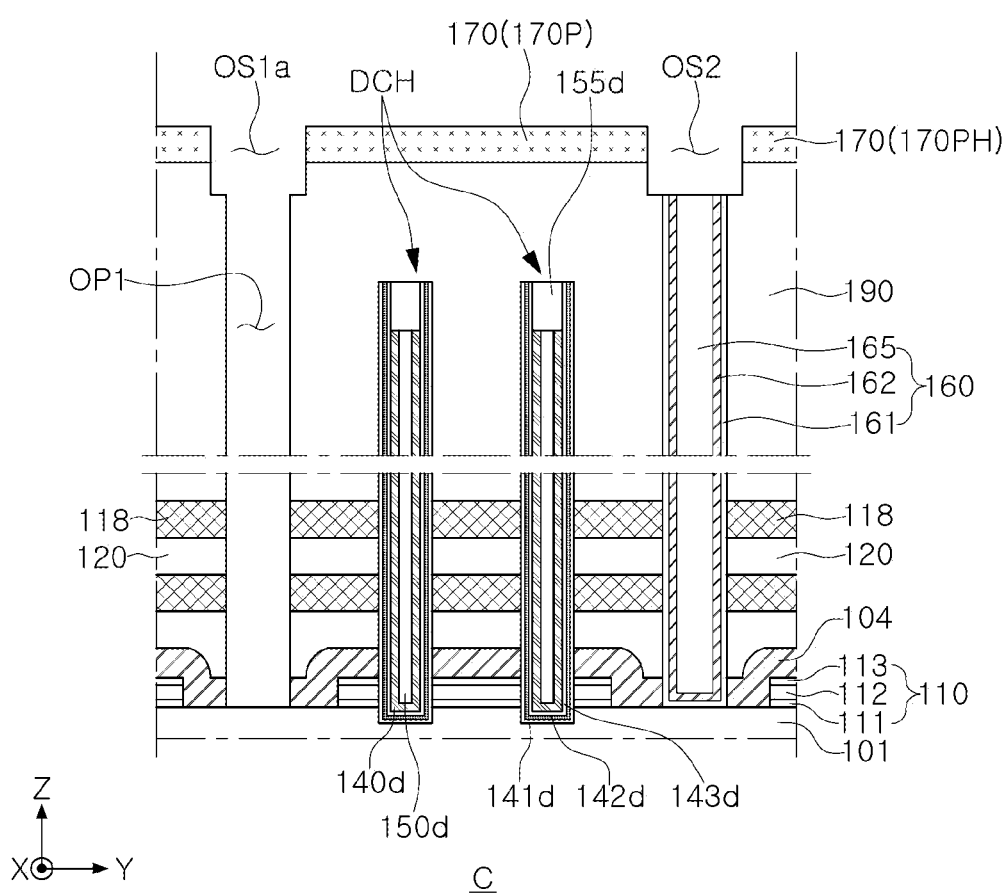
Figure 14A:
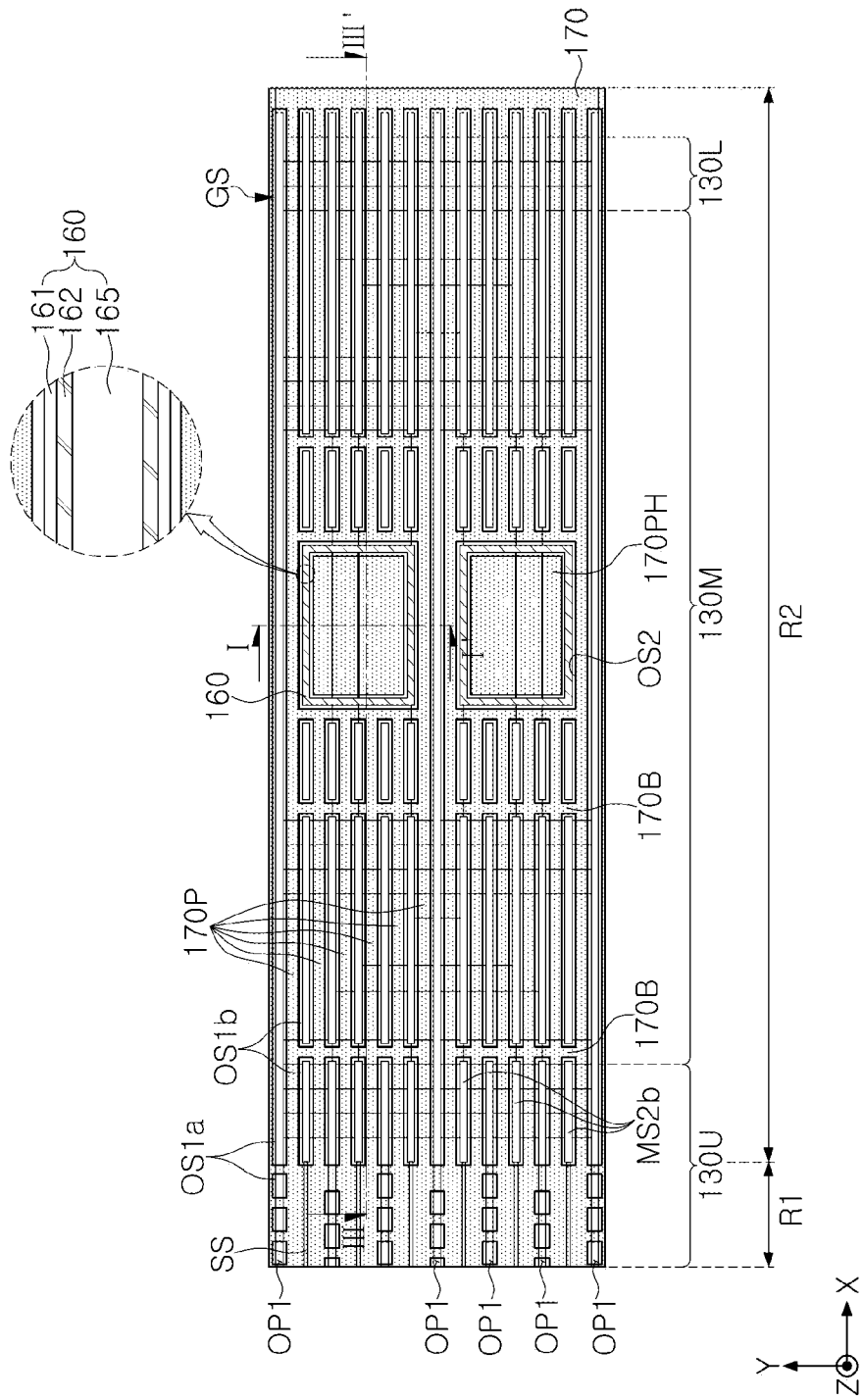
Figure 14B:
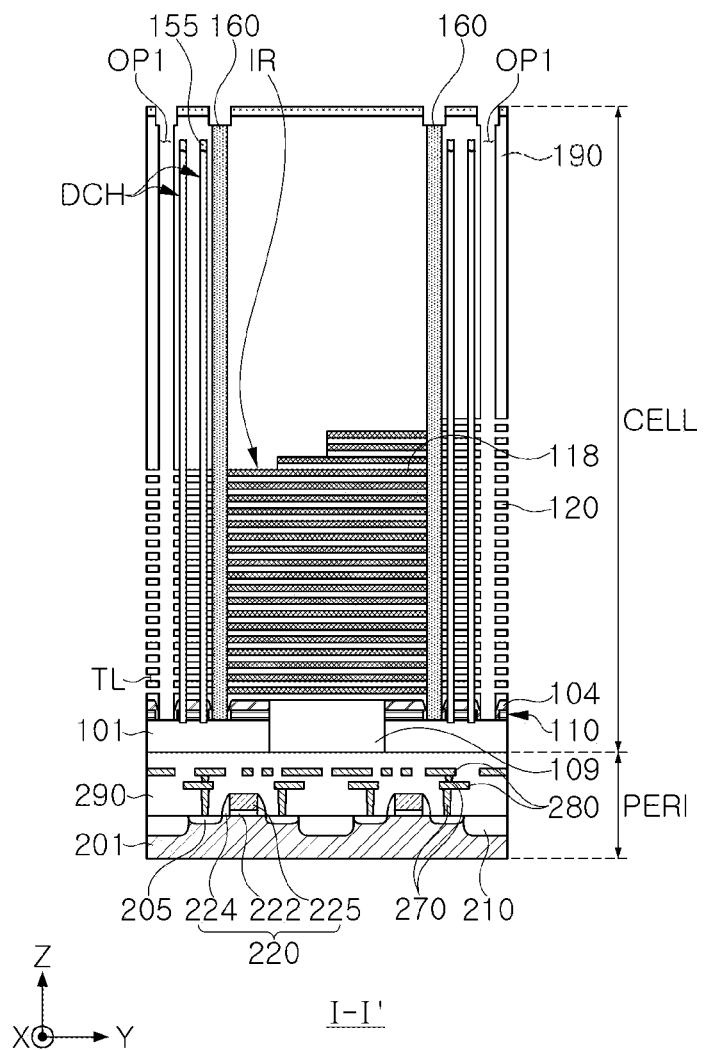
Figure 14C:
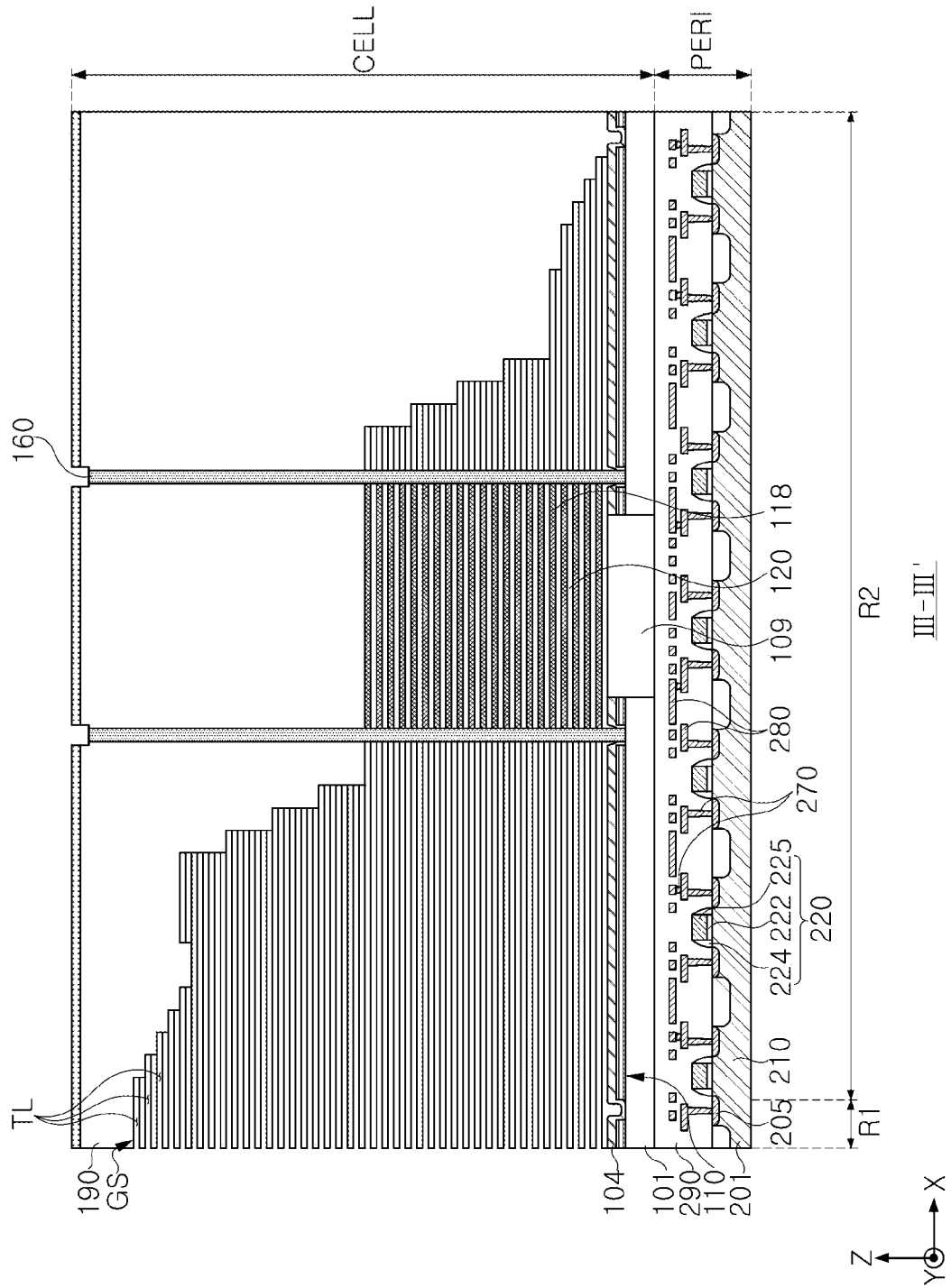
Figure 14D:
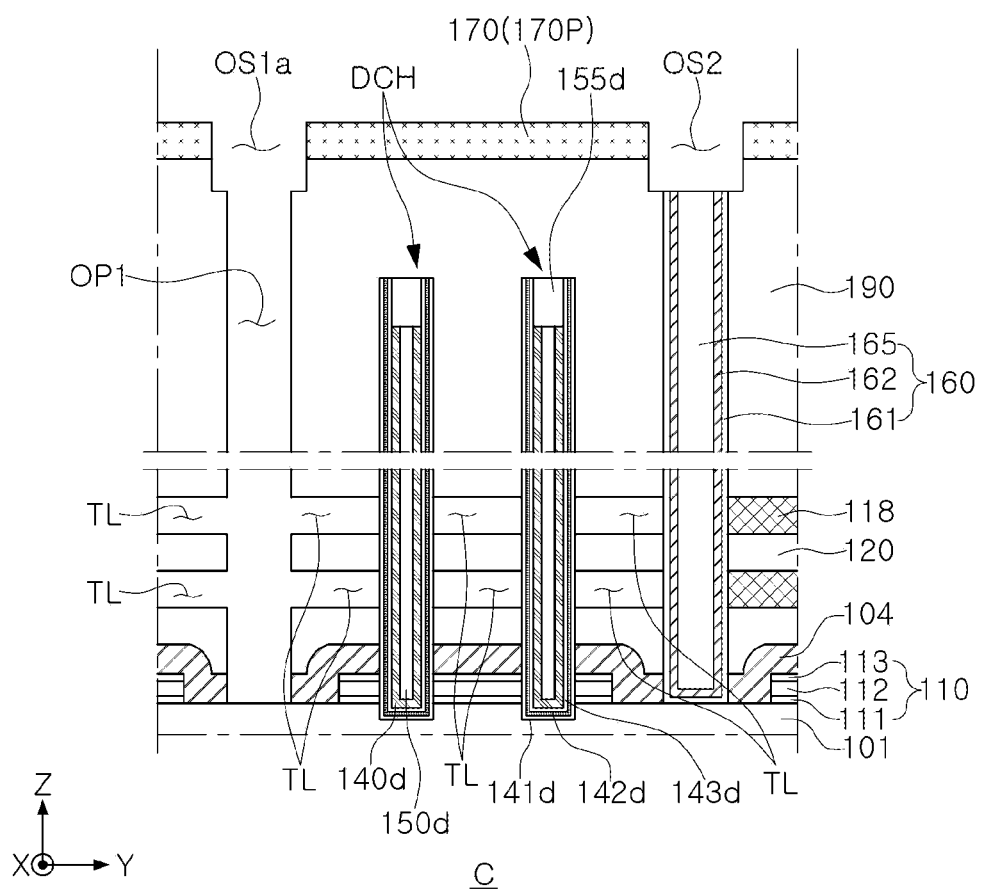

The first through regions OS1*a* and OS1*b* may provide a path of inflow of an etchant, such as a wet etchant such as buffered hydrogen fluoride, for replacing the sacrificial insulating layers 118 with the gate electrodes 130 in FIG. 4 through the first openings OP1 (in FIG. 13C). According to some example embodiments, the arrangement of the first through regions OS1*a* and OS1*b* may be varied, and accordingly, the arrangement of the bridge patterns 170B of the support structure 170 may also be varied.

The second through region OS2 disposed in the second region R2 may be in contact with the upper surface of the barrier structure 160. The second through region OS2 may have a shape corresponding to a planar shape of the barrier structure 160. For example, the second through region OS2 may include horizontal regions extending in the X direction and vertical regions extending in the Y direction on the plan view. In some example embodiments, the horizontal regions and the vertical regions of the second through region OS2 may form a single closed curve. Accordingly, the support structure 170 may include a support pattern 170PH surrounded by the second through region OS2, as illustrated in FIG. 2A. The second through regions OS2 may be adjacent to each other in the Y direction, may be spaced apart from the first through regions OS1*a* disposed on the first isolation regions MS1, and may be disposed between a pair of first through regions OS1*a*. On a plan view, the second through region OS2 may have a quadrangular ring or a shape similar thereto.

In the barrier structure 160, a material of the stack structure in which the external side surface is in contact with the internal side surface is different, such that stresses such as thermal stresses on the external side surface and the internal side surface may be different, and the structure around the barrier structure 160, the support structure 170, for example, may have a physically weak structure. Since the conductive material forming the gate electrodes 130, tungsten (W), for example, has a property of shrinking by heat, step portions of the stack structure may be formed on external side regions and internal side regions of the barrier structure 160. In this case, when the support structure 170 does not have the second through region OS2, a defect such as cracks may be created in the support structure 170. However, since the support structure 170 has the second through region OS2 on the barrier structure 160, the support patterns 170P and 170PH of the support structure 170 may be isolated from each other on the external side region and the internal side region of the barrier structure 160. Accordingly, physical vulnerability of the support structure 170 caused by the step portions of the stack structure formed on the external side region and the internal side region of the barrier structure 160 may be improved/addressed. By providing the support structure 170 with physical vulnerability improved or addressed, the stack structure GS of the gate electrodes 130 may be more stably formed, thereby providing a semiconductor device having improved reliability and electrical properties.

Figure 12A:
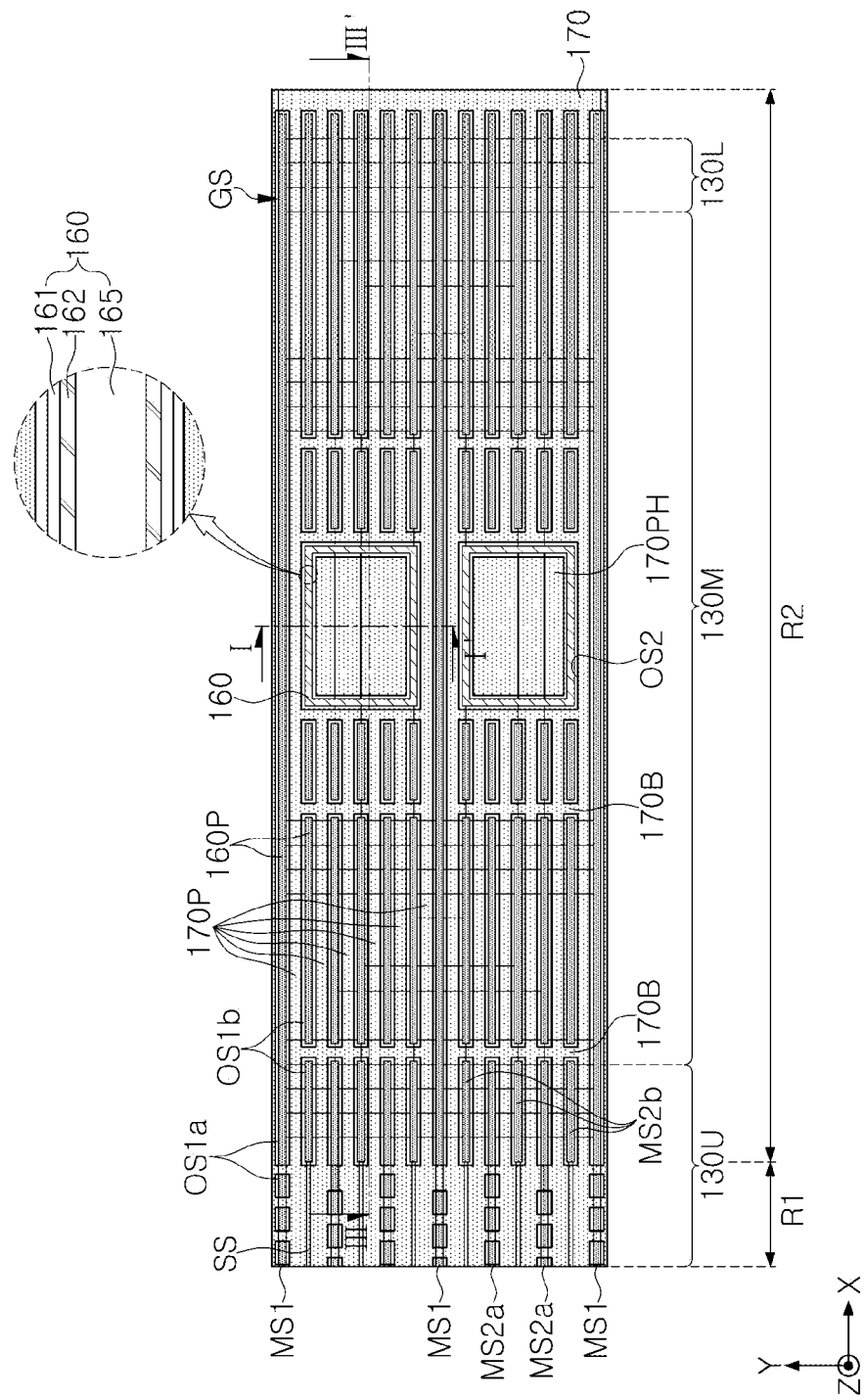
Figure 12B:
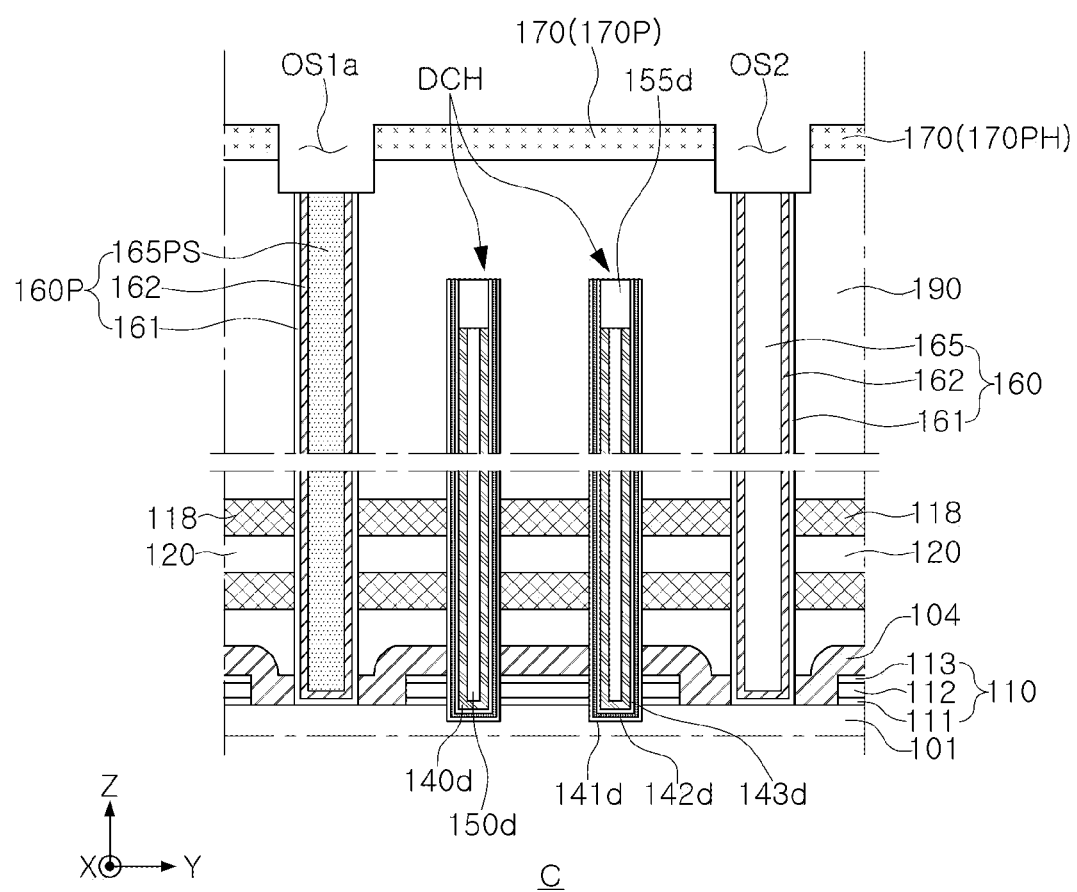

The support structure 170 may have the second through region OS2 on the barrier structure 160 because the core insulating layer 165 of the barrier structure 160 may include/ consist of a material different from the material of the sacrificial core layer 165PS in the first openings OP1, referring to FIG. 12B.

A first metal oxide layer 175A may be disposed on side surfaces of the support pattern 170P exposed to the first through regions OS1*a*. The first metal oxide layer 175A may extend in the Z direction along side surfaces of the isolation regions MS1, MS2a, and MS2b and along side surfaces of the first through regions OS1a. The first metal oxide layer 175A may cover sidewalls of the interlayer insulating layers 120 exposed to the isolation regions MS1a, MS2a, and MS2b, may extend horizontally between the interlayer insulating layers 120 and may surround at least a portion of the conductive layer forming the gate electrodes 130. The first metal oxide layer 175A may include, for example, a metal oxide such as aluminum oxide.

An isolation insulating layer 105 may be disposed in the isolation regions MS1, MS2a, and MS2b and the first through regions OS1. The isolation insulating layer 105 may include a plurality of insulating layers, and may include, for example, a first insulating layer 105A and a second insulating layer 105B on the first insulating layer 105A. Sides and lower surfaces of the second insulating layer 105B may be surrounded by the first insulating layer 105A. The first insulating layer 105A of the isolation insulating layer 105 may cover at least a portion of the first metal oxide layer 175A. The second insulating layer 105B of the isolation insulating layer 105 may be connected to the upper insulating layer 195. The first insulating layer 105A may include recess portions concave inwardly toward the gate electrodes 130.

The second metal oxide layer 175B may be disposed on side surfaces of the support pattern 170P exposed to the second through region OS2. The second metal oxide layer 175B may be disposed to extend in the z direction along side surfaces of the support pattern 170P exposed to the second through region OS2 and to cover the upper surface of the barrier structure 160. A through insulating layer 178 may be disposed in the second through region OS2. The through insulating layer 178 may include a plurality of insulating layers, and may include, for example, a first insulating layer 178A and a second insulating layer 178B on the first insulating layer 178A. Side surfaces and lower surfaces of the second insulating layer 178B may be surrounded by the first insulating layer 178A. The first insulating layer 178A of the through insulating layer 178 may cover the second metal oxide layer 175B. The second insulating layer 178B of the through insulating layer 178 may be connected to the upper insulating layer 195.

A boundary between the first and second through regions OS1 and OS2 and the isolation regions MS1, MS2a and MS2b may be distinct by the first and second metal oxide layers 175A and 175B disposed on sidewalls therein. The capping insulating layer 190 in contact with the first and second through regions OS1 and OS2 and the support patterns 170P of the support structure 170 may include an insulating material such as silicon oxide and/or silicon nitride, and the first and second metal oxide layers 175A and 175B may include, e.g. may consist of, materials different from a material of the first and second metal oxide layers 175A and 175B, such that a boundary therebetween may be distinct. In some example embodiments, the shape of the second metal oxide layer 175B may be varied. For example, the second metal oxide layer 175B may have a shape corresponding to a profile of the upper surface of the barrier structure 160 due to process factors. The boundary between the first and second insulating layers 105A and 105B of the isolation insulating layer 105 and the boundary between the first and second insulating layers 178A and 178B of the through insulating layer 178 may be distinct or indistinct.

As illustrated in FIG. 3C, the gate contact plugs 185 may be connected to the gate electrodes 130 of which the upper surfaces are exposed upwardly in the second region R2.

The wiring lines 188 may form an upper wiring structure electrically connected to memory cells in the memory cell structure CELL. The wiring lines 188 may be electrically connected to the through contact plugs 180, the gate electrodes 130, and the channel structures CH, for example. The number of contact plugs and wiring lines forming the wiring structure may be varied in some example embodiments. The wiring lines 188 may include metal, and may include, for example, at least one of tungsten (W), copper (Cu), aluminum (Al), and the like.

The capping insulating layer 190 may be disposed to cover the second substrate 101, the gate electrodes 130 on the second substrate 101, and the peripheral region insulating layer 290. The capping insulating layer 190 may be formed of an insulating material, and may be formed of a plurality of insulating layers.

The upper insulating layer 195 may be disposed to cover the support structure 170. The upper insulating layer 195 may be formed of an insulating material, and may be formed of a plurality of insulating layers.

FIGS. 5A to 5D are enlarged cross-sectional views illustrating a portion of a semiconductor device according to some example embodiments, illustrating a region corresponding to region "C" in FIG. 3A.

Figure 5A:
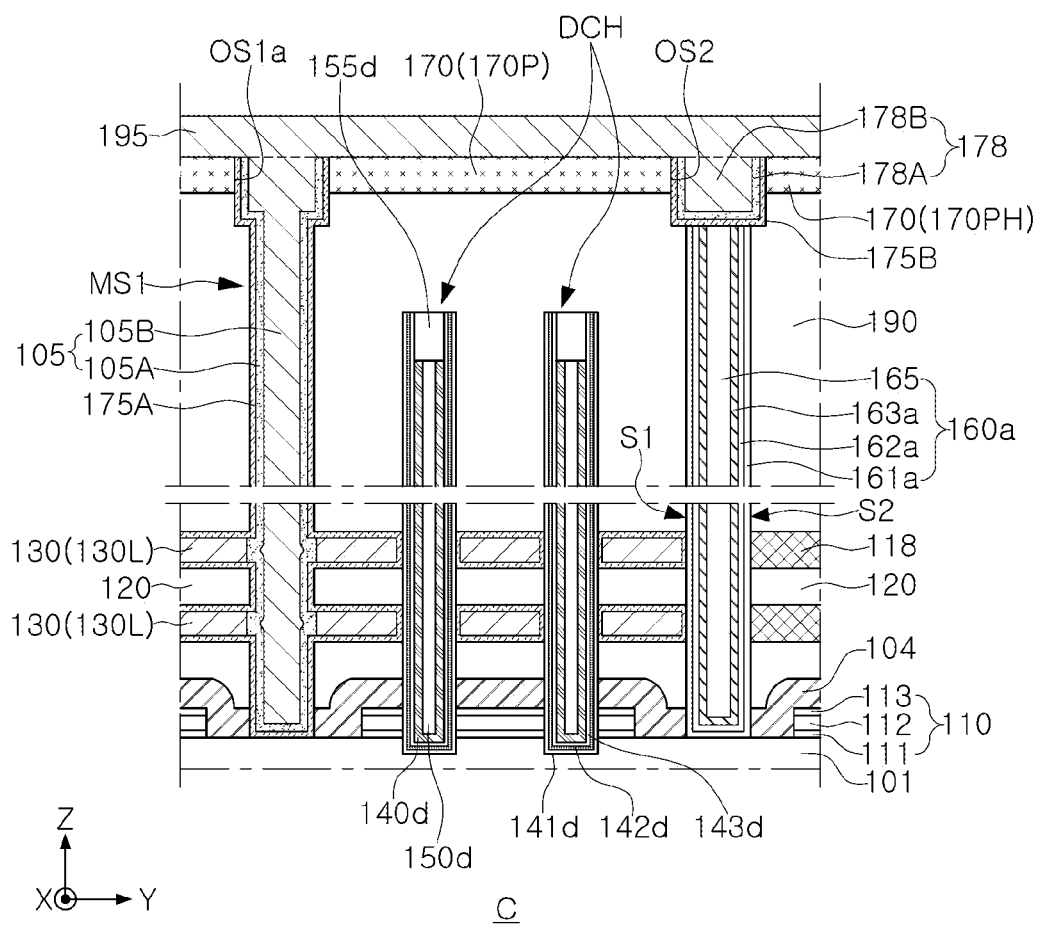
FIGS. 5A to 6 are enlarged cross-sectional views illustrating a portion of a semiconductor device according to some example embodiments of inventive concepts.

Referring to FIG. 5A, in a semiconductor device 100a, layers disposed in the barrier structure 160a may be partially different from example embodiments of FIG. 4. The barrier structure 160a may include a core insulating layer 165 disposed in a central region and first to third barrier layers 161a, 162a, and 163a stacked in order from the bottom surface and side surfaces of the barrier structure 160a. The first and second barrier layers 161a and 162a may include silicon oxide and may not include silicon nitride, and the third barrier layer 163a may include silicon nitride and may not include silicon oxide. The configuration, the number, and/or the stacking order of barrier layers disposed in the barrier structure 160a may be varied in some example embodiments. For example, the first barrier layer 161a may include silicon oxide and may not include silicon nitride, and the second and third barrier layers 162a and 163a may include silicon nitride and may not include silicon oxide.

Figure 5B:
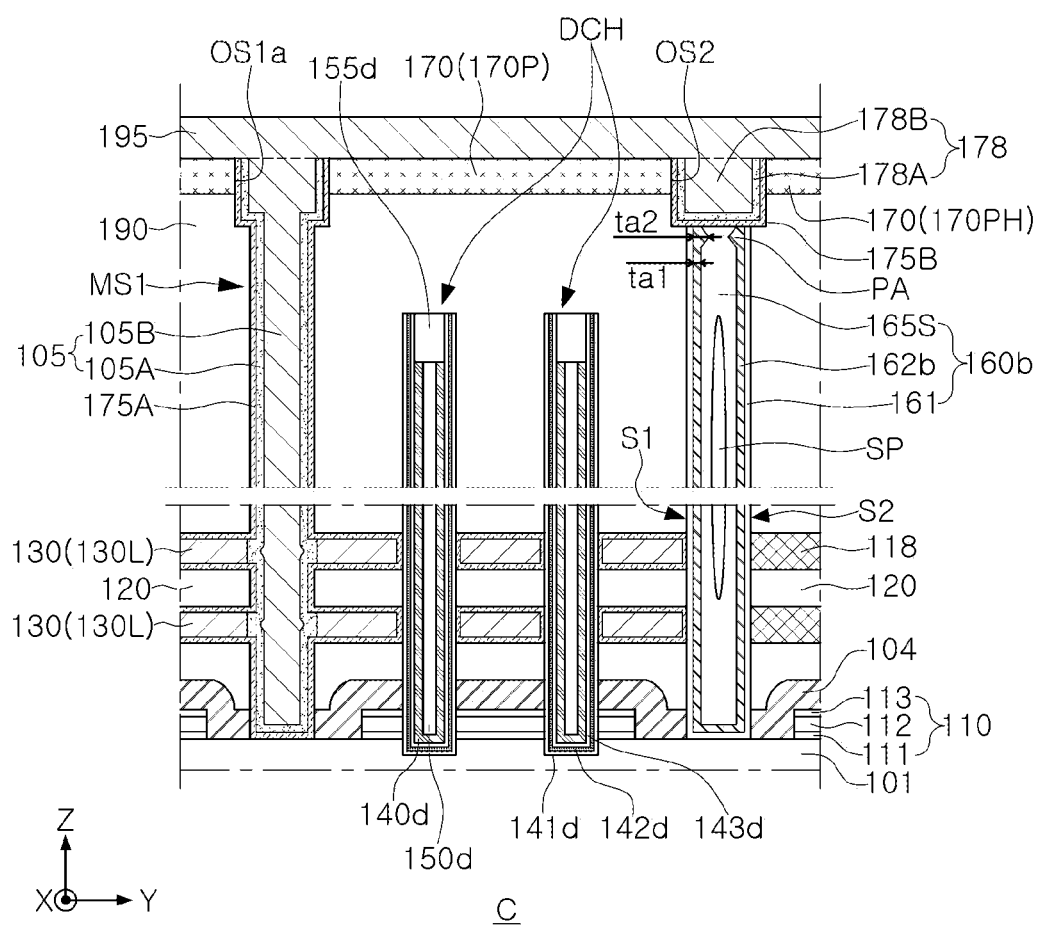

Referring to FIG. 5B, in a semiconductor device 100b, the second barrier layer 162b and the core insulating layer 165S disposed in the barrier structure 160b may be partially different from the example embodiment in FIG. 3.

The second barrier layer 162b may include a protrusion PA protruding toward the core insulating layer 165S. The protrusion PA may be disposed on the upper region of the barrier structure 160b and may be disposed at a level higher than a level of the gate electrodes 130. The protrusions PA may be disposed in a pair on both sides of the upper portion of the core insulating layer 165S on the cut-out surface of the semiconductor device 100b, and the pair of protrusions PA may oppose each other. The protrusions PA may have a triangular shape or a shape similar thereof. In some example embodiments, corners of the protrusions PA may have a rounded shape due to a process factor. In some example embodiments, it may be understood that the second barrier layer 162b may have a first horizontal thickness ta1 on lower portion and may have a second horizontal thickness ta2 greater than the first horizontal thickness ta1 on an upper portion.

A seam SP may be formed in the core insulating layer 165S. The seam SP may refer to an empty space/voided space/air gap enclosed by an insulating material layer forming the core insulating layer 165S. Since the second barrier layer 162b includes the protrusions PA, the seam SP formed in the core insulating layer 165S may be formed at a level lower than a level of the protrusions PA. The seam SP may be disposed to extend in the Z direction. The seam SP in the core insulating layer 165S may not be formed only by the protrusions PA. For example, a seam SP may be formed in the core insulating layer 165S even when no protrusions PA are provided, and a seam SP may not be formed in the core insulating layer 165S even when the protrusions PA are provided.

Figure 5C:
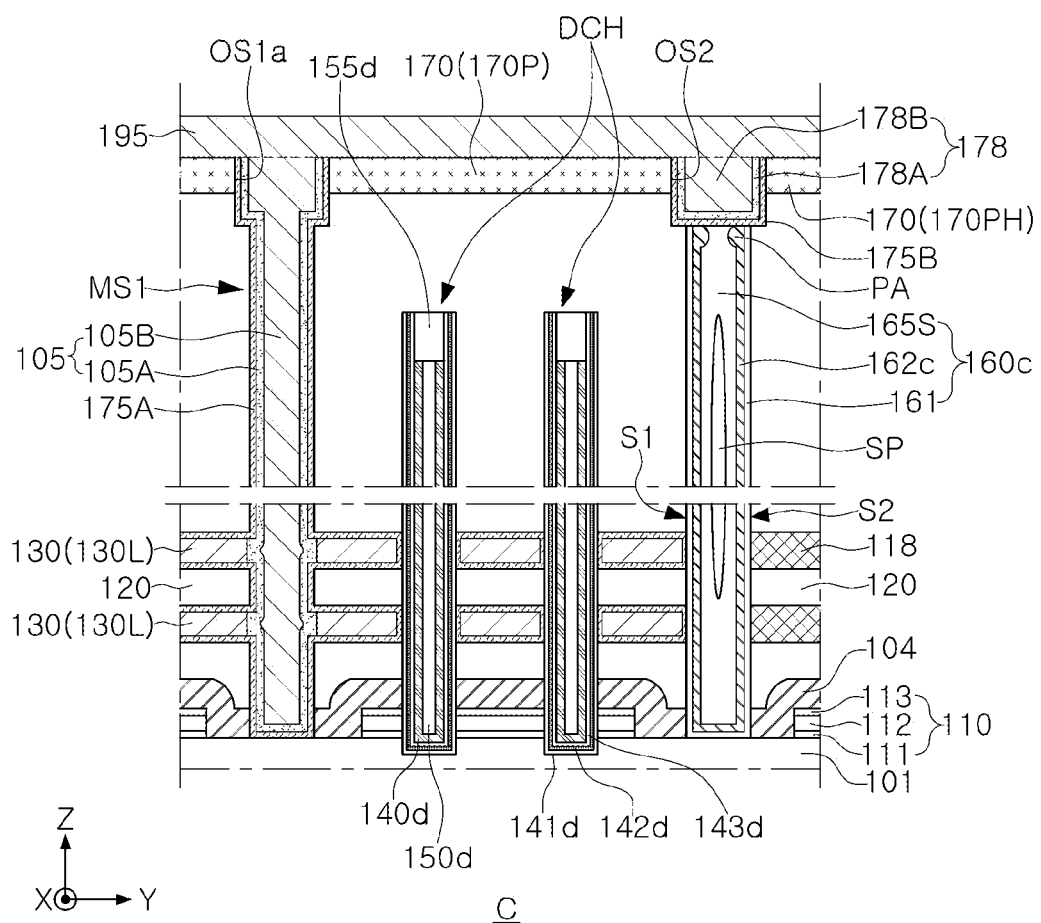

Referring to FIG. 5C, in a semiconductor device 100c, the second barrier layer 162c disposed in the barrier structure 160c may be partially different from example embodiments in FIG. 5B. The second barrier layer 162c may include a protrusion PA, and the protrusion PA may have a semicircle shape or a shape similar thereto. The protrusions PA may be disposed in pairs on both sides of the upper core insulating layer 165S in the cut-out surface of the semiconductor device 100c, and the pair of protrusions PA may oppose each other. A seam SP may be formed in the core insulating layer 165S. In some example embodiments, the shape of the protrusion PA may be varied.

Figure 5D:
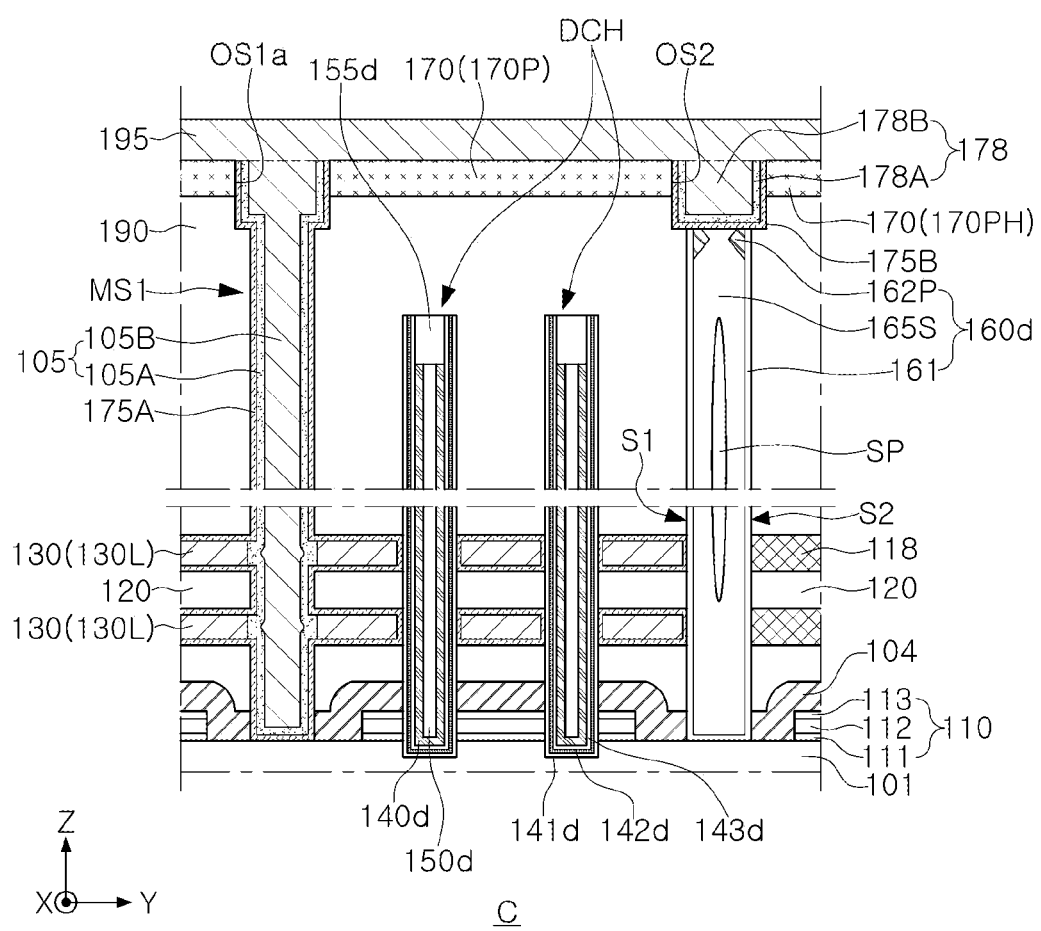

Referring to FIG. 5D, in the semiconductor device 100d, layers disposed in the barrier structure 160d may be partially different from example embodiments in FIG. 4. The barrier structure 160d may include a core insulating layer 165S disposed in a central region and having a seam SP and a first barrier layer 161 in contact with the core insulating layer 165S. The barrier structure 160d may further include a second barrier layer 162P disposed between the upper region of the first barrier layer 161 and the upper region of the core insulating layer 165S in the same shape as those of the protrusions PA in the example embodiment in FIG. 5B. The second barrier layer 161P may be in contact with the first barrier layer 161 and may be spaced apart from each other in a pair on both sides of the core insulating layer 165S. Example embodiments may correspond to a structure in which the portion of the second barrier layer 162b other than the protrusion PA is not provided. In this case, the first barrier layer 161 and the core insulating layer 165S may be in direct contact with each other.

Example embodiments described with reference to FIGS. 4 and 5A-5C are not necessarily mutually exclusive to one another. For example, some example embodiments may include some features of one of FIGS. 4 and 5A-5C, and may include some features of other ones of FIGS. 4 and 5A-5C.

Figure 6:
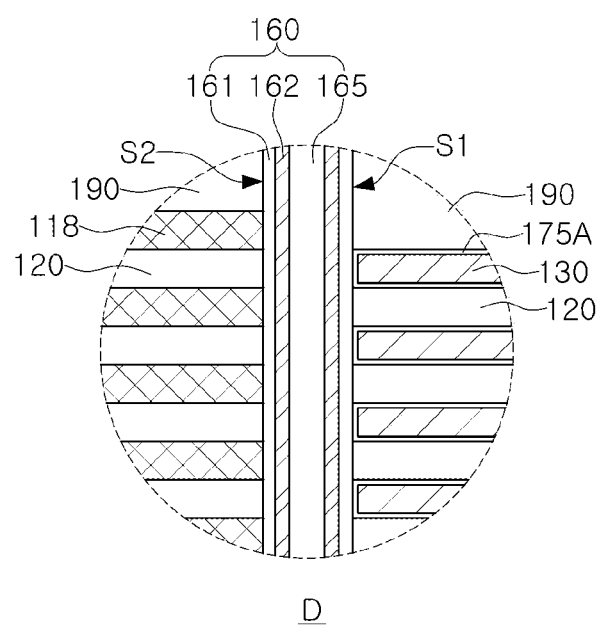

FIG. 6 is an enlarged cross-sectional view illustrating a portion of a semiconductor device according to some example embodiments, illustrating a region corresponding to region "D" in FIG. 3C.

Referring to FIG. 6, in a semiconductor device 100e, a stack structure disposed on an internal side of the barrier structure 160 and a stack structure disposed on an external side of the barrier structure 160 may have a step difference therebetween. The gate electrodes 130 facing the external side surface S1 of the barrier structure 160 and the sacrificial insulating layers 118 facing the internal side surface S2 of the barrier structure 160 may be disposed at different levels. For example, an uppermost gate electrode 130 of the gate electrodes 130 facing the external side surface S1 of the barrier structure 160 and an uppermost sacrificial insulating layer 118 of the sacrificial insulating layers 118 in contact with the internal side surface S2 of the barrier structure 160 may be disposed at different levels.

A vertical thickness of the gate electrodes 130 facing the external side surface S1 of the barrier structure 160 may be smaller than a vertical thickness of the sacrificial insulating layers 118 in contact with the internal side surface S2. Alternatively, a vertical distance between adjacent interlayer insulating layers 120 on the external side surface S1 of the barrier structure 160 may be smaller than a vertical distance between adjacent interlayer insulating layers 120 on the internal side surface S2.

In some example embodiments, a conductive material forming the gate electrodes 130, for example tungsten (W), may be contracted in a vertical direction such that the stack structure of the insulating region IR disposed on the internal side of the barrier structure 160 and the stack structure GS disposed on the external side may have different heights with reference to the barrier structure 160.

Figure 7:
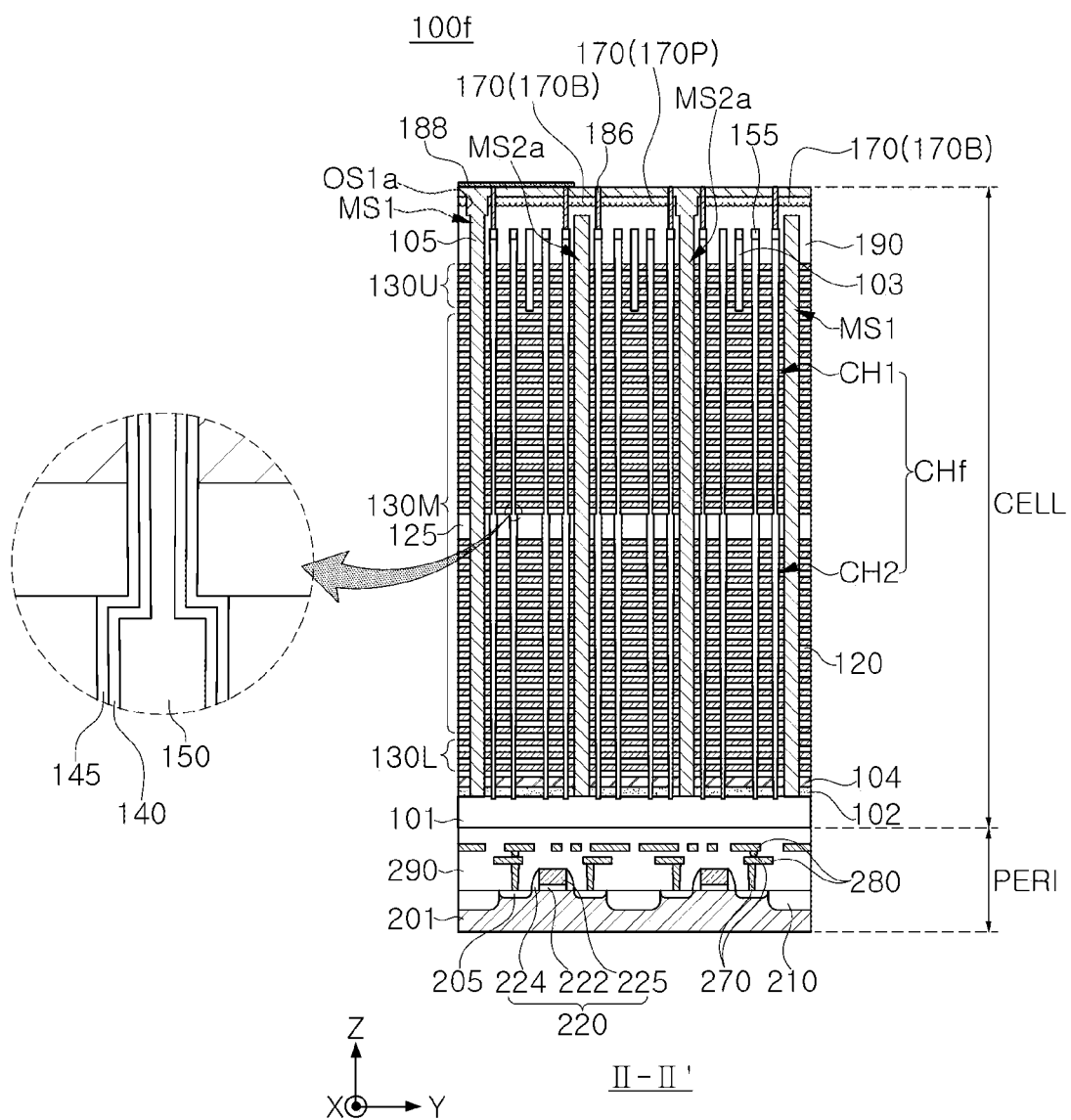
FIG. 7 is a cross-sectional view illustrating a semiconductor device according to some example embodiments of inventive concepts.

FIG. 7 is a cross-sectional view illustrating a semiconductor device according to some example embodiments.

Referring to FIG. 7, in a semiconductor device 100f, a stack structure of gate electrodes 130 may be formed of vertically stacked lower and upper stack structures, and channel structures CHf may include first and second channel structures CH1 and CH2 vertically stacked. The dummy channel structures DCH (see FIG. 2A) may also be disposed in the same shape as that of the channel structures CHf. The channel structures CHf may be configured as above to stably/more stable form the channel structures CHf when the number of the gate electrodes 130 stacked is relatively large.

In the channel structures CHf, the first channel structures CH1 on a lower portion may be connected to the second channel structures CH2 on an upper portion, and the channel structures CHf may have a bent portion formed by a difference in width in the connection region. The channel layer 140, the gate dielectric layer 145, and the core region 150 may be connected to each other between the first channel structure CH1 and the second channel structure CH2. The channel pad 155 may be disposed only on an upper end of the upper second channel structure CH2. In some example embodiments, each of the first channel structure CH1 and the second channel structure CH2 may include a channel pad 155, and in this case, the channel pad of the first channel structure CH1 may be connected to the channel layer 140 of the second channel structure CH2. An upper interlayer insulating layer 125 having a relatively great thickness may be disposed on an uppermost portion of the lower stack structure. The shapes of the interlayer insulating layers 120 and the upper interlayer insulating layer 125 may be varied in some example embodiments. A number of first channel structures CH1 may be the same as, or different from, a number of second channel structures CH2.

In some example embodiments, the number of stack structures stacked in the Z direction and the number of channel structures may be varied.

FIGS. 8A to 19C are plan views illustrating a method of manufacturing a semiconductor device according to some example embodiments.

Figure 8A:
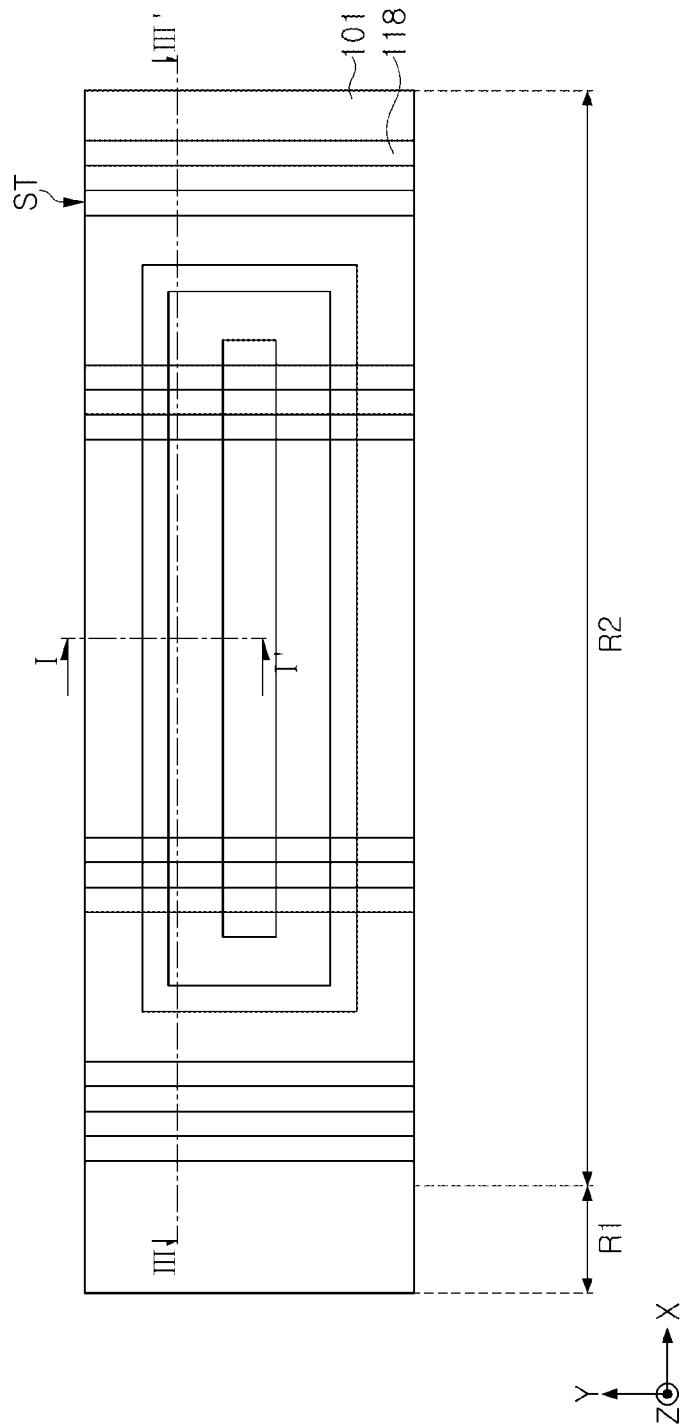
FIGS. 8A to 19C are plan views and cross-sectional views illustrating a method of manufacturing a semiconductor device according to some example embodiments of inventive concepts.
Figure 8B:
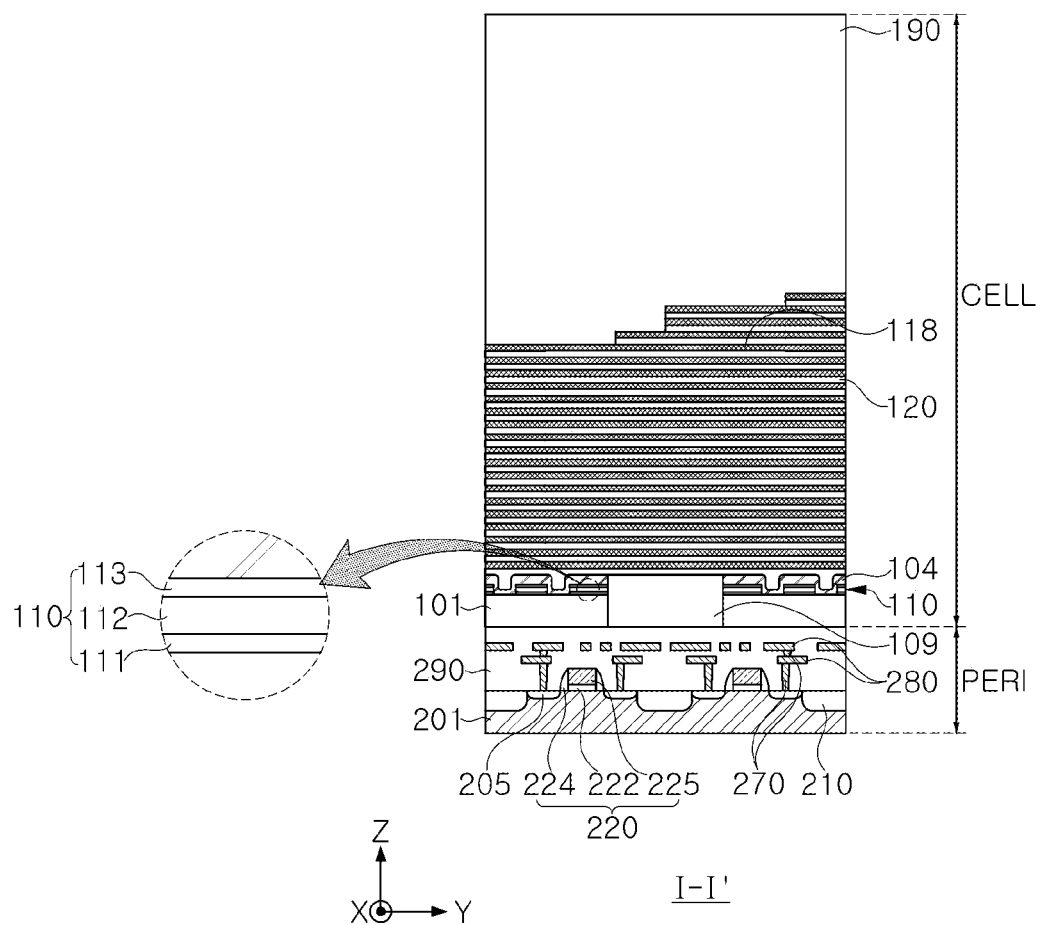
Figure 8C:
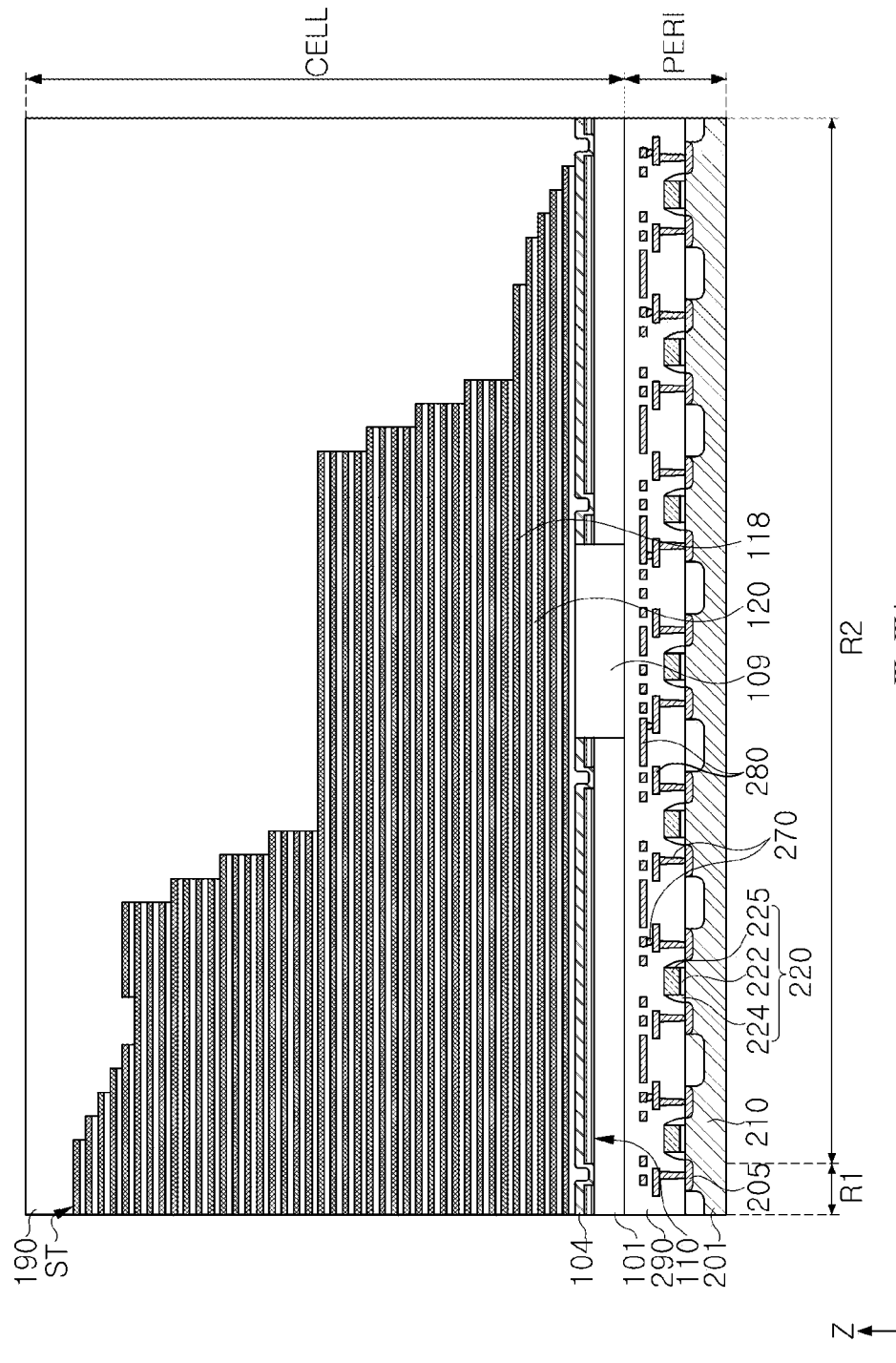

Referring to FIGS. 8A to 8C, a peripheral circuit structure PERI including circuit devices 220 and lower wiring structures may be formed on the first substrate 201, and the second substrate 101 on which the memory cell structure CELL is provided, the horizontal insulating layer 110, the second horizontal conductive layer 104, and the substrate insulating layer 109 may be formed above the peripheral circuit structure PERI, and sacrificial insulating layers 118 and interlayer insulating layers 120 may be alternately stacked.

Device isolation layers 210 may be formed in the first substrate 201, and a circuit gate dielectric layer 222 and a circuit gate electrode 225 may be formed in order on the first substrate 201. The device isolation layers 210 may be formed by, for example, a shallow trench isolation (STI) process and/or a spin-on glass (SOG) process. The circuit gate dielectric layer 222 and the circuit gate electrode 225 may be formed using thermal oxidation and/or atomic layer deposition (ALD) and/or chemical vapor deposition (CVD). The circuit gate dielectric layer 222 may be formed of silicon oxide, and the circuit gate electrode 225 may be formed of at least one of doped or undoped polysilicon or metal silicide layers, but some example embodiments thereof is not limited thereto. Thereafter, a spacer layer 224 and source/drain regions 205 may be formed on both sidewalls of the circuit gate dielectric layer 222 and the circuit gate electrode 225. In some example embodiments, the spacer layer 224 may be formed of a plurality of layers. An ion implantation process such as a beamline ion implantation process and/or a plasma assisted doping ion implantation process may be performed to form the source/drain regions 205.

The circuit contact plugs 270 of the lower wiring structures may be formed by partially forming the peripheral region insulating layer 290, removing a portion thereof by etching, and burying a conductive material. The circuit wiring lines 280 may be formed by depositing a conductive material and patterning the conductive material.

The peripheral region insulating layer 290 may be formed of a plurality of insulating layers. The peripheral region insulating layer 290 may be partially formed in each of processes of forming the lower wiring structures and may be partially formed above the circuit wiring line 280, thereby covering the circuit devices 220 and the lower wiring structures.

The second substrate 101 may be formed on the peripheral region insulating layer 290. The second substrate 101 may be formed of, for example, polycrystalline silicon, and may be formed by a CVD process such as a plasma enhanced CVD (PECVD) process. Polycrystalline silicon forming the second substrate 101 may include impurities such as at least one of boron, phosphorus, or arsenic.

First to third horizontal insulating layers 111, 112, and 113 forming the horizontal insulating layer 110 may be stacked in order on the second substrate 101. The horizontal insulating layer 110 may be partially replaced with the first horizontal conductive layer 102 in FIG. 2B through a subsequent process. The first and third horizontal insulating layers 111 and 113 may include, e.g. may consist of, a material different from a material of the second horizontal insulating layer 112. For example, the first and third horizontal insulating layers 111 and 113 may be formed of the same material as a material of the interlayer insulating layers 120, and the second horizontal insulating layer 112 may be formed of the same material as a material of the sacrificial insulating layers 118. The horizontal insulating layer 110 may be removed by a patterning process in partial regions.

The second horizontal conductive layer 104 may be formed on the horizontal insulating layer 110 and may be in contact with the second substrate 101 in a region from which the horizontal insulating layer 110 is removed. Accordingly, the second horizontal conductive layer 104 may be bent along ends of the horizontal insulating layer 110, may cover the ends and may extend onto the second substrate 101.

The substrate insulating layer 109 may be formed by partially removing the second substrate 101, the horizontal insulating layer 110, and the second horizontal conductive layer 104 from the region corresponding to the through wiring region TR (see FIG. 3A) and filling an insulating material. The substrate insulating layer 109 may be formed throughout the entire region of the through wiring region TR, or may be formed in a region smaller than the entire region. After the insulating material is applied, a planarization process may be further performed using a chemical mechanical polishing (CMP) process and/or an etch back process. Accordingly, the upper surface of the substrate insulating layer 109 may be substantially coplanar with the upper surface of the second horizontal conductive layer 104.

The sacrificial insulating layers 118 may be partially replaced with gate electrodes 130 (see FIG. 3A) through a subsequent process. The sacrificial insulating layers 118 may be formed of a material different from a material of the interlayer insulating layers 120, and may be formed of a material etched with etch selectivity with respect to the interlayer insulating layers 120 under specific etching conditions. For example, the interlayer insulating layer 120 may be formed of at least one of silicon oxide and silicon nitride, and the sacrificial insulating layers 118 may be formed of a material selected from among or consisting of silicon, silicon oxide, silicon carbide, and silicon nitride, different from the material of the interlayer insulating layer 120. In some example embodiments, the interlayer insulating layers 120 may not have the same thickness. The thickness of the interlayer insulating layers 120 and the sacrificial insulating layers 118 and the number of layers forming the interlayer insulating layers 120 and the sacrificial insulating layers 118 may be varied from the example illustrated in the views.

A capping insulating layer 190 covering an upper portion of the stack structure of the sacrificial insulating layers 118 and the interlayer insulating layers 120 may be formed.

Figure 9A:
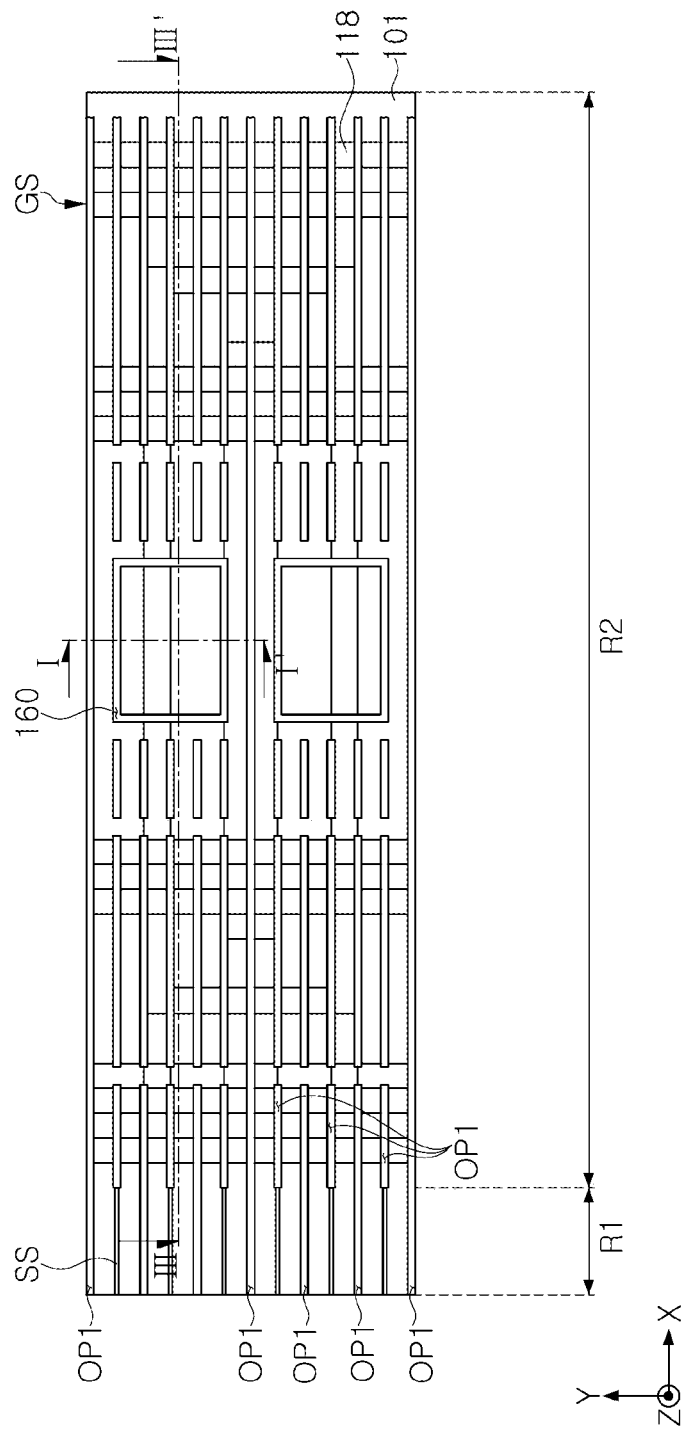
Figure 9B:
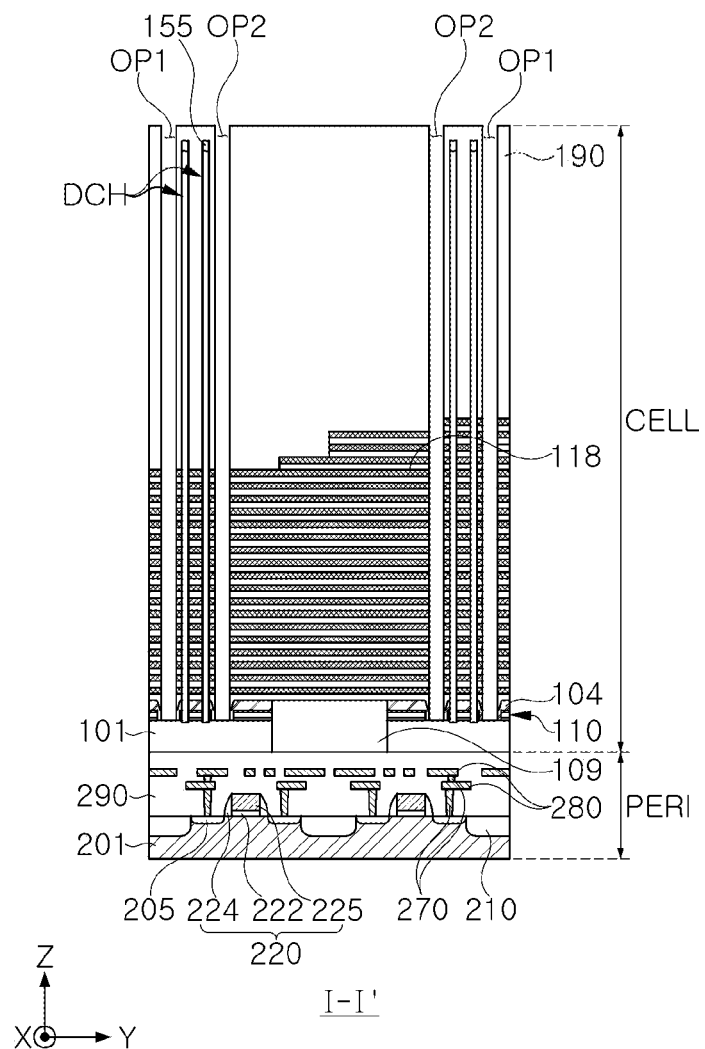
Figure 9C:
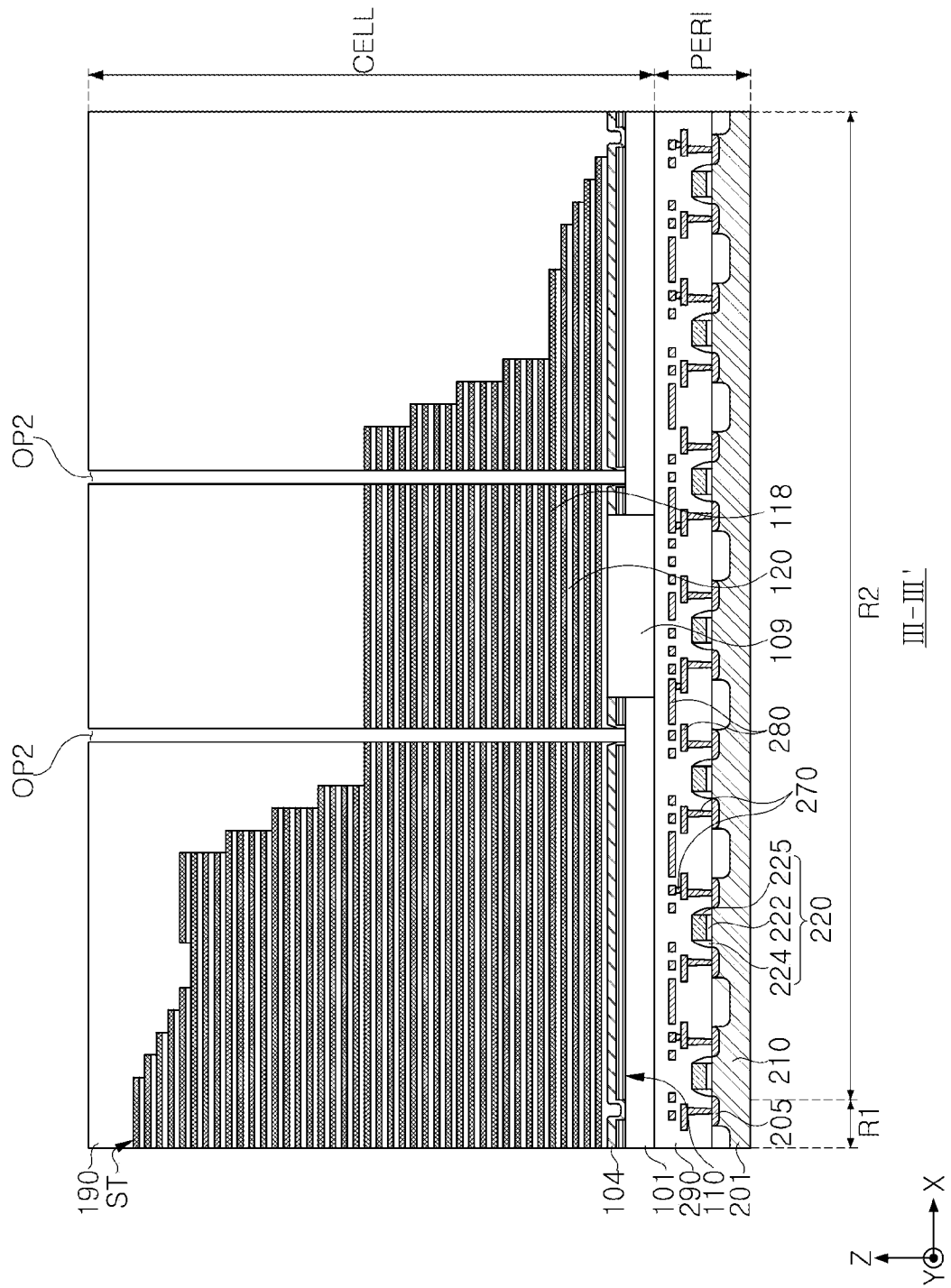
Figure 10A:
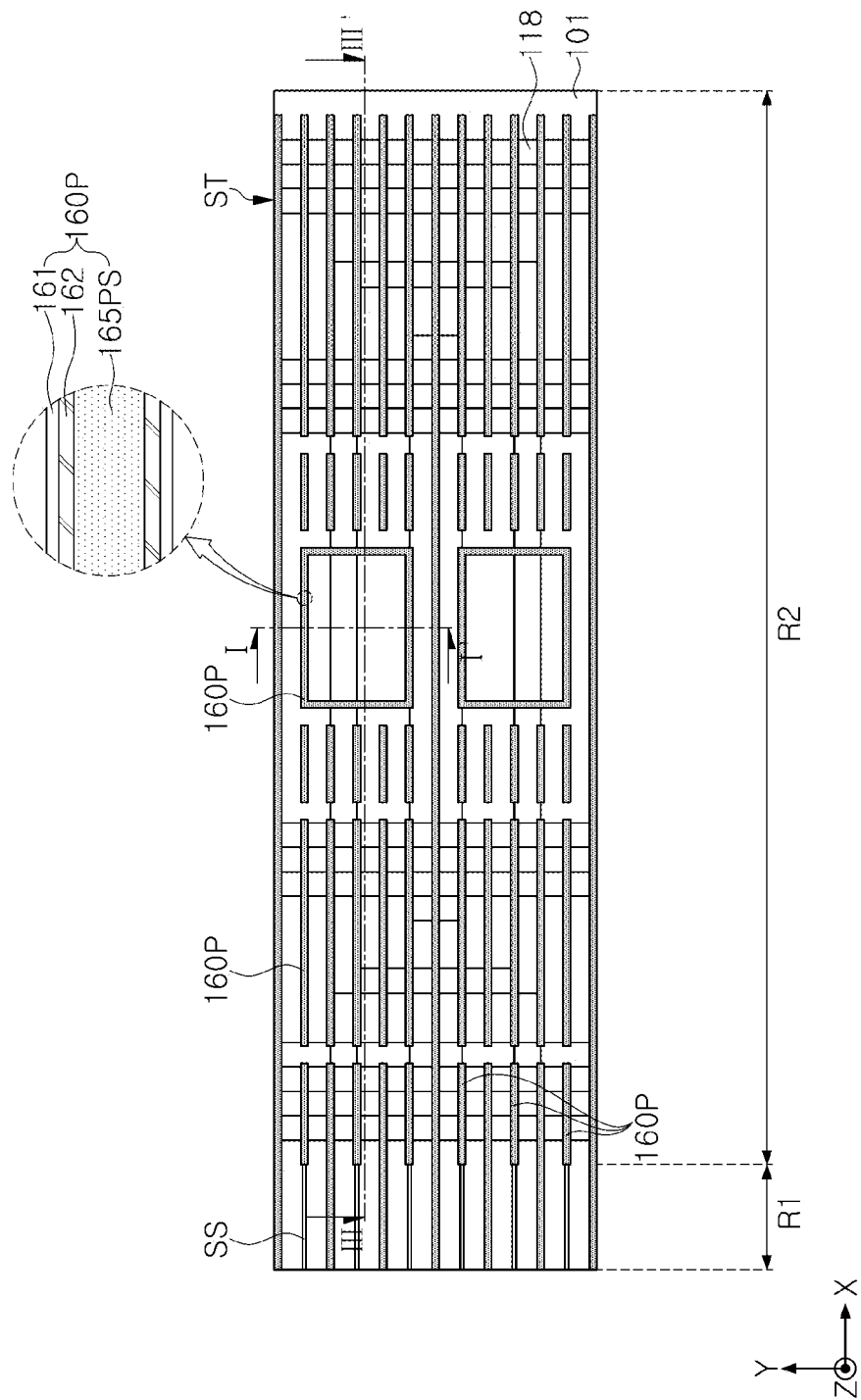
Figure 10B:
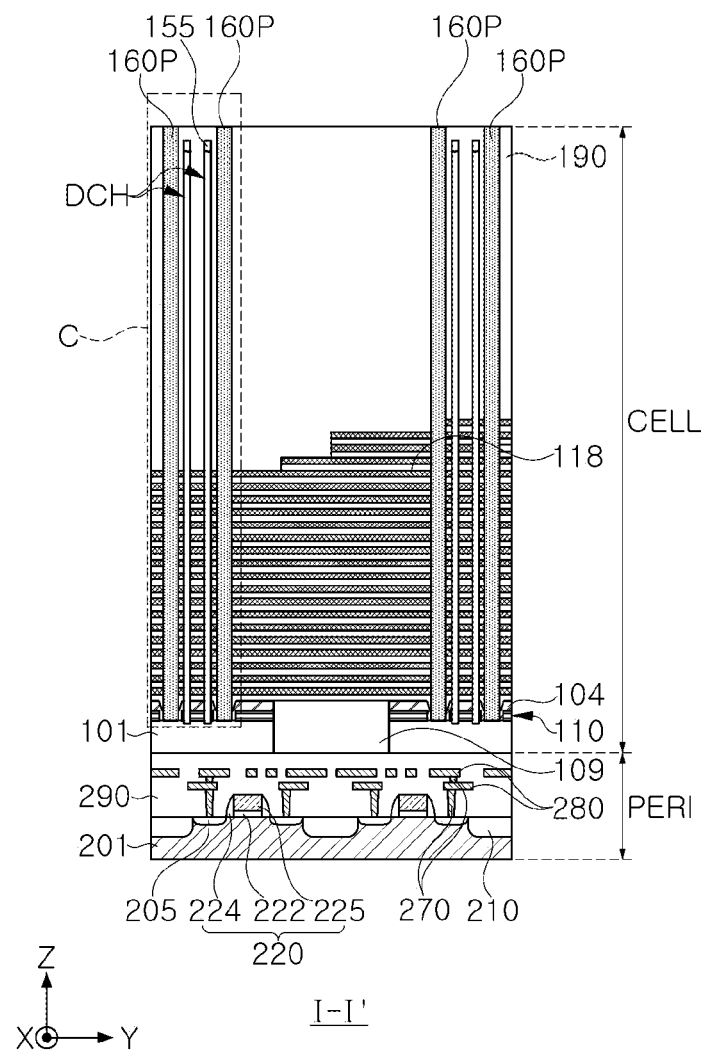
Figure 10C:
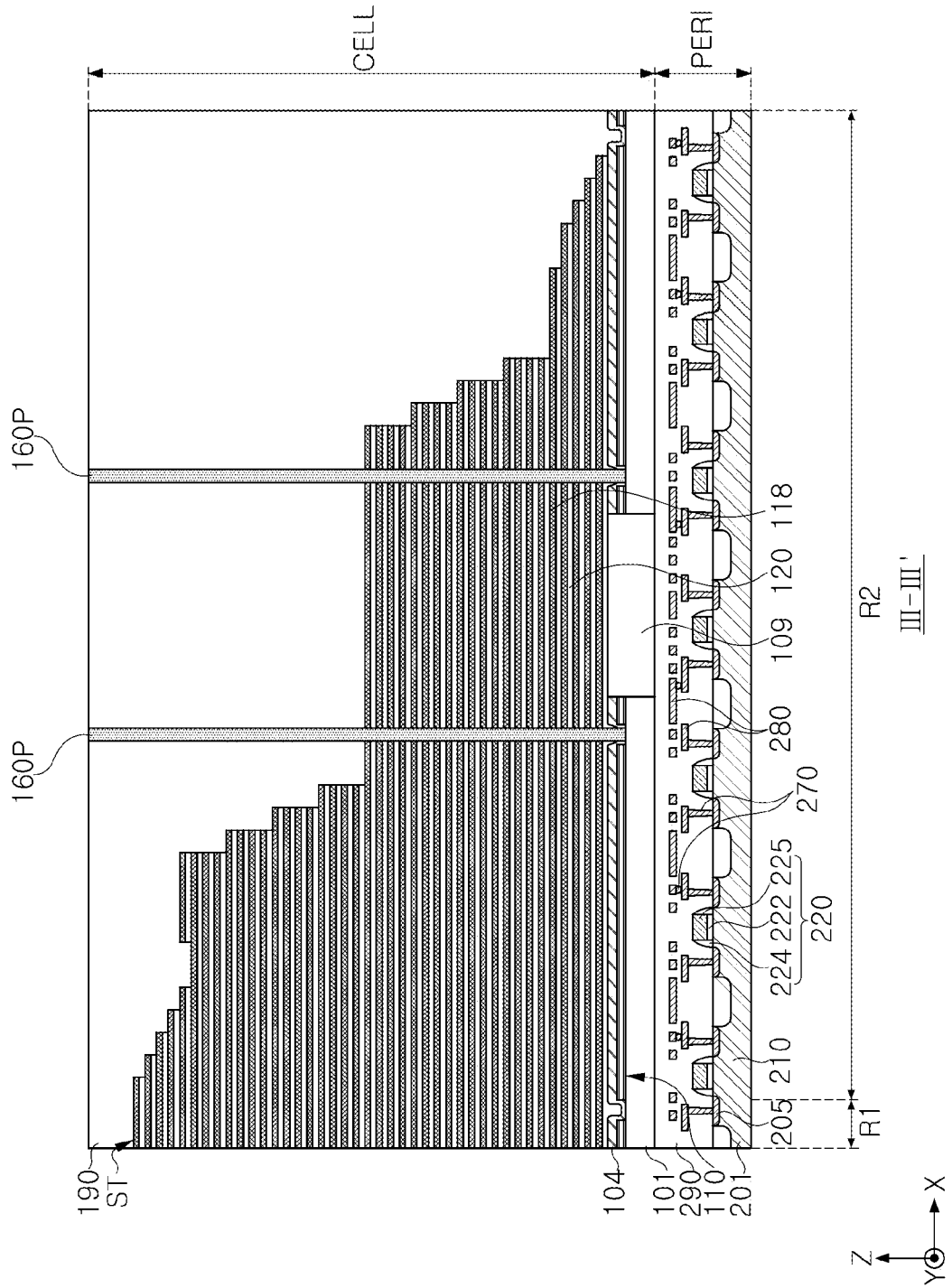
Figure 10D:
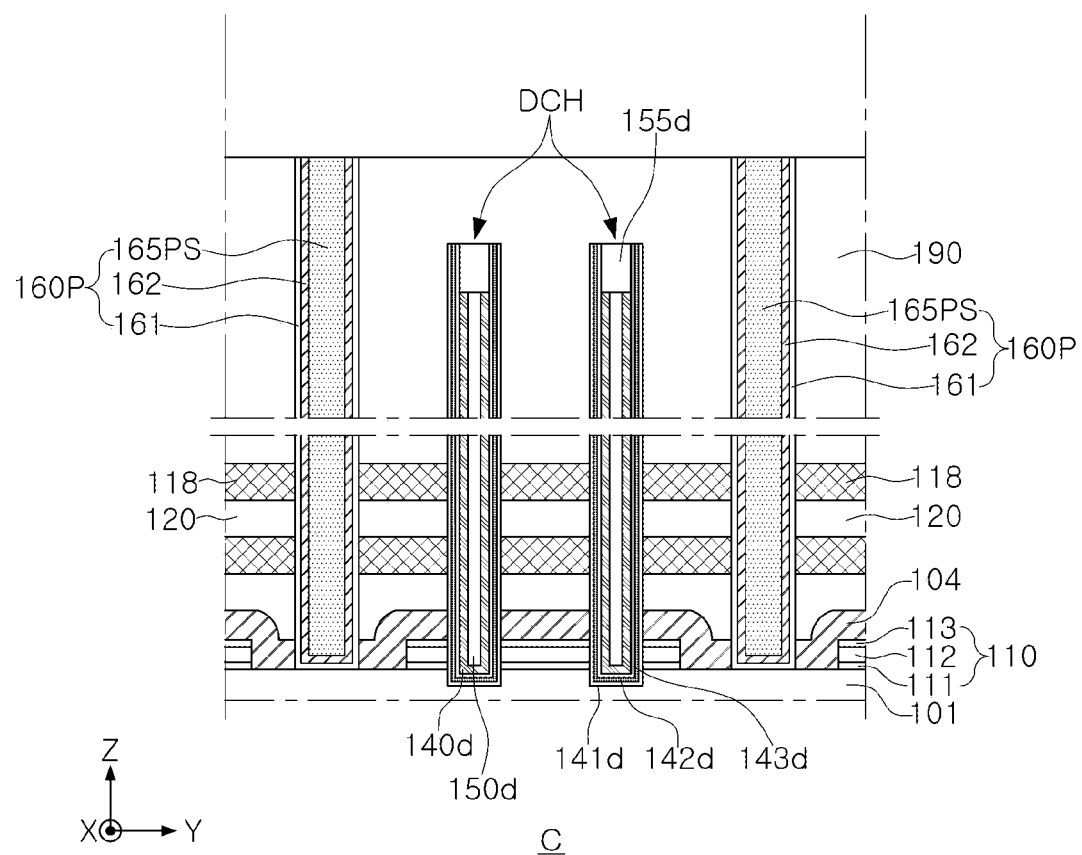

Referring to FIGS. 9A to 9C, channel structures CH (see FIG. 2B) and dummy channel structures DCH penetrating the stack structure of the sacrificial insulating layers 118 and the interlayer insulating layers 120 may be formed, and openings OP1 and OP2 penetrating the stack structure may be formed.

The upper isolation region SS may be formed by removing a portion of the sacrificial insulating layers 118 and the interlayer insulating layers 120. The upper isolation region SS may be formed by exposing a region in which the upper isolation region SS using a mask layer, removing the specific (or, alternatively, predetermined) number of the sacrificial insulating layers 118 and the interlayer insulating layers 120 from an uppermost portion, and filling an insulating material. The upper isolation region SS may extend downwardly in the Z direction further than the region in which the upper gate electrodes 130U in FIG. 3B are formed.

The channel structures CH and the dummy channel structures DCH may be formed by anisotropically etching (e.g. using a dry etching) the sacrificial insulating layers 118, the interlayer insulating layers 120, and the horizontal insulating layer 110, and may be formed by forming hole-shaped channel holes and filling the holes. In some example embodiments, the dummy channel structures DCH may be formed to have a size/diameter larger than that of the channel structures CH. Due to the height of the stack structure, sidewalls of the channel holes may not be perpendicular to the upper surface of the second substrate 101. The channel holes may be formed to be recessed into a portion of the second substrate 101.

The first openings OP1 of the openings OP1 and OP2 may be disposed in the positions of the first and second isolation regions MS1, MS2a and MS2b in FIG. 1A, and the second opening OP2 may be disposed in the position of the barrier structure 160 in FIG. 1A. Before the openings OP1 and OP2 are formed, the capping insulating layer 190 may be further formed on the channel structures CH and the dummy channel structures DCH. The openings OP1 and OP2 may be formed by forming a mask layer using a photolithography process and anisotropic-etching the stack structure. The first openings OP1 may be formed in a trench shape extending in the X direction, and the second openings OP2 may be formed in a quadrangular ring such as a square ring or a shape similar thereto.

Referring to FIGS. 10A to 10D, after the first horizontal conductive layer 102 is formed, the first barrier layer 161, the second barrier layer 162, and the sacrificial core layer 165PS may be stacked in the openings OP1 and OP2, thereby forming a preliminary barrier structure 160P.

By performing an etch back process while sacrificial spacer layers are formed in the first openings OP1, the second horizontal insulating layer 112 may be exposed in the first region R1 as in FIG. 3B. The second horizontal insulating layer 112 may be selectively removed from the exposed region, and the first and third horizontal insulating layers 111 and 113 disposed above and below the second horizontal insulating layer 112 may be removed.

The first to third horizontal insulating layers 111, 112, and 113 may be removed by, for example, a wet etching process using a chemical such as an acid and/or a base, such as buffered hydrogen fluoride. During the process of removing the first and third horizontal insulating layers 111 and 113, a portion of the gate dielectric layer 145 exposed in the region from which the second horizontal insulating layer 112 is removed may also be removed. The first horizontal conductive layer 102 may be formed by depositing a conductive material in the region from which the first to third horizontal insulating layers 111, 112, and 113 are removed, and the sacrificial spacer layers may be removed from the openings. By this process, the first horizontal conductive layer 102 may be formed in the first region A.

The first and second barrier layers 161 and 162, and the sacrificial core layer 165PS may be formed in order from internal side surfaces and bottom surfaces of the openings OP1 and OP2. The first and second barrier layers 161 and 162 may be formed to have a relatively reduced thickness as compared to that of the sacrificial core layer 165PS. The first and second barrier layers 161 and 162 may include, e.g. may consist of, different materials. The sacrificial core layer 165PS may include a material different from a material of the second barrier layer 162. For example, the first barrier layer 161 may include a material different from a material of the sacrificial insulating layers 118 to have etch selectivity for the sacrificial insulating layers 118. The sacrificial core layer 165PS formed in the second openings OP2 may be replaced with the core insulating layer 165 (see FIG. 4) through a subsequent process.

In this process, after the second barrier layer 162 is formed, a third barrier layer covering a portion of an upper portion of the internal side surfaces of the second barrier layer 162 may further be formed such that the second barrier layer 162 may have protrusions PA as in FIG. 5B. By further performing an etch back process, a portion of the third barrier layer may be removed to form the protrusions PA. Accordingly, the semiconductor devices in the some example embodiments in FIGS. 5B to 5D may be manufactured/fabricated.

Figure 11A:
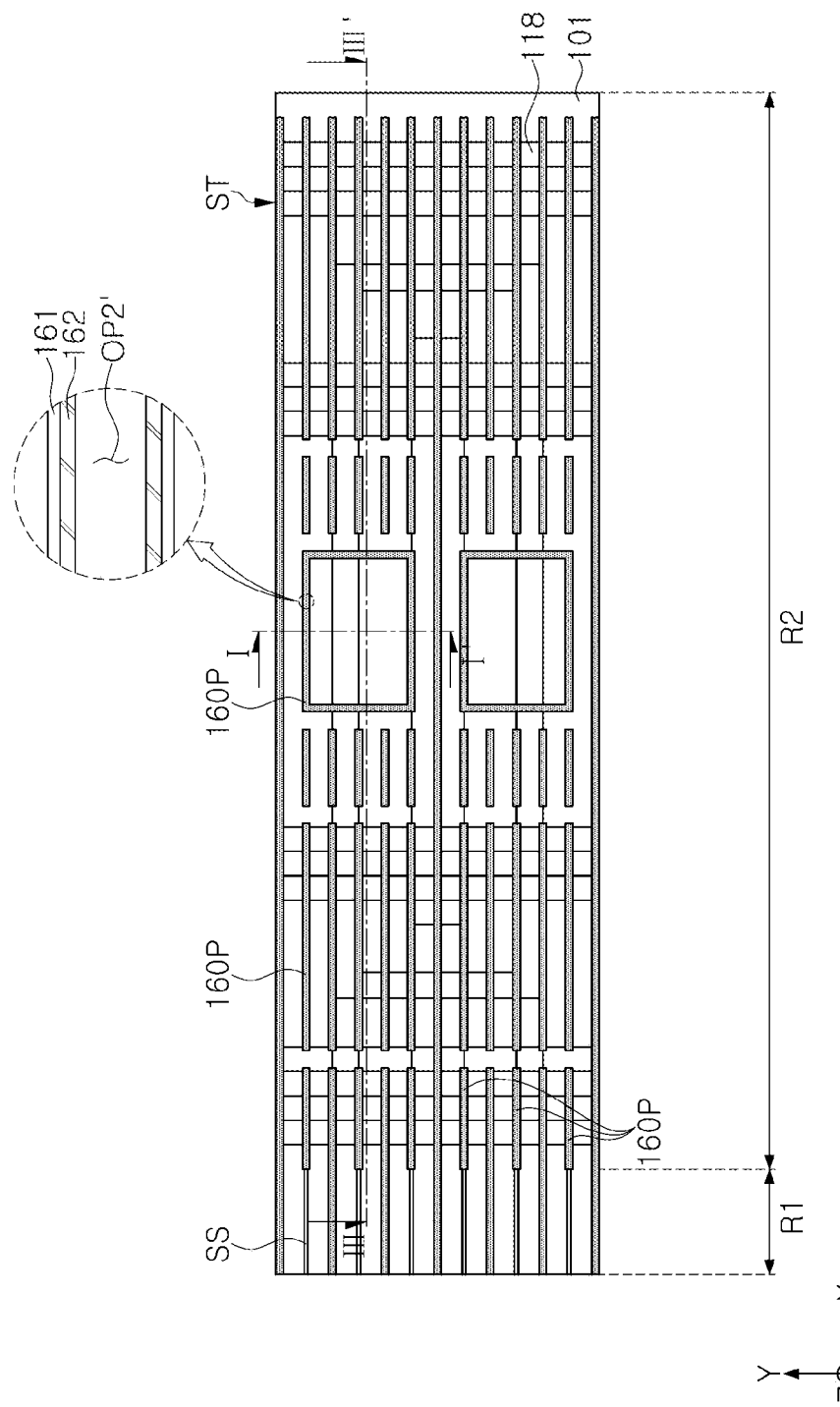
Figure 11B:
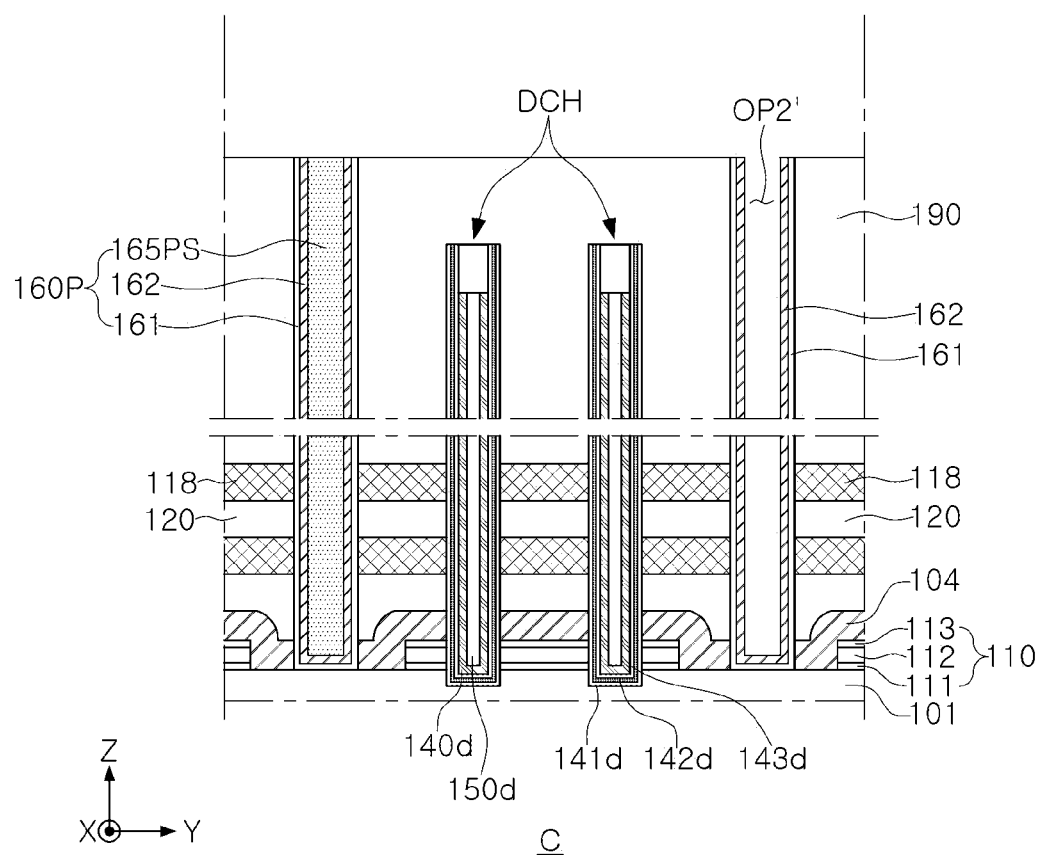

Referring to FIGS. 11A and 11B, the sacrificial core layer 165PS of the preliminary barrier structure 160P formed in the second openings OP2 may be removed.

Using a photolithography process, a mask layer may be formed to cover the upper regions of the first openings OP1, and the sacrificial core layer 165PS of the preliminary barrier structure 160P may be selectively removed from the second openings OP2. The sacrificial core layer 165PS may be removed from the second openings OP2 to form a portion OP2' of the second openings OP2 again.

Referring to FIGS. 12A and 12B, the core insulating layer 165 may be formed in the region of the second openings OP2 from which the sacrificial core layer 165PS is removed. A support layer may be formed above the stack structure of the sacrificial insulating layers 118 and the interlayer insulating layers 120, and through regions OS1a, OS1b, and OS2 penetrating the support layer may be formed, thereby forming the support structure 170.

The core insulating layer 165 may be formed by filling an insulating material in the region of the second openings OP2 from which the sacrificial core layer 165PS is removed. The core insulating layer 165 may include a material different from a material of the sacrificial core insulating layer 165PS to have etch selectivity for the sacrificial core insulating layer 165PS. For example, the core insulating layer 165 may be formed of silicon oxide. After the insulating material is filled, a planarization process such as a CMP process and/or an etch back process may be further performed. Accordingly, the barrier structure 160 including the first barrier layer 161, the second barrier layer 162, and the core insulating layer 165 may be formed.

The first through regions OS1a and OS1b among the through regions OS1a, OS1b, and OS2 may be disposed in the positions corresponding to the upper portions of the first and second isolation regions MS1, MS2a, MS2b in FIG. 1A, and the second through regions OS2 may be formed in the position corresponding to the upper portion of the barrier structure 160 in FIG. 1A. Before the through regions OS1a, OS1b, and OS2 are formed, a capping insulating layer 190 may be further formed on the first and second isolation regions MS1, MS2a, and MS2b and the preliminary barrier structure 160P. The through regions OS1a, OS1b, and OS2 may be formed by forming a mask layer using a photolithography process and etching the support layer. In the process of etching the support layer, the capping insulating layer 190 may also be partially etched. The first through regions OS1a and OS1b may be formed in a trench shape extending in the X direction, and the second through regions OS2 may be formed in a quadrangular ring or a shape similar thereto. By forming the first and second through regions OS1a, OS1b, and OS2, the support structure 170 including the support patterns 170P and 170PH and the bridge patterns 170B may be formed. The support layer may be formed of at least one of silicon oxide, silicon nitride, silicon oxynitride, or tetraethyl orthosilicate (TEOS). In some example embodiments, depths of the first and second through regions OS1a, OS1b, and OS2 may be varied. For example, the first and second through regions OS1a, OS1b, and OS2 may be formed more deeply than the illustrated example, such that the lower ends thereof may be disposed at a level lower than the upper surface of the dummy channel structure DCH. For example, the first and second through regions OS1a, OS1b, and OS2 may be formed to have a thickness less than the illustrated example, such that the lower ends thereof may be disposed at substantially the same level as a level of the lower surfaces of the support patterns 170P and 170PH.

Referring now to FIGS. 13A to 13D, the preliminary barrier structure 160P formed in the first openings OP1 may be removed through the first through regions OS1a and OS1b.

After the sacrificial core layer 165PS of the preliminary barrier structure 160P is removed from the first openings OP1, the first and second barrier layers 161 and 162 may be removed to form the first openings OP1 again. Since the preliminary barrier structure 160P in the first openings OP1 is removed, side surfaces of the sacrificial insulating layers 118 may be exposed to the first openings OP1.

Referring to FIGS. 14A to 14D, tunnel portions TL may be formed by partially removing the sacrificial insulating layers 118 through the first through regions OS1a and OS1b and the first openings OP1.

The sacrificial insulating layers 118 may be removed from the external side of the through wiring region TR (see FIG. 2A). The sacrificial insulating layers 118 may remain in the through wiring region TR and may form the insulating region IR of the through wiring region TR along with the interlayer insulating layers 120 and the substrate insulating layer 109. The sacrificial insulating layers 118 may be selectively removed with respect to the interlayer insulating layers 120, the second horizontal conductive layer 104, the substrate insulating layer 109, and the barrier structure 160 using wet etching, for example. Accordingly, a plurality of tunnel portions TL may be formed between the interlayer insulating layers 120.

The region in which the through wiring region TR is formed may be spaced apart from the first openings OP1, such that the etchant such as a chemical wet etchant may not reach the region, and accordingly, the sacrificial insulating layers 118 may remain. Accordingly, the through wiring region TR may be formed in a center of the first and second isolation regions MS1, MS2a, and MS2b between the adjacent first and second isolation regions MS1, MS2a, and MS2b. Alternatively or additionally, since the inflow of the etchant is blocked by the barrier structure 160, a region from which the sacrificial insulating layers 118 are removed may be more accurately controlled. The region in which the sacrificial insulating layers 118 remain may not coincide with the region in which the substrate insulating layer 109 is disposed, but some example embodiments thereof is not limited thereto.

Figure 15:
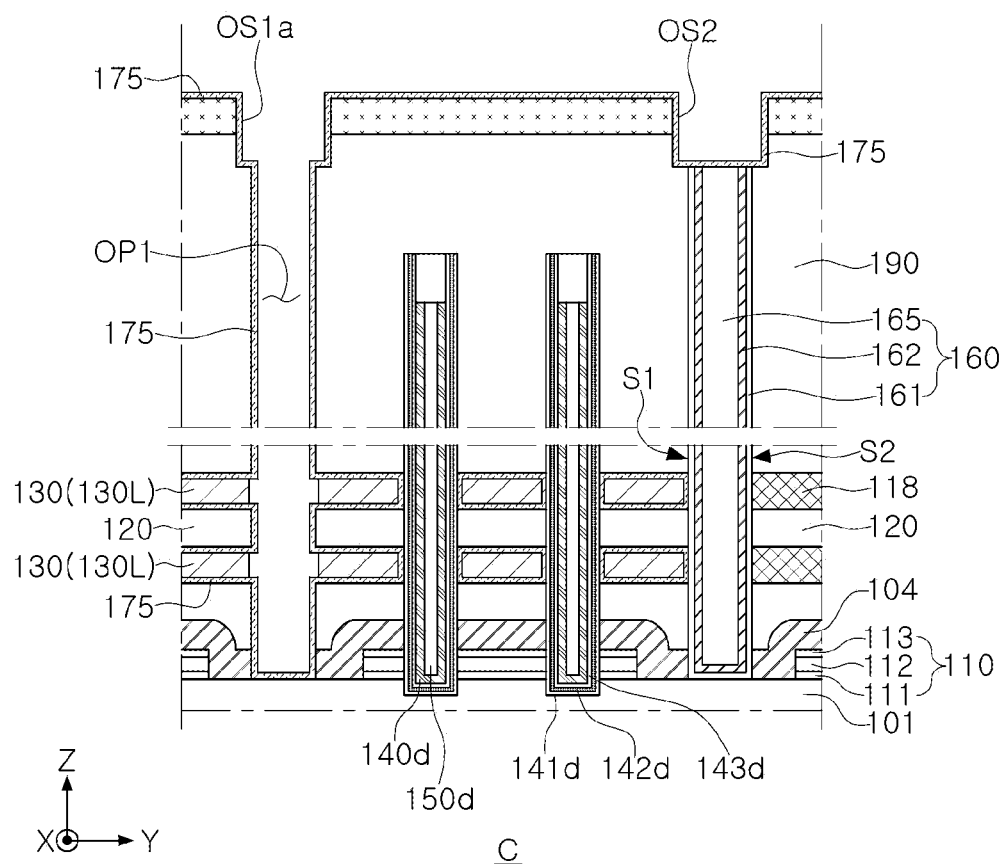

Referring to FIG. 15, the metal oxide layer 175 may be formed in the tunnel portions TL through the first through regions OS1a and OS1b and the first openings OP1, and a conductive material may be applied, thereby forming the gate electrodes 130. The metal oxide layer 175 may also be formed in the second through region OP.

The metal oxide layer 175 may conformally cover internal walls of the tunnel portions TL. The metal oxide layer 175 may be formed to cover the internal walls of the tunnel portions TL and to extend in the z direction along side surfaces of the first openings OP1. The metal oxide layer 175 may extend to cover side surfaces of the first through regions OS1a and OS1b and the second through region OS2 and to cover the upper surfaces of the support patterns 170P. The metal oxide layer 175 may be formed to extend in the z direction along side surfaces of the second through region OS and may cover the upper surface of the barrier structure 160. In some example embodiments, the metal oxide layer 175 may be formed of a plurality of layers. In some example embodiments, the process of forming the metal oxide layer 175 may not be performed. Through a subsequent process, the metal oxide layer 175 formed on the second through regions OS2 may have a thickness greater than a thickness of the metal oxide layer 175 formed on the first through regions OS1.

At least one surface of the gate electrodes 130 may be covered by the metal oxide layer 175 in the tunnel portions TL. The metal oxide layer 175 covering at least one surface of the gate electrodes 130 may be referred to as a "blocking layer". The conductive material forming the gate electrodes 130 may fill the tunnel portions TL. The conductive material may include at least one of a metal, doped or undoped polycrystalline silicon, or a metal silicide material. The barrier structure 160 may prevent or reduce the likelihood of the conductive material from flowing into the through wiring region TR when the gate electrodes 130 are formed. After the gate electrodes 130 are formed, the conductive material deposited in the first openings OP1 may be removed through an additional process. Accordingly, the side surfaces of the gate electrodes 130 exposed through the first openings OP1 may be recessed inwardly further than the side surfaces of the first openings OP1.

Figure 16:
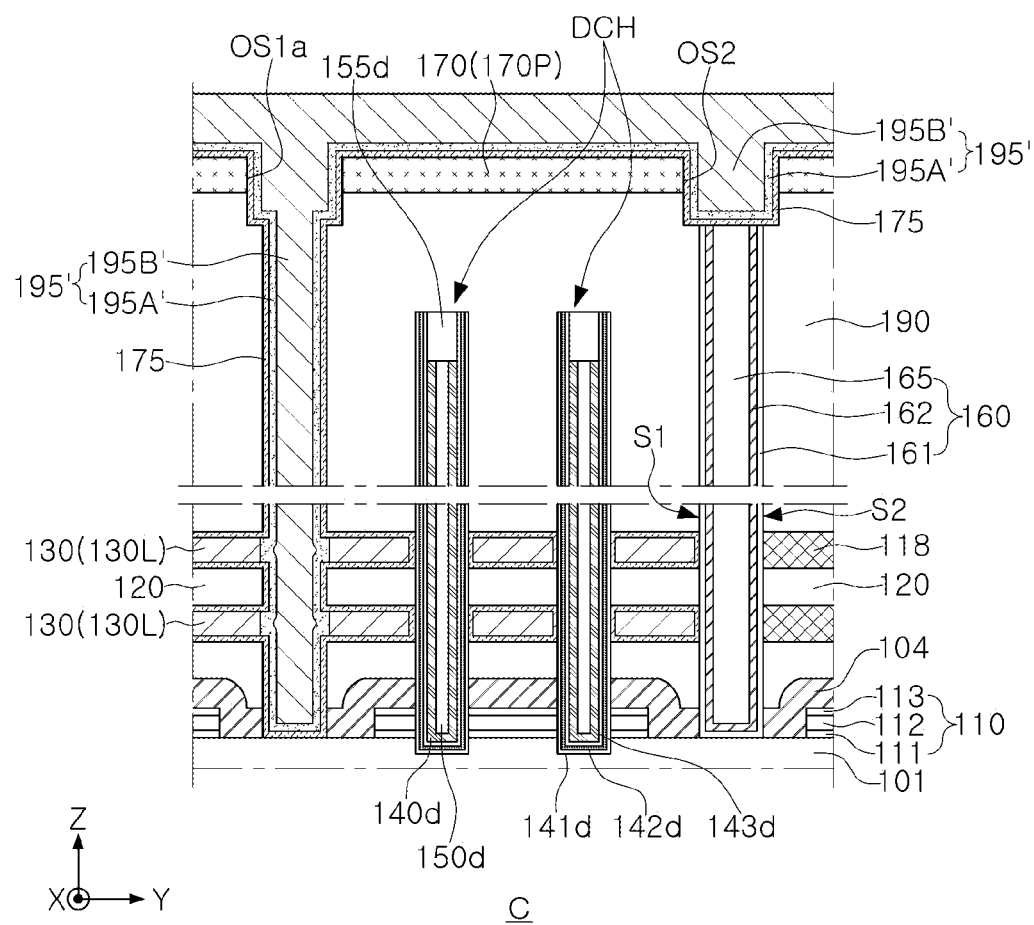

Referring to FIG. 16, an insulating layer 195' may be formed to fill the first through regions OS1a and OS1b, the second through region OS2, and the first openings OP1.

The insulating layer 195' may cover the metal oxide layer 175. The insulating layer 195' may include a first insulating layer 195A' and a second insulating layer 195B' on the first insulating layer 195A'. The first insulating layer 195A' may be conformally formed on the metal oxide layer 175 covering internal side surfaces of the first openings OP1, the first through regions OS1a and OS1b, and the second through region OS2. The first insulating layer 195A' may be formed by performing an atomic layer deposition (ALD) process. An interfacial surface between the first insulating layer 195A' and the second insulating layer 195B' of the insulating layer 195' may or may not be distinct. However, since the insulating layer 195' includes a material different from that of the metal oxide layer 175, an interfacial surface between the insulating layer 195' and the metal oxide layer 175 may be distinct. An interfacial surface of the metal oxide layer 175 with the support patterns 170P and the capping insulating layer 190 may also be distinct.

Figure 17:
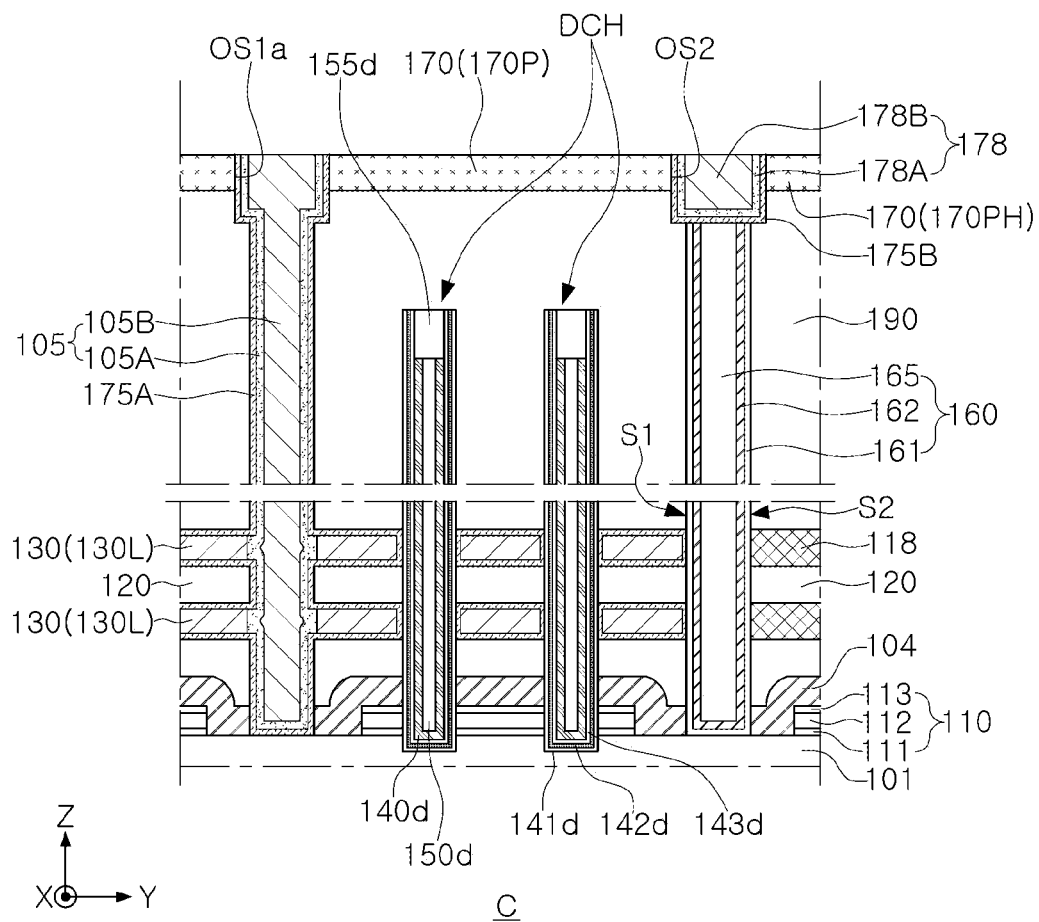
Figure 18:
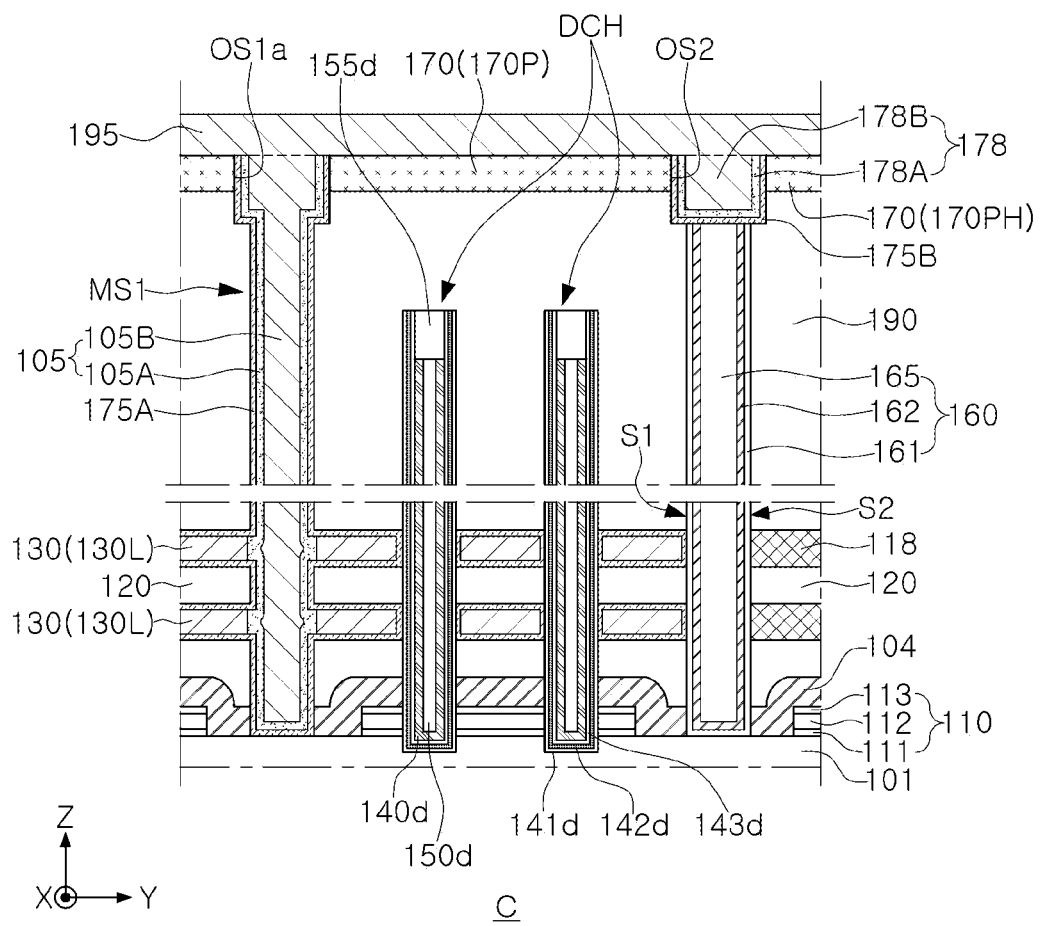

Referring to FIGS. 17 and 18, a planarization process such as a CMP process and/or an etch back process may be performed to expose the upper surface of the supporting insulating layer 170P.

The insulating layer 195' may be partially removed by performing the planarization process. A portion of the metal oxide layer 175 and the first insulating layer 195A' formed on the support patterns 170P may be partially removed by the planarization process, or portions of the metal oxide layer 175 and the first insulating layer 195A' formed on the support patterns 170P may be partially removed by the etch back process performed after the planarization process. Thereafter, an upper insulating layer 195 may be further formed. Accordingly, the first metal oxide layer 175A may be formed in the first through regions OS1a and OS1b, the first openings OP1, and the tunnel portions TL, and the isolation insulating layer 105 may be formed on the first through regions OS1a and OS1b and the first openings OP1. The second metal oxide layer 175B and the through insulating layer 178 may be formed in the second through region OS2. In some example embodiments, the etch back process may not be performed in this process.

Figure 19A:
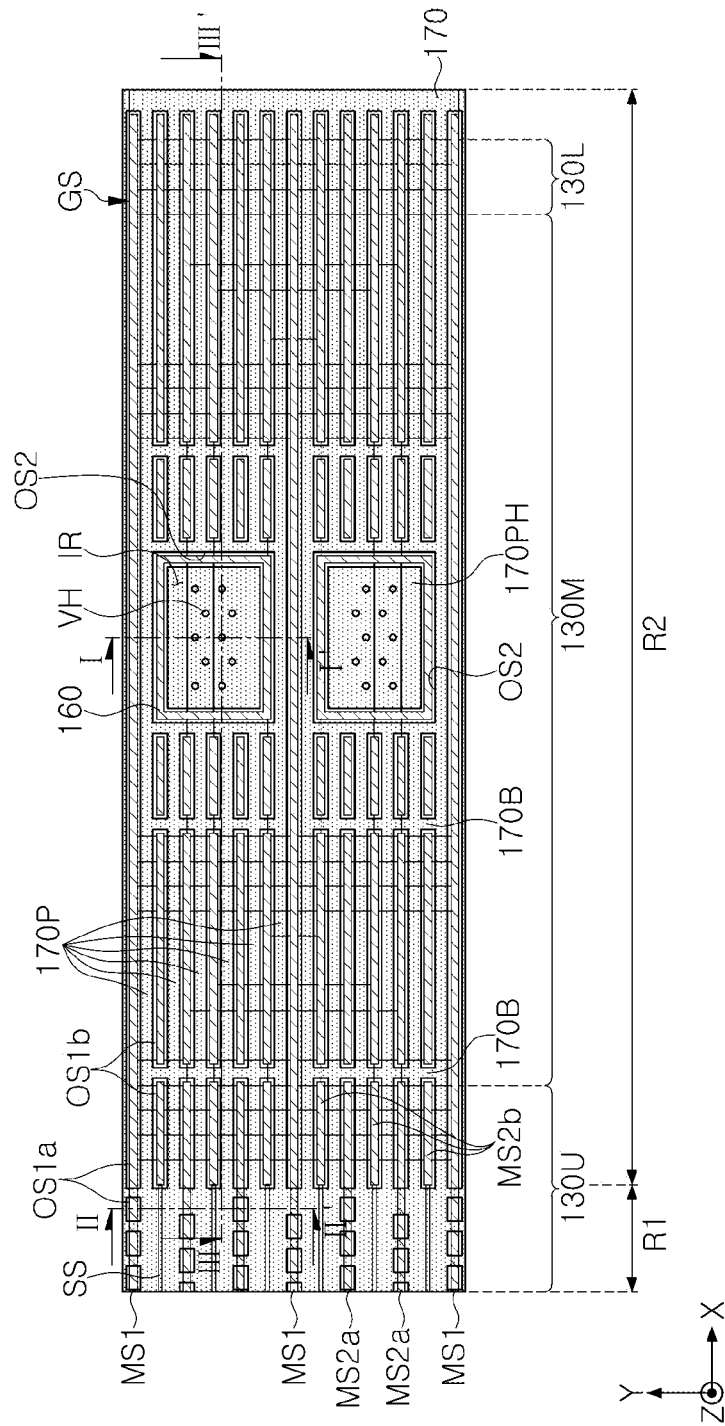
Figure 19B:
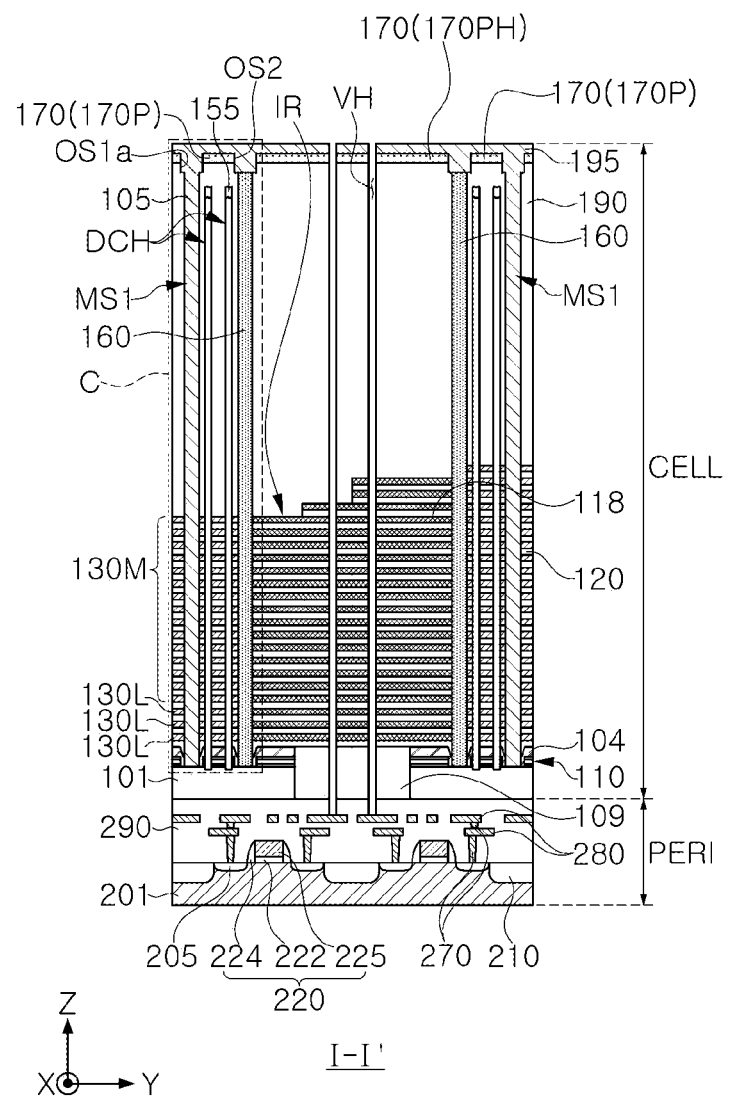
Figure 19C:
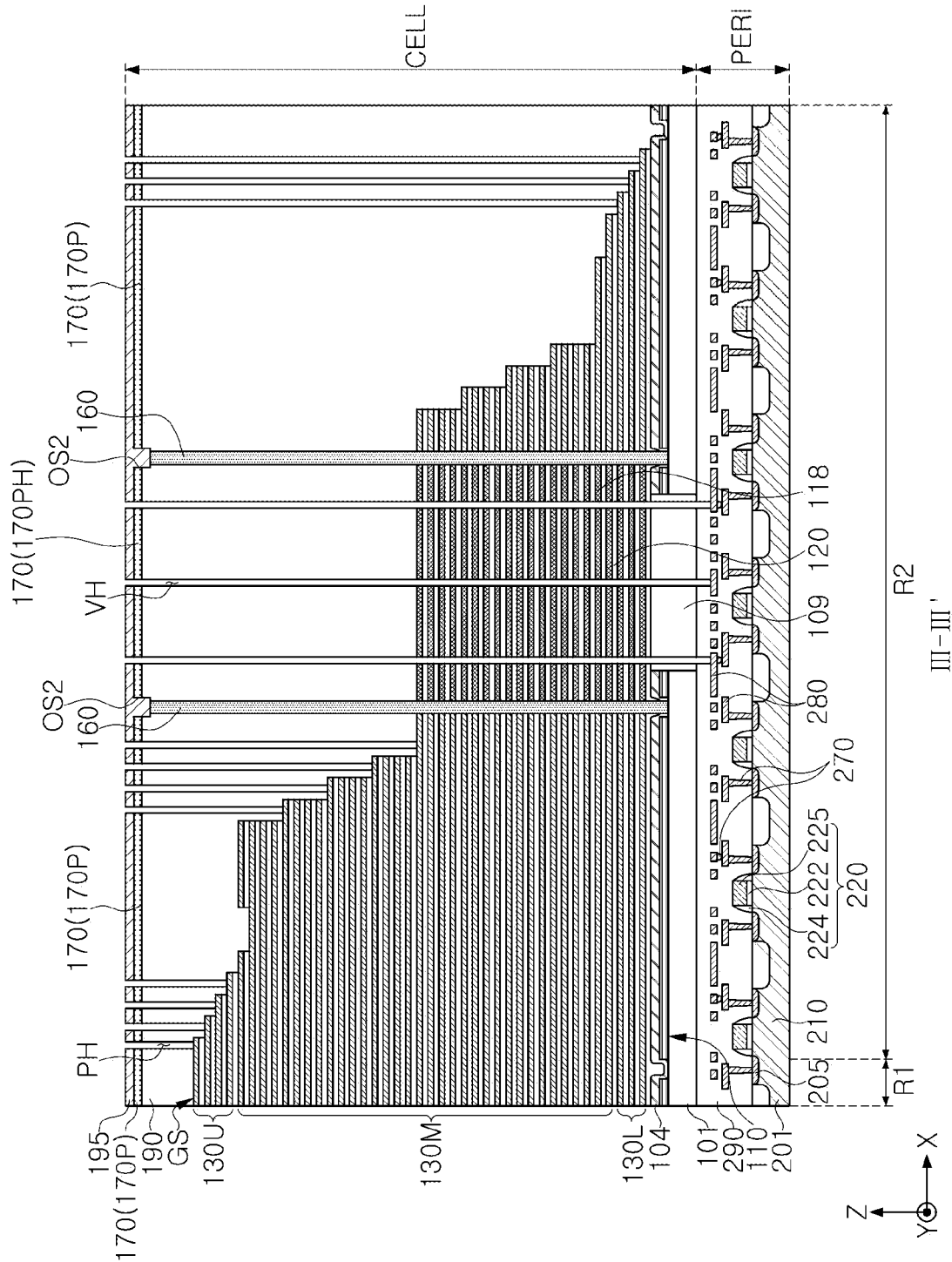

Referring to FIGS. 19A to 19C, via holes VH for forming the through contact plugs 180 (see FIG. 2A) may be formed in the through wiring region TR.

The via holes VH penetrating the capping insulating layer 190 and the insulating region IR may be formed. Circuit wiring lines 280 of the peripheral circuit structure PERI may be exposed on lower ends of the via holes VH. In this process, holes PH for forming the gate contact plugs 185 (see FIG. 3C) connected to the gate electrodes 130 may also be formed.

Referring to FIGS. 1A to 4, the through contact plugs 180 may be formed by filling a conductive material in the via holes VH to form the through wiring region TR, and a wiring lines 188 connected to the upper ends of the through contact plugs 180 may be formed, thereby manufacturing the semiconductor device 100.

Figure 20:
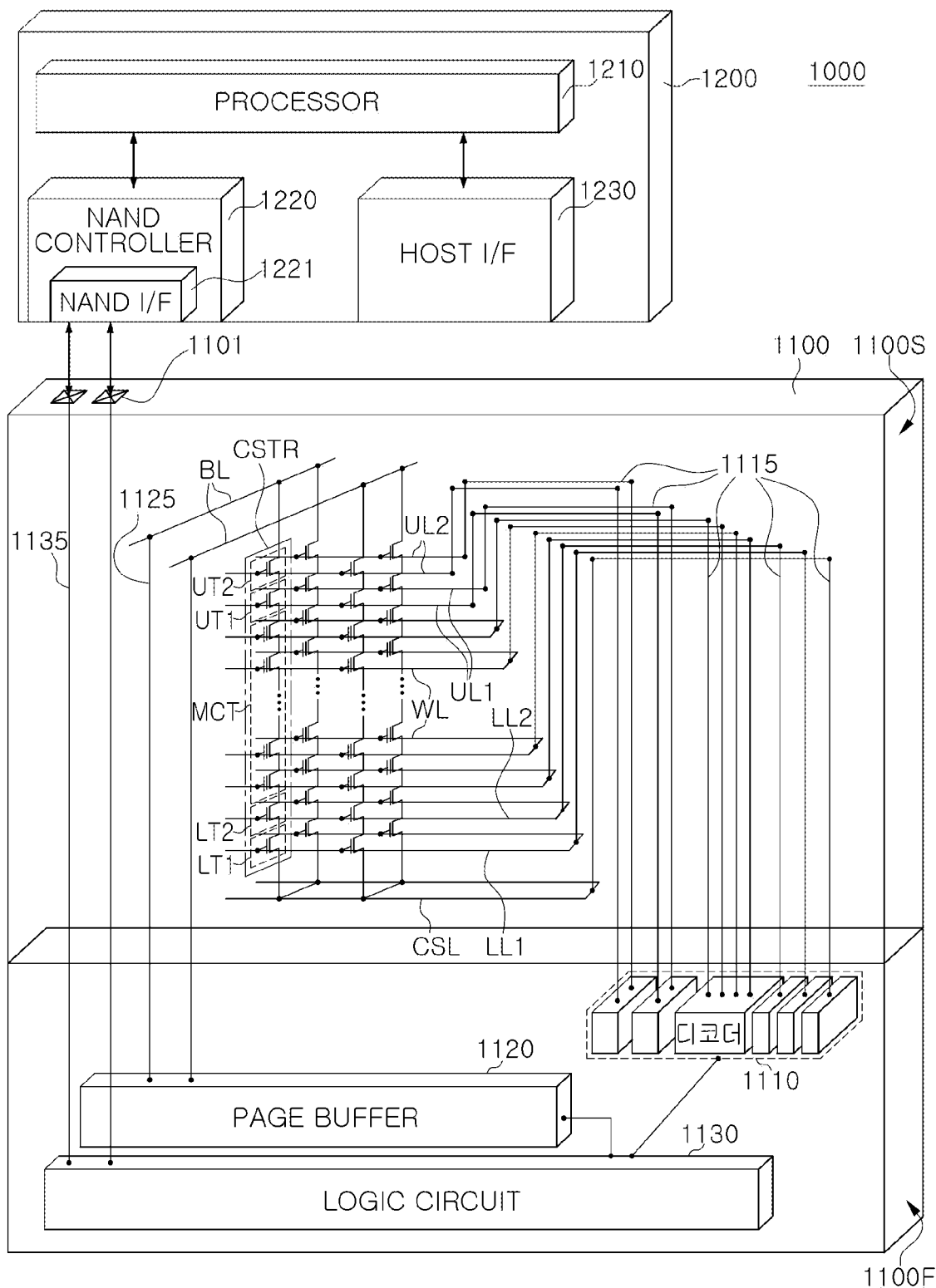
FIG. 20 is a view illustrating a data storage system including a semiconductor device according to some example embodiments of inventive concepts.

FIG. 20 is a view illustrating a data storage system including a semiconductor device according to some example embodiments.

Referring to FIG. 20, a data storage system 1000 may include a semiconductor device 1100 and a controller 1200 electrically connected to the semiconductor device 1100. The data storage system 1000 may be configured as a storage device including one or a plurality of semiconductor devices 1100 or an electronic device including a storage device. For example, the data storage system 1000 may be configured as a solid state drive device (SSD) device including one or a plurality of semiconductor devices 1100, a universal serial bus (USB), a computing system, a medical device, or a communication device.

The semiconductor device 1100 may be configured as a non-volatile memory device, such as a NAND flash memory device described above with reference to FIGS. 1 to 7, for example. The semiconductor device 1100 may include a first structure 110F and a second structure 1100S on the first structure 110F. In some example embodiments, the first structure 110F may be disposed adjacent to the second structure 1100S. The first structure 110F may be configured as a peripheral circuit structure including a decoder circuit 1110, a page buffer 1120, and a logic circuit 1130. The second structure 1100S may be configured as a memory cell structure including a bit line BL, a common source line CSL, word lines WL, first and second gate upper lines UL1 and UL2, first and second gate lower lines, and memory cell strings CSTR between the bit line BL and the common source line CSL.

In the second structure 1100S, each of the memory cell strings CSTR may include lower transistors LT1 and LT2 adjacent to the common source line CSL, upper transistors adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be varied in some example embodiments.

In some example embodiments, the upper transistors UT1 and UT2 may include a string select transistor, and the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

In some example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may be used for an erase operation of erasing data stored in the memory cell transistors MCT using the GIDL phenomenon.

The common source line CSL, the first and second gate lower lines LL1 and LL2, the word lines WL, and the first and second gate upper lines UL1 and UL2 may be electrically connected to the decoder circuit 1110 through first connecting wirings 1115 extending from the structure 110F to the second structure 1100S. The bit lines BL may be electrically connected to the page buffer 1120 through second connection lines 1125 extending from the first structure 110F to the second structure 1100S.

In the first structure 110F, the decoder circuit 1110 and the page buffer 1120 may perform a control operation for at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input and output pad 1101 electrically connected to the logic circuit 1130. The input and output pad 1101 may be electrically connected to the logic circuit 1130 through the input and output connection wiring 1135 extending from the first structure 110F to the second structure 1100S.

The controller 1200 may include a processor 1210, a NAND controller 1220, and a host interface 1230. According to some example embodiments, the data storage system 1000 may include a plurality of semiconductor devices 1100, and in this case, the controller 1200 may control the plurality of semiconductor devices 1000.

The processor 1210 may control overall operation of the data storage system 1000 including the controller 1200. The processor 1210 may operate according to a predetermined firmware, and may access the semiconductor device 1100 by controlling the NAND controller 1220. The NAND controller 1220 may include a NAND interface 1221 for processing communication with the semiconductor device 1100. A control command for controlling the semiconductor device 1100, data to be written in the memory cell transistors MCT of the semiconductor device 1100, and data to be read from the memory cell transistors MCT of the semiconductor device 1100 may be transmitted through the NAND interface 1221. The host interface 1230 may provide a communication function between the data storage system 1000 and an external host. When a control command is received from an external host through the host interface 1230, the processor 1210 may control the semiconductor device 1100 in response to the control command.

Figure 21:
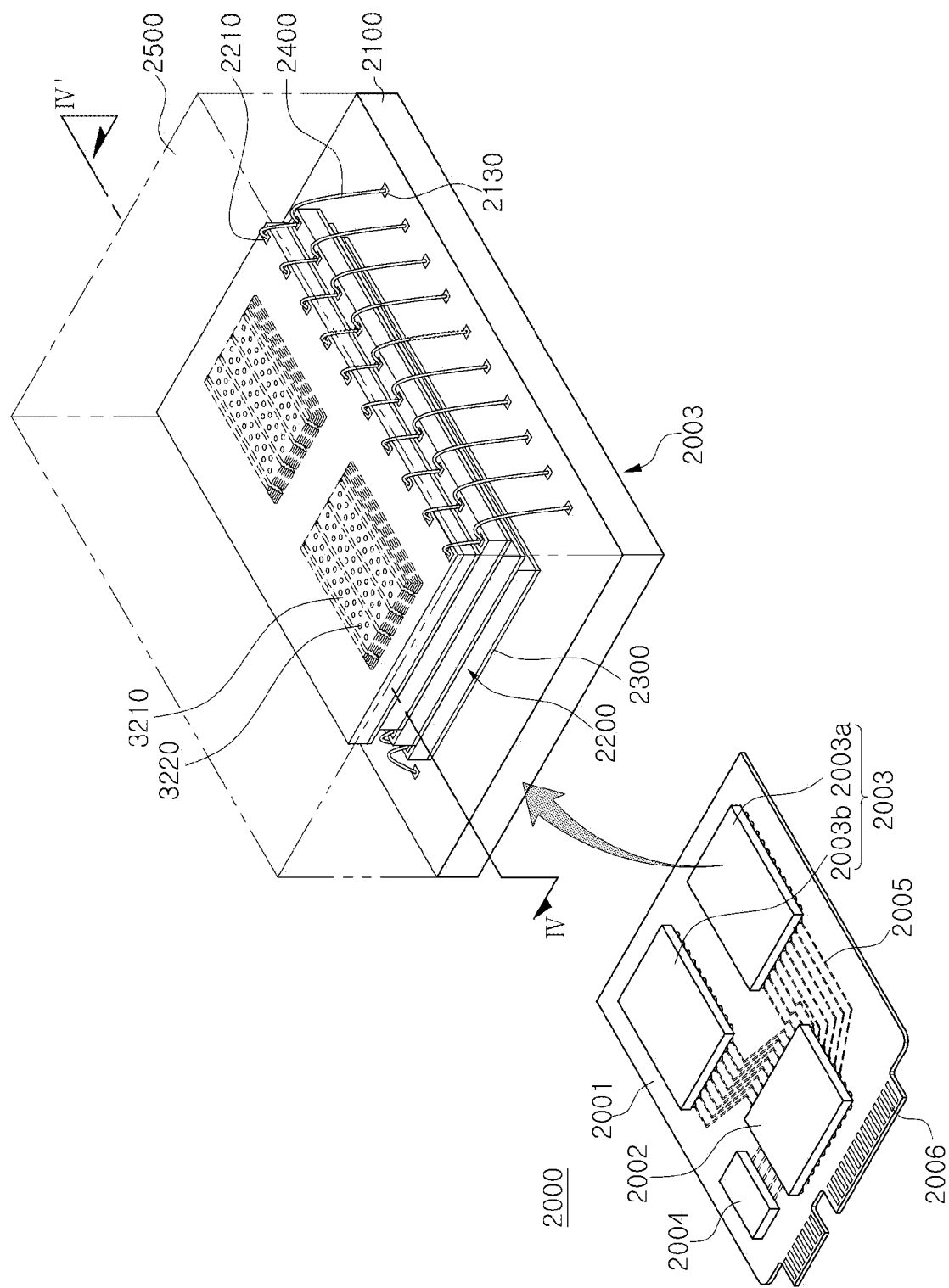
FIG. 21 is a perspective view illustrating a data storage system including a semiconductor device according to some example embodiments of inventive concepts.

FIG. 21 is a perspective view illustrating a data storage system including a semiconductor device according to some example embodiments.

Referring to FIG. 21, a data storage system 2000 according to some example embodiments may include a main substrate 2001, a controller 2002 mounted on the main substrate 2001, one or more semiconductor packages 2003, and a DRAM 2004. The semiconductor package 2003 and the DRAM 2004 may be connected to the controller 2002 by wiring patterns 2005 formed on the main substrate 2001.

The main board 2001 may include a connector 2006 including a plurality of pins coupled to an external host. The number and the arrangement of the plurality of pins in the connector 2006 may be varied according to a communication interface between the data storage system 2000 and an external host. In some example embodiments, the data storage system 2000 may communicate with an external host according to one of interfaces such as universal serial bus (USB), peripheral component interconnect express (PCI-Express), serial advanced technology attachment (SATA), M-Phy for universal flash storage (UFS), or the like. In some example embodiments, the data storage system 2000 may operate by power supplied from an external host through the connector 2006. The data storage system 2000 may further include a power management integrated circuit (PMIC) which may distribute power supplied from an external host to the controller 2002 and the semiconductor package 2003.

The controller 2002 may write data in the semiconductor package 2003 or may read data from the semiconductor package 2003, and may improve an operation speed of the data storage system 2000.

The DRAM 2004 may be configured as a buffer memory for mitigating a difference in speed among the semiconductor package 2003, a data storage space, and an external host. The DRAM 2004 included in the data storage system 2000 may also operate as a type of cache memory, and may provide a space for temporarily storing data in a control operation for the semiconductor package 2003. When the DRAM 2004 is included in the data storage system 2000, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including package upper pads 2130. Each semiconductor chip 2200 may include an input and output pad 2210. The input and output pad 2210 may correspond to the input and output pad 1101 in FIG. 20. Each of the semiconductor chips 2200 may include gate stack structures 3210 and channel structures 3220. Each of the semiconductor chips 2200 may include the semiconductor device described in the aforementioned example embodiment with reference to FIGS. 1 to 7.

In some example embodiments, the connection structure 2400 may be configured as a bonding wire electrically connecting the input and output pad 2210 to the package upper pads 2130. Accordingly, in each of the first and second semiconductor packages 2003a and 2003b, the semiconductor chips 2200 may be electrically connected to each other by a bonding wire method, and may be electrically connected to the package upper pads 2130 of the package substrate 2100. In some example embodiments, in each of the first and second semiconductor packages 2003a and 2003b, the semiconductor chips 2200 may be electrically connected to each other through a connection structure including a through silicon via TSV, instead of the bonding wire type connection structure 2400.

In some example embodiments, the controller 2002 and the semiconductor chips 2200 may be included in a single package. In some example embodiments, the controller 2002 and the semiconductor chips 2200 may be mounted on an interposer substrate different from the main substrate 2001, and the controller 2002 and the semiconductor chips may be connected to each other by wiring formed on the interposer substrate.

Figure 22:
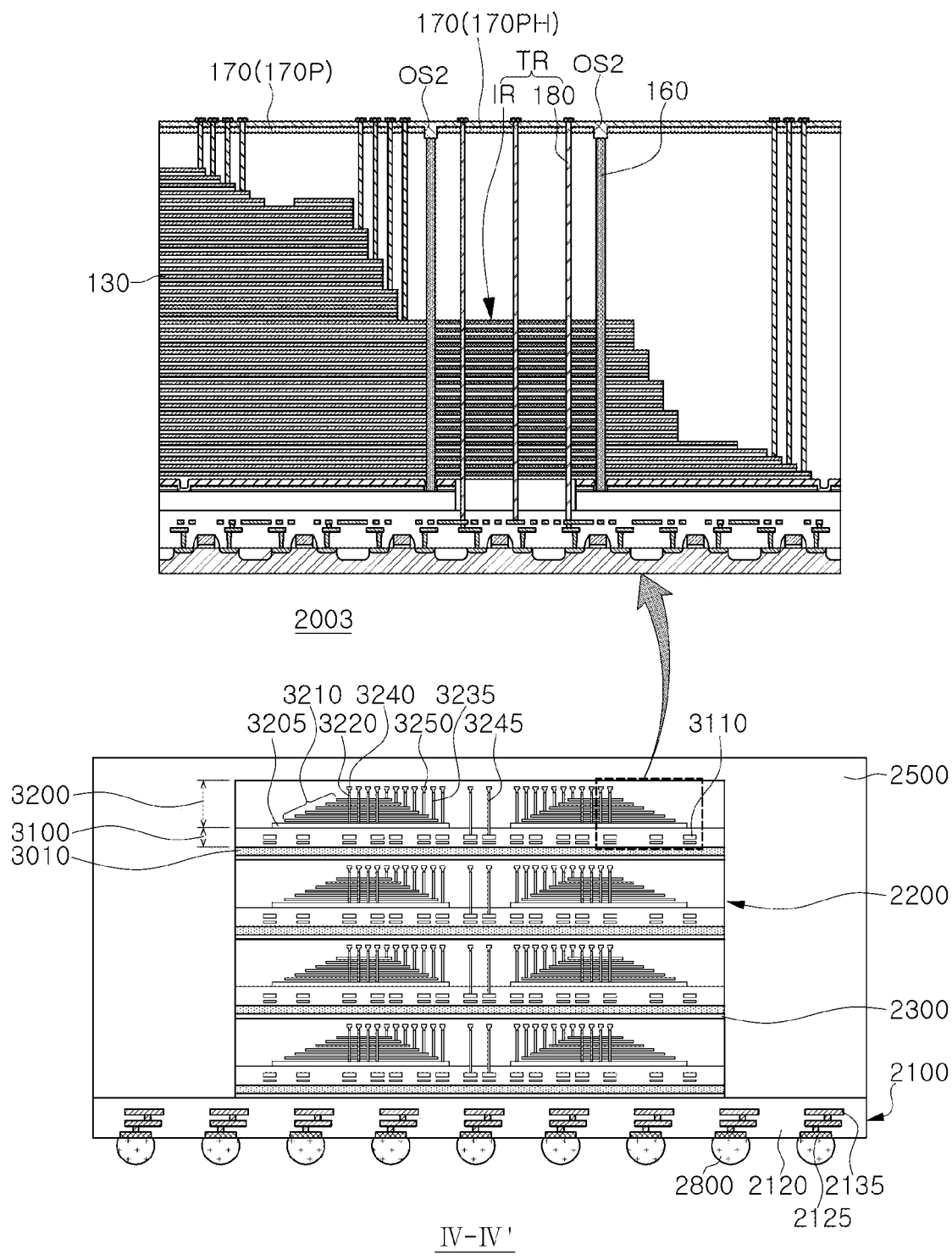
FIG. 22 is a cross-sectional view illustrating a semiconductor package according to some example embodiments of inventive concepts.

FIG. 22 is a cross-sectional view illustrating a semiconductor package according to some example embodiments. FIG. 22 illustrating some example embodiments of the semiconductor package 2003 in FIG. 21 taken along line IV-IV'.

Referring to FIG. 22, in a semiconductor package 2003, a package substrate 2100 may be configured as a printed circuit board. The package substrate 2100 may include a package substrate body portion 2120, package upper pads 2130 (see FIG. 21) disposed on the upper surface of the package substrate body portion 2120, lower pads 2125 disposed on or exposed through a lower surface of the package substrate body portion 2120, and internal wirings 2135 electrically connecting the upper pads 2130 to the lower pads 2125 in the package substrate body portion 2120. The upper pads 2130 may be electrically connected to the connection structures 2400. The lower pads 2125 may be connected to the wiring patterns 2005 of the main substrate 2010 of the data storage system 2000 as illustrated in FIG. 12 through the conductive connection portions 2800.

Each of the semiconductor chips 2200 may include a semiconductor substrate 3010 and a first structure 3100 and a second structure 3200 stacked in order on the semiconductor substrate 3010. The first structure 3100 may include a peripheral circuit region including peripheral wirings 3110. The second structure 3200 may include a common source line 3205, a gate stack structure 3210 on the common source line 3205, channel structures 3220 and isolation regions 3230 penetrating the gate stack structure 3210, bit lines 3240 electrically connected to the memory channel structures 3220, and gate contact plugs 3235 electrically connected to word lines WL (see FIG. 20) of the gate stack structure 3210. As described above with reference to FIGS. 1A to 4, the barrier structure 160 surrounding the through wiring region TR in each of the semiconductor chips 2200 may include a core insulating layer 165 disposed in a central region including silicon oxide, a first barrier layer 161 including silicon oxide, and a second barrier layer 162 including silicon nitride. Also, as described above with reference to FIGS. 1A to 4, a support structure 170 including first and second through regions OS1a, OS1b, and OS2 in each of the semiconductor chips 2200 may be further included, and the metal oxide layer 175 may be disposed on internal side surfaces of the first and second through regions OS1a, OS1b, and OS2.

Each of the semiconductor chips 2200 may include a through wiring 3245 electrically connected to the peripheral wirings 3110 of the first structure 3100 and extending into the second structure 3200. The through wiring 3245 may be disposed on an external side of the gate stack structure 3210, and may penetrate the gate stack structure 3210. Each of the semiconductor chips 2200 may further include an input and output pad 2210 (see FIG. 21) electrically connected to the peripheral wirings 3110 of the first structure 3100.

According to the aforementioned some example embodiments, by including a barrier structure including a core insulating layer including silicon oxide in a central region, a semiconductor device having improved reliability and a data storage system including the same may be provided.

Also, by including a support structure including a through region in contact with an upper surface of the barrier structure, a semiconductor device having improved reliability and a data storage system including the same may be provided.

Any of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the some example embodiments have been illustrated and described above, it will be apparent to those of ordinary skill in the art that modifications and variations could be made without departing from the scope of inventive concepts as defined by the appended claims.

What is claimed is:

1. A semiconductor device, comprising:
a peripheral circuit structure including a first substrate and at least one of active devices or passive devices on the first substrate;
a memory cell structure including a second substrate on the peripheral circuit structure and having a first region and a second region, the memory cell structure including gate electrodes stacked on the first region spaced apart from each other in a first direction, and extending in a second direction and arranged in a staircase shape on the second region, the memory cell structure including interlayer insulating layers alternately stacked with the gate electrodes, the memory cell structure including channel structures penetrating the gate electrodes that extend in the first direction, each of the channel structures including a channel layer, and the memory cell structure including isolation regions penetrating the gate electrodes, extending in the second direction, and spaced apart from each other in a third direction;
a through wiring region including sacrificial insulating layers on the second region, spaced apart from the gate electrodes, and alternately stacked with the interlayer insulating layers, the through wiring region including a through contact plug penetrating the sacrificial insulating layers and electrically connecting the gate electrodes to the active or passive devices; and
a barrier structure surrounding the through wiring region and including a core insulating layer, a first barrier layer, and a second barrier layer,
wherein the core insulating layer is in a central region of the barrier structure and includes silicon oxide,
the second barrier layer covers side surfaces of the core insulating layer and a bottom surface of the core insulating layer, and
the first barrier layer covers external side surfaces of the second barrier layer and a bottom surface of the second barrier layer.

2. The semiconductor device of claim 1,
wherein the first barrier layer includes silicon oxide, and the second barrier layer includes silicon nitride.

3. The semiconductor device of claim 1,
wherein the core insulating layer is in direct contact with internal side surfaces of the second barrier layer, and the core insulating layer has a horizontal thickness greater than a horizontal thickness of the first barrier layer.

4. The semiconductor device of claim 1, wherein the memory cell structure further includes dummy channel structures penetrating the gate electrodes on the second region, extending in the first direction, and each including a conductive dummy channel layer.

5. The semiconductor device of claim 1,
wherein the memory cell structure further includes a support structure on the gate electrodes, and
the support structure has first through regions on the isolation regions and second through region on the barrier structure.

6. The semiconductor device of claim 5, wherein the second through region overlaps the barrier structure in the first direction.

7. The semiconductor device of claim 5, wherein the memory cell structure further includes a metal oxide layer extending along side surfaces of the second through region and covering an upper surface of the barrier structure.

8. The semiconductor device of claim 7,
wherein the memory cell structure further includes a blocking layer extending along side surfaces of the isolation regions and covering at least one surface of conductive layers forming the gate electrodes, and
the metal oxide layer includes a material the same as a material of the blocking layer.

9. The semiconductor device of claim 7,
wherein the memory cell structure further includes a through insulating layer in the through region, and
the through insulating layer includes a first insulating layer on the metal oxide layer and a second insulating layer having a lower surface and side surfaces, the lower surface and side surfaces of the second insulating layer surrounded by the first insulating layer.

10. A semiconductor device, comprising:
a first substrate;
at least one of active devices or passive devices on the first substrate;
a second substrate on the at least one of active devices or passive devices;
gate electrodes stacked on the second substrate in a first direction and spaced apart from each other;
channel structures penetrating the gate electrodes, extending in the first direction, and each including a channel layer;
isolation regions penetrating the gate electrodes and extending in a second direction;
a through contact plug penetrating the second substrate, extending in the first direction, and electrically connecting the gate electrodes to the at least one of active or passive devices;
a barrier structure spaced apart from the through contact plug and surrounding the through contact plug; and
a support structure on the gate electrodes and including support patterns,
wherein the support structure has first through regions spaced apart from each other in the second direction on the isolation regions and a second through region contacting an upper surface of the barrier structure.

11. The semiconductor device of claim 10, further comprising:
a metal oxide layer covering side surfaces of the support patterns exposed to the second through region and covering an upper surface of the barrier structure;
a through insulating layer in the second through region; and
an upper insulating layer on the through insulating layer.

12. The semiconductor device of claim 10, further comprising:
a metal oxide layer extending in the first direction along side surfaces of the support patterns exposed to each of the first through regions and along side surfaces of the isolation regions, the metal oxide layer covering at least one surface of conductive layers of the gate electrodes.

13. The semiconductor device of claim 10,
wherein the barrier structure includes a core insulating layer, a first barrier layer, and a second barrier layer, the core insulating layer is in a central region of the barrier structure, the second barrier layer is on side surfaces of the core insulating layer, and the first barrier layer is on external side surfaces of the second barrier layer.

14. The semiconductor device of claim 13,
wherein each of the core insulating layer and the first barrier layer includes silicon oxide, and
the second barrier layer includes silicon nitride.

15. The semiconductor device of claim 13, wherein the second barrier layer includes a protrusion protruding toward the core insulating layer.

16. The semiconductor device of claim 10, wherein the barrier structure has at least one of a quadrangular ring shape in a plan view or a shape similar to a quadrangular ring in a plan view.

17. The semiconductor device of claim 10, further comprising:
an insulating region surrounding the through contact plug,
wherein the insulating region includes (A) a substrate insulating layer penetrating the second substrate, (B) sacrificial insulating layers stacked on an internal side of the barrier structure in the first direction and spaced apart from each other, and (C) an interlayer insulating layer disposed between the sacrificial insulating layers.

18. The semiconductor device of claim 17, wherein the gate electrodes facing an external side surface of the barrier structure and the sacrificial insulating layers in contact with the internal side surface of the barrier structure are on different levels.

19. A data storage system, comprising:
a semiconductor storage device including a first substrate, at least one of active devices or passive devices on the first substrate, a second substrate on the at least one of active or passive devices, gate electrodes stacked on the second substrate and spaced apart from each other in a first direction, channel structures penetrating the gate electrodes with the channel structures extending in the first direction and each of the channel structures including a channel layer, isolation regions penetrating the gate electrodes and extending in a second direction, a through contact plug penetrating the second substrate and extending in the first direction while electrically connecting the gate electrodes to the active or passive devices, a barrier structure spaced apart from the through contact plug and surrounding the through contact plug, a support structure on the gate electrodes and including support patterns, and an input and output pad electrically connected to the at least one of active or passive devices, where the support structure includes first through regions spaced apart from each other in the second direction on the isolation regions and a second through region in contact with an upper surface of the barrier structure; and a controller circuitry electrically connected to the semiconductor storage device through the input and output pad and configured to control the semiconductor storage device.

20. The data storage system of claim 19,
wherein, in the semiconductor storage device, the barrier structure includes a core insulating layer, a first barrier layer, and a second barrier layer, the core insulating layer is on a central region of the barrier structure and includes silicon oxide, the second barrier layer covers side surfaces of the core insulating layer and a bottom surface of the core insulating layer and includes silicon nitride, and the first barrier layer covers external side surfaces of the second barrier layer and a bottom surface of the second barrier layer and includes silicon oxide, and the semiconductor storage device further includes a metal oxide layer extending in the first direction along side surfaces of the support pattern exposed to the second through region, and covering an upper surface of the barrier structure.

\* \* \* \* \*